US010460817B2

(12) United States Patent
Li et al.

(10) Patent No.: US 10,460,817 B2
(45) Date of Patent: Oct. 29, 2019

(54) MULTIPLE (MULTI-) LEVEL CELL (MLC) NON-VOLATILE (NV) MEMORY (NVM) MATRIX CIRCUITS FOR PERFORMING MATRIX COMPUTATIONS WITH MULTI-BIT INPUT VECTORS

(71) Applicant: QUALCOMM Incorporated, San Diego, CA (US)

(72) Inventors: Xia Li, San Diego, CA (US); Seung Hyuk Kang, San Diego, CA (US); Wei-Chuan Chen, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/817,474

(22) Filed: Nov. 20, 2017

(65) Prior Publication Data
US 2019/0019564 A1  Jan. 17, 2019

Related U.S. Application Data

(60) Provisional application No. 62/531,924, filed on Jul. 13, 2017.

(51) Int. Cl.
*G11C 7/00* (2006.01)
*G11C 16/34* (2006.01)
(Continued)

(52) U.S. Cl.
CPC ......... *G11C 16/3481* (2013.01); *G06N 3/049* (2013.01); *G06N 3/063* (2013.01);
(Continued)

(58) Field of Classification Search
CPC .................. G11C 13/0004; G11C 13/0011
See application file for complete search history.

(56) References Cited

U.S. PATENT DOCUMENTS 5,519,812 A   5/1996  Ishihara
6,005,806 A   12/1999 Madurawe et al.
(Continued)

FOREIGN PATENT DOCUMENTS

JP   2001024163 A   1/2001

OTHER PUBLICATIONS

Abbott, L. F. et al., "Synaptic plasticity: taming the beast," Nature Neuroscience, vol. 3, Nov. 2000, Nature America, Inc., pp. 1178-1183.

(Continued)

*Primary Examiner* — Uyen B Tran
(74) *Attorney, Agent, or Firm* — W&T/Qualcomm

(57) ABSTRACT

Multiple (multi-) level cell (MLC) non-volatile (NV) memory (NVM) matrix circuits for performing matrix computations with multi-bit input vectors are disclosed. An MLC NVM matrix circuit includes a plurality of NVM storage string circuits that each include a plurality of MLC NVM storage circuits each containing a plurality of NVM bit cell circuits each configured to store 1-bit memory state. Thus, each MLC NVM storage circuit stores a multi-bit memory state according to memory states of its respective NVM bit cell circuits. Each NVM bit cell circuit includes a transistor whose gate node is coupled to a word line among a plurality of word lines configured to receive an input vector. Activation of the gate node of a given NVM bit cell circuit in an MLC NVM storage circuit controls whether its resistance is contributed to total resistance of an MLC NVM storage circuit coupled to a respective source line.

30 Claims, 34 Drawing Sheets

(51) Int. Cl.

| | |
|---|---|
| *G11C 11/56* | (2006.01) |
| *G11C 14/00* | (2006.01) |
| *G11C 16/04* | (2006.01) |
| *H01L 27/108* | (2006.01) |
| *H01L 29/792* | (2006.01) |
| *H01L 45/00* | (2006.01) |
| *G06N 3/063* | (2006.01) |
| *G11C 5/02* | (2006.01) |
| *G11C 5/06* | (2006.01) |
| *G11C 7/10* | (2006.01) |
| *G11C 11/54* | (2006.01) |
| *G06N 3/04* | (2006.01) |
| *G06N 3/08* | (2006.01) |
| *G11C 7/18* | (2006.01) |
| *G11C 8/14* | (2006.01) |
| *H03K 19/177* | (2006.01) |

(52) U.S. Cl.
CPC ............. *G06N 3/084* (2013.01); *G11C 5/02* (2013.01); *G11C 5/063* (2013.01); *G11C 7/1006* (2013.01); *G11C 11/54* (2013.01); *G11C 11/5628* (2013.01); *G11C 14/0063* (2013.01); *G11C 16/0483* (2013.01); *G11C 16/3459* (2013.01); *H01L 27/10826* (2013.01); *H01L 29/7923* (2013.01); *H01L 45/085* (2013.01); *H01L 45/122* (2013.01); *G11C 7/18* (2013.01); *G11C 8/14* (2013.01); *H03K 19/17736* (2013.01)

(56) References Cited

U.S. PATENT DOCUMENTS

| | | | |
|---|---|---|---|
| 8,213,216 | B2 | 7/2012 | Wang et al. |
| 8,854,855 | B2 | 10/2014 | Jung et al. |
| 9,135,976 | B2 | 9/2015 | Wu et al. |
| 9,378,796 | B2 | 6/2016 | Alam et al. |
| 9,478,291 | B2 | 10/2016 | Jeong et al. |
| 9,691,479 | B1 | 6/2017 | Merced Grafals et al. |
| 9,704,596 | B1 | 7/2017 | Shim |
| 10,242,737 | B1 | 3/2019 | Lin et al. |
| 2005/0122768 | A1* | 6/2005 | Fukumoto ............... B82Y 10/00 365/158 |
| 2006/0034128 | A1 | 2/2006 | Han et al. |
| 2006/0256618 | A1 | 11/2006 | Nazarian |
| 2008/0043527 | A1 | 2/2008 | Aritome |
| 2009/0016113 | A1 | 1/2009 | Chen et al. |
| 2011/0205802 | A1 | 8/2011 | Choe et al. |
| 2012/0243307 | A1 | 9/2012 | Takashima |
| 2013/0163305 | A1 | 6/2013 | Tanzawa |
| 2014/0140139 | A1 | 5/2014 | Wang |
| 2015/0324691 | A1 | 11/2015 | Dropps et al. |
| 2016/0020250 | A1 | 1/2016 | Li et al. |
| 2016/0148091 | A1 | 5/2016 | Nugent et al. |
| 2016/0336064 | A1 | 11/2016 | Seo et al. |
| 2016/0350643 | A1 | 12/2016 | Hosokawa et al. |
| 2016/0358661 | A1 | 12/2016 | Vali et al. |
| 2016/0371583 | A1 | 12/2016 | Hosokawa et al. |
| 2016/0379697 | A1* | 12/2016 | Sakai ................. G11C 11/1655 365/66 |
| 2017/0117291 | A1 | 4/2017 | Or-Bach et al. |
| 2019/0019538 | A1 | 1/2019 | Li et al. |

OTHER PUBLICATIONS

Cauwenberghs, Gert, "Reverse Engineering the Cognitive Brain in Silicon," Department of Bioengineering Institute for Neural Computation, UC San Diego, 2013, 40 pages.

Gao, Ligang et al., "Demonstration of Convolution Kernel Operation on Resistive Cross-Point Array," IEEE Electron Device Letters, vol. 37, No. 7, Jul. 2016, IEEE, pp. 870-873.

Hiodkin, A. L. et al., "A Quantitative Description of Membrane Current and Its Application to Conduction and Excitation in Nerve," Journal of Physiology, vol. 117, No. 4, 1952, pp. 500-544.

Horowitz, Mark, "Computing's Energy Problem: (and what we can do about it)," International Solid-State Circuits Conference, 2014, IEEE, 46 pages.

Krizhevsky, Alex et al., "ImageNet Classification with Deep Convolutional Neural Networks," Advances in neural information processing systems, 2012, 9 pages.

Lecun, Yann, "Deep Learning Tutorial," International Conference on Machine Learning, Jun. 16, 2013, Atlanta, Georgia, 204 pages.

Saïghi, Sylvain et al., "Plasticity in memristive devices for spiking neural networks," Frontiers in Neuroscience, vol. 9, No. 51, Mar. 2015, 16 pages.

Soudry, Daniel et al., "Memristor-Based Multilayer Neural Networks With Online Gradient Descent Training," IEEE Transactions on Neural Networks and Learning Systems, vol. 26, No. 10, Oct. 2015, 14 pages.

Sze, Vivienne et al., "Efficient Processing of Deep Neural Networks: A Tutorial and Survey," arXiv, Aug. 13, 2017, 32 pages.

Tanachutiwat, Sansiri et al., "FPGA Based on Integration of CMOS and RRAM," IEEE Transactions on Very Large Scale Integration (VLSI) Systems, vol. 19, No. 11, Nov. 2011, pp. 2023-2032.

Velasquez, Alvaro et al., "Memristor-Based Crossbar Computing," C4 Information Directive, 2014 Poster Session, University of Central Florida, 1 page.

Xu, Cong et al., "Design Implications of Memristor-Based RRAM Cross-Point Structures," Design, Automation & Test in Europe Conference & Exhibition, Mar. 14, 2011, IEEE, 6 pages.

Yu, Shimeng, "Neuro-Inspired Computing with Emerging Non-Volatile Memory (NVM)," PowerPoint Presentation, Arizona State University School of Electrical, Computer, and Energy Engineering (ECEE), Nov. 15, 2017, 33 slides.

Siemon, Anne et al., "A Complementary Resistive Switch-Based Crossbar Array Adder," IEEE Journal on Emerging and Selected Topics in Circuits and Systems, vol. 5, No. 1, Mar. 2015, pp. 64-74.

International Search Report and Written Opinion for PCT/US2018/039002, dated Oct. 12, 2018, 17 pages.

* cited by examiner

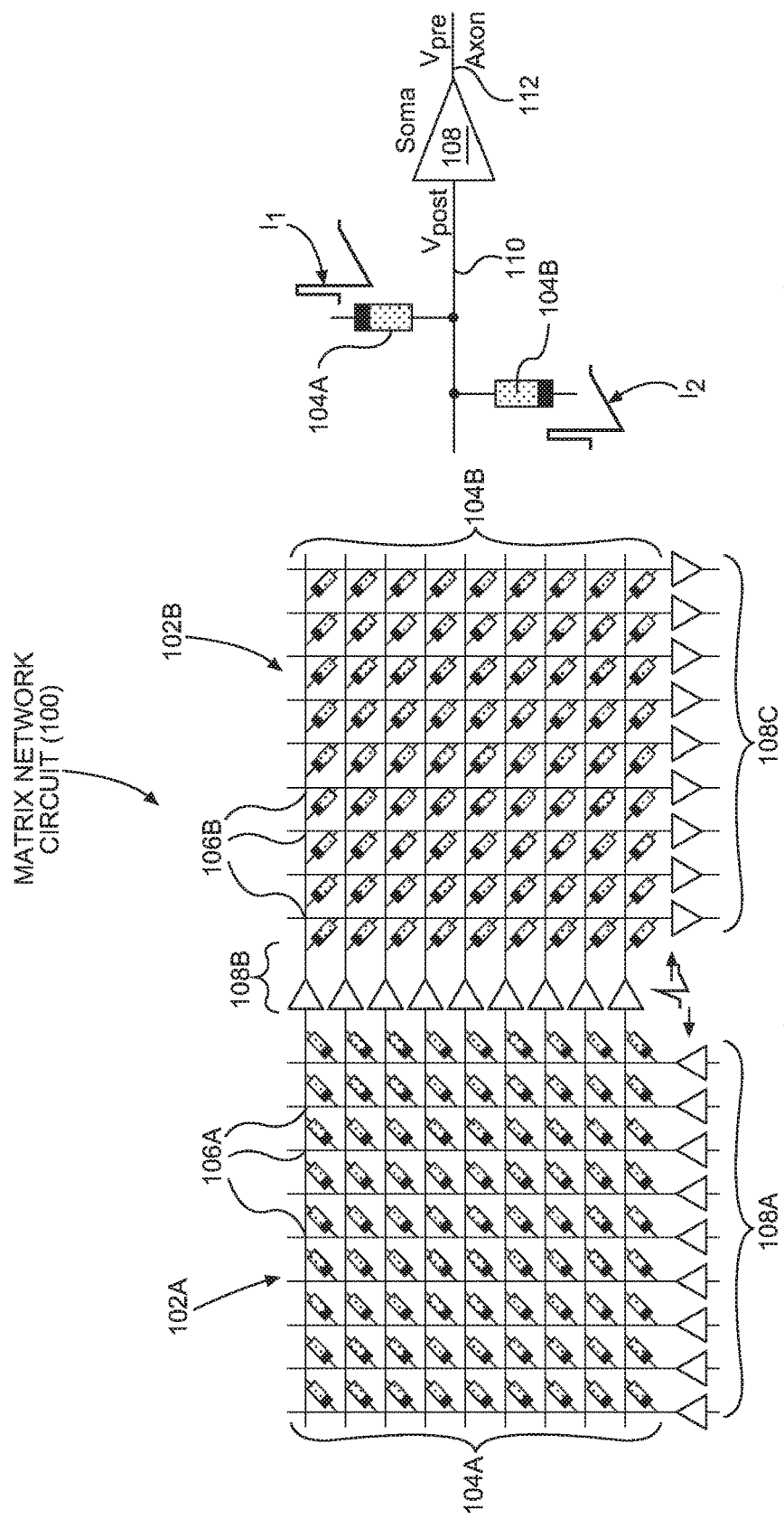

MULTIPLE (MULTI-) LEVEL CELL (MLC) NON-VOLATILE (NV) MEMORY (NVM) MATRIX CIRCUITS FOR PERFORMING MATRIX COMPUTATIONS WITH MULTI-BIT INPUT VECTORS

PRIORITY APPLICATION

The present application claims priority under 35 U.S.C. § 119(e) to U.S. Provisional Patent Application Ser. No. 62/531,924 entitled "MULTI-LEVEL CELL (MLC) MATRIX MEMORY CIRCUITS EMPLOYING NON-VOLATILE (NV) MLC MEMORY CIRCUITS FOR PERFORMING MATRIX COMPUTATIONS" and filed on Jul. 13, 2017, which is incorporated herein by reference in its entirety.

RELATED APPLICATIONS

The present application is related to U.S. Provisional Patent Application Ser. No. 62/531,921 entitled "MATRIX MEMORY CIRCUITS EMPLOYING NON-VOLATILE (NV) MEMORY CIRCUITS FOR PERFORMING MATRIX COMPUTATIONS" and filed on Jul. 13, 2017, which is incorporated herein by reference in its entirety.

The present application is also related to U.S. patent application Ser. No. 15/817,441 entitled "NON-VOLATILE (NV) MEMORY (NVM) MATRIX CIRCUITS EMPLOYING NVM MATRIX CIRCUITS FOR PERFORMING MATRIX COMPUTATIONS" and filed on Nov. 20, 2017, which is incorporated herein by reference in its entirety.

BACKGROUND

I. Field of the Disclosure

The technology of the disclosure relates generally to computerization of biological networks, and more particularly to circuit network implementations of synapse networks to provide matrix multiplication with artificial intelligence (AI) learning.

II. Background

Biological networks are networks that apply to biological systems. For example, the biological circulatory system in a human involves the function of pumping and channeling of blood through blood vessels to the body, the lungs, and the heart. Network representation of intracellular biological networks typically considers molecular components within a cell as nodes and their direct or indirect interactions as links. The recognition of biological networks has motivated the development of various neuromorphic computing systems whose architectures reflect the general organizational principles of nervous systems in an effort to partially reproduce the immense efficiency advantage that biological computation exhibits in some problems. These neuromorphic systems are organized as populations of excitatory and inhibitory spiking neurons (i.e., nerve cells that are specialized cells transmitting nerve impulses) with configurable synaptic connections. Synaptic plasticity plays a crucial role in allowing neural networks to learn and adapt to various input environments. Thus, neuromorphic systems implemented in computer networks need to implement plastic synapses in circuits to obtain basic "cognitive" capabilities such as learning.

Synapses outnumber neurons by several orders of magnitude in biological neural networks. Reproducing these biological features in neuromorphic electronic circuits presents a scaling problem, as integrating thousands of dedicated synapse circuits per neuron can quickly become infeasible for circuit systems that require a large number of neurons. This scaling problem in computer networks has traditionally been solved by either treating synapses as simple linear elements and time-multiplexing spikes from many pre-synaptic sources onto the same linear circuit, or by treating them as basic binary elements that can be set either on or off externally, without learning abilities. Real synapses, however, exhibit non-linear phenomena like spike timing dependent plasticity (STDP) that modulate the weight of an individual synapse based on the activity of the pre- and post-synaptic neurons. The modulation of synaptic weights through plasticity has been shown to greatly increase the range of computations that neural networks can perform.

Capturing the plasticity properties of real synapses in analog neuromorphic hardware requires the use of distinct physical circuits/elements for each synapse. In conventional complementary metal oxide semiconductor (CMOS) circuit technology, this can lead to restrictions on scalability. Some potential solutions to the scalability issues in pure CMOS technology involve the use of very large integrated structures or the adoption of deep submicron technologies. For example, microchip CMOS circuit implementations of STDP rules may result in about thirty (30) transistors per plastic synapse, and thus may lead to high costs for their hardware realization. There is, overall, general thinking that STDP is very expensive to implement in conventional CMOS microchips. Scalability restrictions however can be greatly relaxed if one resorts to compact nano-scale circuit elements that can reproduce the plasticity properties of real synapses. One potential candidate for these elements is a memristor. A memristor is an element which behaves somewhat like a non-linear resistor with memory. In the neuromorphic community, memristors are seen as ideal devices for synapse implementations, as they combine three (3) key functions in one device. Memristors are non-linear, passive, two-terminal electrical devices that relate to electrical charge and magnetic flux linkage. A memristor's electrical resistance is not constant, but depends on the history of current that had previously flowed through the device. That is, its present resistance depends on how much electric charge has flowed in what direction through it in the past. Thus, a memristor device remembers its history, which is called its non-volatility property. When the electric power supply is turned off to the memristor, the memristor remembers its most recent resistance until it is turned on again. Memristors can implement biologically realistic synaptic weight updates (i.e., learning), can carry out long-term multi-valued weight storage, and can also communicate weighted pre-synaptic activity to the postsynaptic side, significantly relaxing scalability restrictions.

STDP can be implemented with just one (1) memristor per synapse if appropriate peripheral signal conditioning neurons are used in hybrid CMOS/memristor realizations. Typically, plasticity in these memristor synapses is evoked by applying specific waveforms to the two (2) terminals of the memristor, with the waveforms aligned to pre-respectively postsynaptic pulses. The correlation of the waveforms across the memristor in turn implements STDP-like plasticity with the form of the STDP curve defined by the applied wave shape. Both hardware and software models of plasticity based on the basic STDP mechanism are typically chosen, primarily for their simplicity.

In this regard, FIG. 1A illustrates a matrix network circuit 100 as a cross-bar network that includes a way of interconnecting memristors and CMOS circuit neurons for STDP learning. The matrix network circuit 100 includes a first resistive random access memory (RRAM) cross-bar network 102A and a second RRAM cross-bar network 102B. Each of the first and second RRAM cross-bar networks 102A, 102B include respective memristors 104A, 104B at respective synaptic junctions 106A, 106B each representing individual synapses. CMOS buffer gates 108A, 108B, 108C represent three (3) layers of neurons, referred to as CMOS circuit neurons 108A, 108B, 108C. FIG. 1B illustrates a synaptic connection for a post-synaptic CMOS circuit neuron 108 formed by controlling the first and second RRAM cross-bar networks 102A, 102B. The flat side of the CMOS circuit neuron 108 is its input node 110 (i.e., dendrites) and the sharp side of the CMOS circuit neuron 108 is its output node 112 (i.e., axon). The CMOS circuit neuron 108 controls a voltage $V_{post}$ at its input node 110 and a voltage $V_{pre}$ at its output node 112. When the CMOS circuit neuron 108 is not spiking, it forces a constant voltage at both input and output nodes 110, 112, while collecting through its input node 110 the sum of input synaptic spike currents $I_1$, $I_2$ coming from the memristors 104A, 104B, which contribute to changing the neuron internal state. When the CMOS circuit neuron 108 spikes, it sets a one-spike waveform at both input and output nodes 110, 112. In this manner, the CMOS circuit neuron 108 sends its output spikes forward as pre-synaptic spikes for the destination synaptic memristors, but also backward to preceding synaptic memristors as post-synaptic spikes.

Neural networks that employ memristor networks for providing synapses can also be used for other applications that require weighted matrix multiplication computations, such as convolution for example. For example, FIG. 2A illustrates a memristor cross-bar synapse matrix 200 with a pre-neuron layer 202 of pre-neuron circuits 204(1)-204(m) and a post-neuron layer 206 of post-neuron circuits 208(1)-208(n). Synapses can be provided between the pre-neuron circuits 204(1)-204(m) and the post-neuron circuits 208(1)-208(m). It may be desired to sum up the multiplication of the state of each pre-neuron circuit 204(1)-204(m) with the state of each post-neuron circuit 208(1)-208(n) to provide an accelerated weighted sum and weight update. For example, FIG. 2B illustrates a memristor cross-bar matrix circuit 212 of the memristor cross-bar synapse matrix 200 in FIG. 2A. The memristor cross-bar matrix circuit 212 includes an RRAM cross-bar array circuit 214 with rows $R_1$-$R_m$ and columns $C_1$-$C_n$ of memristors 216(1)(1)-216(m)(n) that can form respective synapses 210(1)(1)-210(m)(n). The memristors 216(1)(1)-216(m)(n) are configured to store a memory state of an m×n matrix. Input voltages $V_1$-$V_m$ may be for a 1×m input vector. It may be desired to multiply an input vector by the m×n matrix provided by the memristors 216(1)(1)-216(m)(n). The memristors 216(1)(1)-216(m)(n) in each column $C_1$-$C_n$ of are coupled to each other in parallel. Thus, the conductance of the RRAM cross-bar array circuit 214 represents the weight of the memristor cross-bar matrix circuit 212. The individual sums of the currents $I_1$-$I_n$ represent the weight (i.e., the conductance) of the selected column $C_1$-$C_n$ of memristors 216( )(1)-216( )(n) multiplied by the state of the pre-neuron circuits 204(1)-204(m) represented by the input voltages $V_1$-$V_m$. For example, current $I_1$ is the sum of each input voltage $V_1$-$V_m$ from a pre-neuron circuit 204(1)-204(m) in a selected row $R_1$-$R_m$ multiplied by the conductance of a respective memristor 216(1)(1)-216(m)(1) when column $C_1$ is selected, according to the formula:

$$I_j = \sum_i G_{ij} \cdot V_i$$

where:
   i=rows $R_1$-$R_m$; and
   j=columns $C_1$-$C_n$.

Thus, current $I_1$ is the sum of the conductance of memristor 216(1)(1) times input voltage $V_1$, plus the conductance of memristor 216(1)(2) times input voltage $V_2$, ..., plus the conductance of memristor 216(1)(m) times input voltage $V_m$. The weight of the memristor cross-bar matrix circuit 212 (i.e., the conductances of each memristor 216(1)(1)-216(m)(n)) is updated to provide training based on output voltages of each of the post-neuron circuits 208(1)-208(n) applied backward to preceding input voltages $V_1$-$V_m$ of the pre-neuron circuits 204(1)-204(m).

The memristor cross-bar matrix circuit 212 in FIG. 2B has a sneak path current issue. Sneak path current is current that flows from an addressed row $R_1$-$R_m$ to and adjacent row $R_1$-$R_m$. For example, assume that column $C_1$ in the cross-bar synapse weight matrix circuit 214 is selected. A current flows in column $C_1$ not only through selected memristors 216(1)(1)-216(m)(1) in column $C_1$ to post-neuron circuit 208(1), but a sneak current also flows back into pre-neuron circuit 204(1). It may not be possible to distinguish the sneak-current leading to an incorrect updating of the weight of the memristor cross-bar matrix circuit 212. Further, RRAM technologies, such as memristors, may not have highly repeatable resistances leading to retention issues that can cause incorrect calculations. Endurance of RRAM technologies may also be limited.

SUMMARY OF THE DISCLOSURE

Aspects disclosed in the detailed description include multiple (multi-) level cell (MLC) non-volatile (NV) memory (NVM) matrix circuits for performing matrix computations with multi-bit input vectors. In exemplary aspects disclosed herein, an MLC NVM matrix circuit is provided that includes a plurality of NVM storage string circuits organized in respective memory rows. Each NVM storage string circuit includes a plurality of MLC NVM storage circuits. Thus, the plurality of MLC NVM storage circuits, which are each associated with an NVM storage string circuit, are arranged and addressable in respective memory rows and columns in the MLC NVM matrix circuit. Each MLC NVM storage circuit contains a plurality of NVM bit cell circuits that are each configured to store a 1-bit respective memory state. The respective memory states of the NVM bit cell circuits in a given MLC NVM storage circuit provide a multi-bit storage state in the MLC NVM storage circuit. Thus for example, the MLC NVM matrix circuit may form an m×n MLC NVM matrix circuit, where 'm' represents the number of memory rows of NVM storage string circuits provided, and 'n' represents the number of MLC NVM storage circuits within each NVM storage string circuit provided in respective memory columns. Each MLC NVM storage circuit stores a multi-bit memory state according to the individual stored memory states of the NVM bit cell circuits in its respective MLC NVM storage circuit. A plurality of bit lines are provided that are each configured to be coupled to a respective NVM storage string circuit. A plurality of source lines are provided that are each configured to be coupled to a respective NVM storage string circuit. Each MLC NVM storage circuit has a plurality of stored memory states represented by a resistance of their NVM bit cell circuits. Each MLC NVM storage circuit is coupled to a respective source line along with the other MLC NVM storage circuits in its respective memory row. Each NVM bit cell circuit includes a transistor whose gate node is coupled to a respective word line among a plurality of word lines configured to receive a multi-bit input vector of 1×n size for example. Each entry in the input vector represents a multi-bit input configured to be coupled to m×n word lines that are coupled to the respective gate nodes of the NVM bit cell circuits in respective MLC NVM storage circuits and control whether the resistance of a given NVM bit cell circuit is contributed to the overall resistance of its respective MLC NVM storage circuit. For example, the input vector could be a pre-synapse weight vector for example. Each source line is coupled to a respective output node wherein the source lines for all the NVM storage string circuits can collectively provide an output vector. The output vector may be a post-synapse vector for example.

To multiply the multi-bit input vector of 1×n size times the m×n MLC NVM matrix circuit formed by the plurality of NVM storage string circuits, a line voltage is applied to the bit lines of the NVM storage string circuits while input voltages representing the input vector are applied to n×m word lines to be applied to respective gate nodes of the NVM bit cell circuits in respective MLC NVM storage circuits. This causes a summation current to be generated on each source line based on the weighted summed contribution of each MLC NVM storage circuit total resistance (based on the individual resistance of their respective NVM bit cell circuits) to its respective source line. Each output node forms an output vector, which is the result of the 1×n multi-bit input vector times one (1) column n of the m×n MLC NVM matrix circuit. By the NVM bit cell circuits of the MLC NVM storage circuits including a transistor coupled to a word line that controls the resistance contributed by its respective NVM storage string circuit on its respective source line, a cross-bar connection between the word lines and the bit lines does not have to be provided, which avoids creating sneak path currents in the MLC NVM matrix circuit. The word lines and the bit lines are isolated from each other through the NVM bit cell circuits of their respective MLC NVM storage circuits.

In this regard, in one exemplary aspect, an MLC NVM matrix circuit is provided, comprising: a plurality of word lines configured to receive a multi-bit input vector represented by an input voltage on each word line among the plurality of word lines; a plurality of bit lines, each bit line among the plurality of bit lines configured to receive a corresponding line voltage; a plurality of source lines; and a plurality of NVM storage string circuits. Each NVM storage string circuit among the plurality of NVM storage string circuits is configured to be electrically coupled between a corresponding bit line among the plurality of bit lines and a corresponding source line among the plurality of source lines, each comprising a plurality of MLC NVM storage circuits. Each MLC NVM storage circuit among the plurality of MLC NVM storage circuits comprises a plurality of NVM bit cell circuits each configured to store a respective memory state for the corresponding MLC NVM storage circuit. Each NVM bit cell circuit among the plurality of NVM bit cell circuits in a respective MLC NVM storage circuit has a resistance representing a stored memory state, and comprises a gate node coupled to a corresponding word line among the plurality of word lines. Each NVM bit cell circuit is configured to couple its resistance to a source line among the plurality of source lines coupled to its respective MLC NVM storage circuit in response to the input voltage applied to the corresponding word line coupled to the gate node.

In another aspect, an MLC NVM matrix circuit is provided, comprising: a plurality of means for applying a plurality of input voltages representing a multi-bit input vector; a plurality of means for applying a plurality of line voltages; a plurality of means for providing a plurality of output currents representing an output vector; and a plurality of NVM storage string means. Each of the plurality of NVM storage string means is electrically coupled to a corresponding means for applying an input voltage among the plurality of means for applying the plurality of input voltages and a corresponding means for providing an output current among the plurality of means for providing the plurality of output currents. Each of the plurality of NVM storage string means comprises a plurality of MLC NV means for storing a multi-bit memory state and each has a resistance representing the stored multi-bit memory state to form a data vector for a corresponding NVM storage string means among the plurality of NVM storage string means. Each of the plurality of MLC NV means for storing the multi-bit memory state comprises a means for electrically coupling a resistance of a plurality of NV bit means for storing a 1-bit memory state to the means for providing the output current among the plurality of means for providing the plurality of output currents, and a means for controlling coupling of the resistance of the plurality of NV bit means for storing the 1-bit memory state to the means for providing the output current among the plurality of means for providing the plurality of output currents.

In another aspect, a method of performing matrix multiplication in an MLC NVM matrix circuit is provided. The method comprises applying a line voltage on at least one bit line among a plurality of bit lines coupled to a corresponding NVM storage string circuit among a plurality of NVM storage string circuits, to electrically couple the line voltage to the corresponding NVM storage string circuit coupled to a corresponding bit line among the plurality of bit lines. Each NVM storage string circuit among the plurality of NVM storage string circuits comprises a plurality of MLC NVM storage circuits each having a resistance representing a stored multi-bit memory state in the MLC NVM storage circuit to form a data vector for the corresponding NVM storage string circuit. The method further comprises applying a second line voltage on at least one source line among a plurality of source lines coupled to a corresponding NVM storage string circuit among the plurality of NVM storage string circuits, to electrically couple the second line voltage to the corresponding NVM storage string circuit coupled to a corresponding source line among the plurality of source lines. The method also comprises applying a plurality of input voltages representing a multi-bit input vector on a plurality of word lines. Each word line among the plurality of word lines is coupled to a corresponding gate node of an NVM bit cell circuit among a plurality of NVM bit cell circuits in each MLC NVM storage circuit among the plurality of MLC NVM storage circuits in each NVM storage string circuit, to electrically couple the MLC NVM storage circuit to the source line to couple the resistance of the MLC NVM storage circuit to the source line.

In another aspect, an MLC NVM matrix system is provided that comprises a first MLC NCM matrix circuit and a second MLC NVM matrix circuit. The first MLC NVM matrix circuit comprises: a plurality of first word lines configured to receive a first multi-bit input vector represented by a first input voltage on each first word line among the plurality of first word lines; a plurality of first bit lines, wherein each first bit line among the plurality of first bit lines is configured to receive a corresponding first line voltage; a plurality of first source lines each coupled to a first output node among a plurality of first output nodes; and a plurality of first NVM storage string circuits. Each first NVM storage string circuit among the plurality of first NVM storage string circuits is configured to be electrically coupled between a corresponding first bit line among the plurality of first bit lines and a corresponding first source line among the plurality of first source lines, each comprising a plurality of first MLC NVM storage circuits. Each first MLC NVM storage circuit among the plurality of first MLC NVM storage circuits comprises a plurality of first NVM bit cell circuits each configured to store a respective memory state for the corresponding first MLC NVM storage circuit. Each first NVM bit cell circuit among the plurality of first NVM bit cell circuits in a respective first MLC NVM storage circuit has a resistance representing a stored memory state, and comprises a first gate node coupled to a corresponding first word line among the plurality of first word lines. Each first NVM bit cell circuit is configured to couple its resistance to the first source line coupled to its respective first MLC NVM storage circuit in response to an input voltage applied to the corresponding first word line coupled to the first gate node. The second MLC NVM matrix circuit comprises: a plurality of second word lines each coupled to an output node among the plurality of first output nodes; a plurality of second bit lines, wherein each second bit line among the plurality of second bit lines is configured to receive a corresponding second line voltage; a plurality of second source lines each coupled to a second output node among a plurality of second output nodes; and a plurality of second NVM storage string circuits. Each second NVM storage string circuit among the plurality of second NVM storage string circuits is configured to be electrically coupled between a corresponding second bit line among the plurality of second bit lines and a corresponding second source line among the plurality of second source lines each comprising a plurality of second MLC NVM storage circuits. Each second MLC NVM storage circuit among the plurality of second MLC NVM storage circuits comprises a plurality of second NVM bit cell circuits each configured to store a respective memory state for the corresponding second MLC NVM storage circuit. Each second NVM bit cell circuit among the plurality of second NVM bit cell circuits in a respective second MLC NVM storage circuit has a resistance representing a stored memory state, and comprises a second gate node coupled to a corresponding second word line among the plurality of second word lines. Each second NVM bit cell circuit is configured to couple its resistance to the second source line coupled to its respective second MLC NVM storage circuit in response to the input voltage applied to the corresponding second word line coupled to the second gate node.

BRIEF DESCRIPTION OF THE FIGURES

FIG. 1A is an exemplary matrix network circuit employing memristor networks to provide synapses for complementary metal oxide semiconductor (CMOS) circuit neurons;

FIG. 1B illustrates an exemplary synaptic connection for a post-synaptic CMOS circuit neuron in the matrix network circuit of FIG. 1A;

DETAILED DESCRIPTION

Figures 2A, 2B:
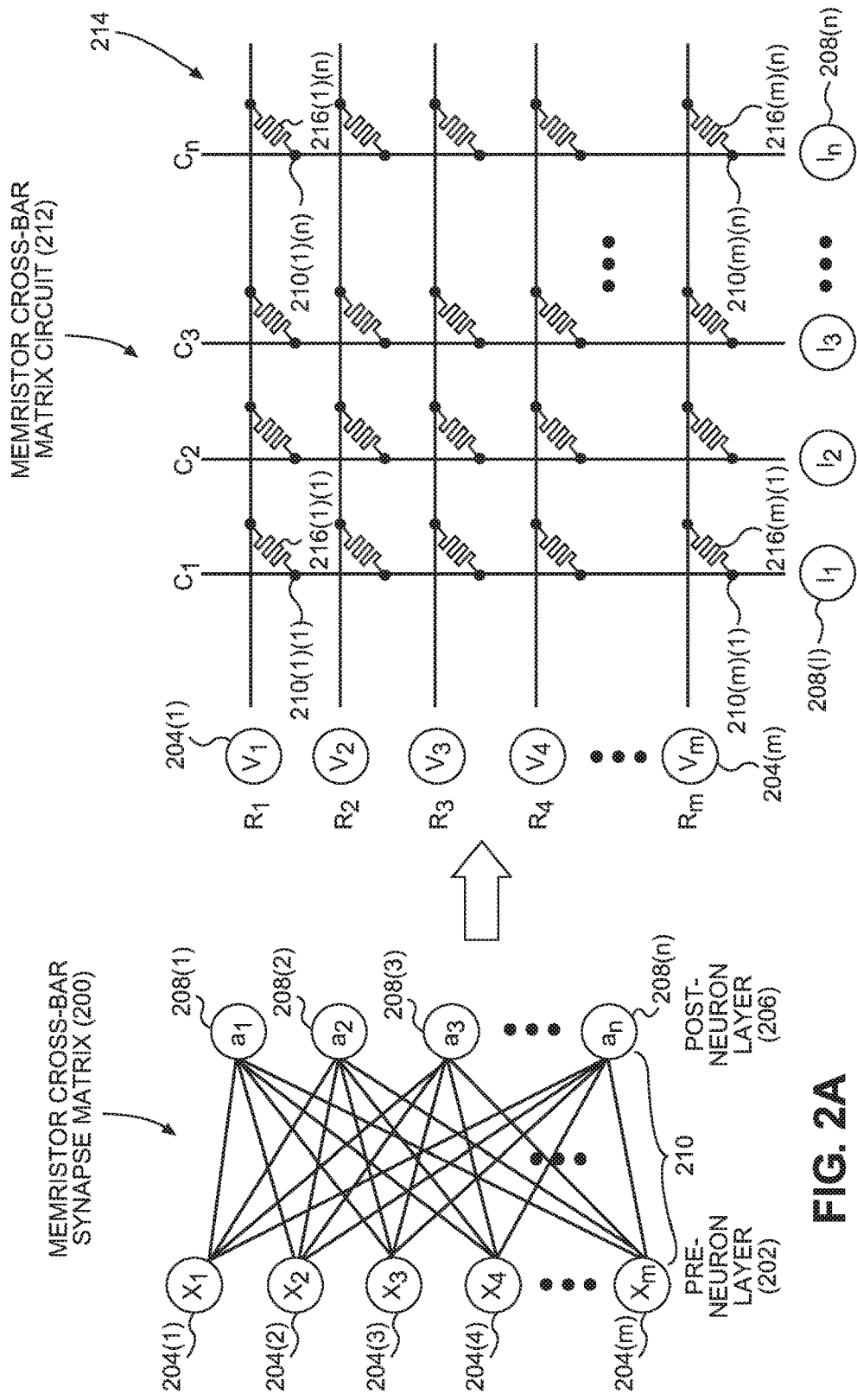
FIG. 2A illustrates an exemplary memristor cross-bar matrix circuit.
FIG. 2B illustrates an exemplary memristor cross-bar matrix circuit employing an RRAM cross-bar array circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include multiple (multi-) level cell (MLC) non-volatile (NV) memory (NVM) matrix circuits for performing matrix computations with multi-bit input vectors. In exemplary aspects disclosed herein, an MLC NVM matrix circuit is provided that includes a plurality of NVM storage string circuits organized in respective memory rows. Each NVM storage string circuit includes a plurality of MLC NVM storage circuits. Thus, the plurality of MLC NVM storage circuits, which are each associated with an NVM storage string circuit, are arranged and addressable in respective memory rows and columns in the MLC NVM matrix circuit. Each MLC NVM storage circuit contains a plurality of NVM bit cell circuits that are each configured to store a 1-bit respective memory state. The respective memory states of the NVM bit cell circuits in a given MLC NVM storage circuit provide a multi-bit storage state in the MLC NVM storage circuit. Thus for example, the MLC NVM matrix circuit may form an m×n MLC NVM matrix circuit, where 'm' represents the number of memory rows of NVM storage string circuits provided, and 'n' represents the number of MLC NVM storage circuits within each NVM storage string circuit provided in respective memory columns. Each MLC NVM storage circuit stores a multi-bit memory state according to the individual stored memory states of the NVM bit cell circuits in its respective MLC NVM storage circuit. A plurality of bit lines are provided that are each configured to be coupled to a respective NVM storage string circuit. A plurality of source lines are provided that are each configured to be coupled to a respective NVM storage string circuit. Each MLC NVM storage circuit has a plurality of stored memory states represented by a resistance of their NVM bit cell circuits. Each MLC NVM storage circuit is coupled to a respective source line along with the other MLC NVM storage circuits in its respective memory row. Each NVM bit cell circuit includes a transistor whose gate node is coupled to a respective word line among a plurality of word lines configured to receive a multi-bit input vector of 1×n size for example. Each entry in the input vector represents a multi-bit input configured to be coupled to m×n word lines that are coupled to the respective gate nodes of the NVM bit cell circuits in respective MLC NVM storage circuits and control whether the resistance of a given NVM bit cell circuit is contributed to the overall resistance of its respective MLC NVM storage circuit. For example, the input vector could be a pre-synapse weight vector for example. Each source line is coupled to a respective output node wherein the source lines for all the NVM storage string circuits can collectively provide an output vector. The output vector may be a post-synapse vector for example.

To multiply the multi-bit input vector of 1×n size times the m×n MLC NVM matrix circuit formed by the plurality of NVM storage string circuits, a line voltage is applied to the bit lines of the NVM storage string circuits while input voltages representing the input vector are applied to n×m word lines to be applied to respective gate nodes of the NVM bit cell circuits in respective MLC NVM storage circuits. This causes a summation current to be generated on each source line based on the weighted summed contribution of each MLC NVM storage circuit total resistance (based on the individual resistance of their respective NVM bit cell circuits) to its respective source line. Each output node forms an output vector, which is the result of the 1×n multi-bit input vector times one (1) column n of the m×n MLC NVM matrix circuit. By the NVM bit cell circuits of the MLC NVM storage circuits including a transistor coupled to a word line that controls the resistance contributed by its respective NVM storage string circuit on its respective source line, a cross-bar connection between the word lines and the bit lines does not have to be provided, which avoids creating sneak path currents in the MLC NVM matrix circuit. The word lines and the bit lines are isolated from each other through the NVM bit cell circuits of their respective MLC NVM storage circuits.

Figure 18:
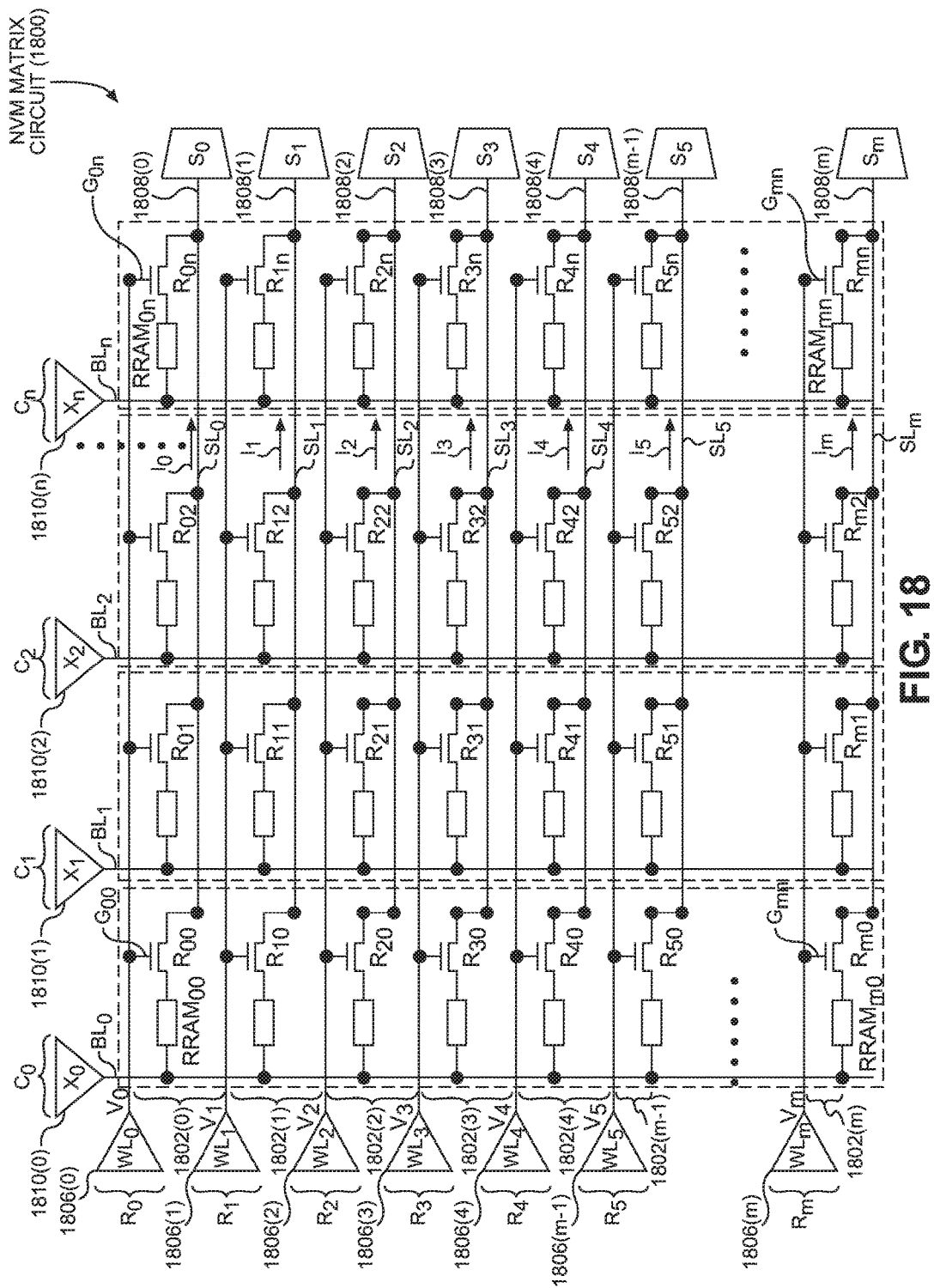
FIG. 18 is a schematic diagram of an exemplary NVM matrix circuit without need for cross-bar connections employing NVM storage string circuits in the form of NOR NVM RRAM circuits each comprised of a plurality of NVM RRAM bit cell circuits for performing matrix computations.
Figure 19:
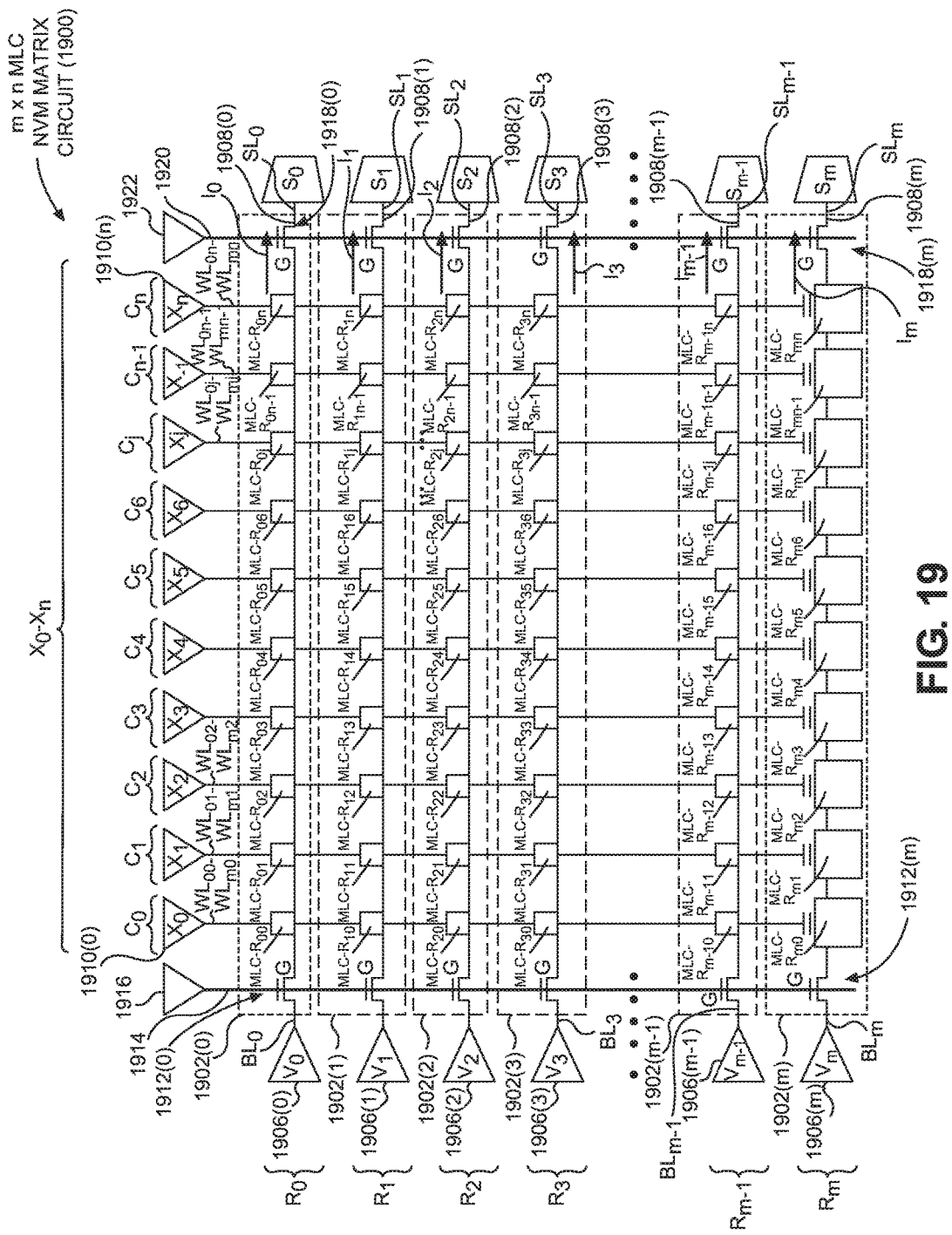
FIG. 19 is a schematic diagram of an exemplary multiple (multi-) level cell (MLC) NVM matrix circuit without need for cross-bar connections employing NVM storage string circuits each comprising a plurality of MLC NVM storage circuits that each comprise a plurality of NAND NVM bit cell circuits to provide for each MLC NVM storage circuit to represent a multi-bit memory state for performing matrix computations.

Before discussing exemplary MLC NVM matrix circuits that employ a plurality of MLC NVM storage circuits for performing multi-bit matrix computations without the need to use cross-bar connections starting at FIG. 19, MLC NVM matrix circuits employing NVM storage string circuits each including a plurality of NVM bit cell circuits for performing matrix computations without the need for cross-bar connections that are not MLC NVM matrix circuits are first discussed with regard to FIGS. 3A-18 below.

Figure 3A:
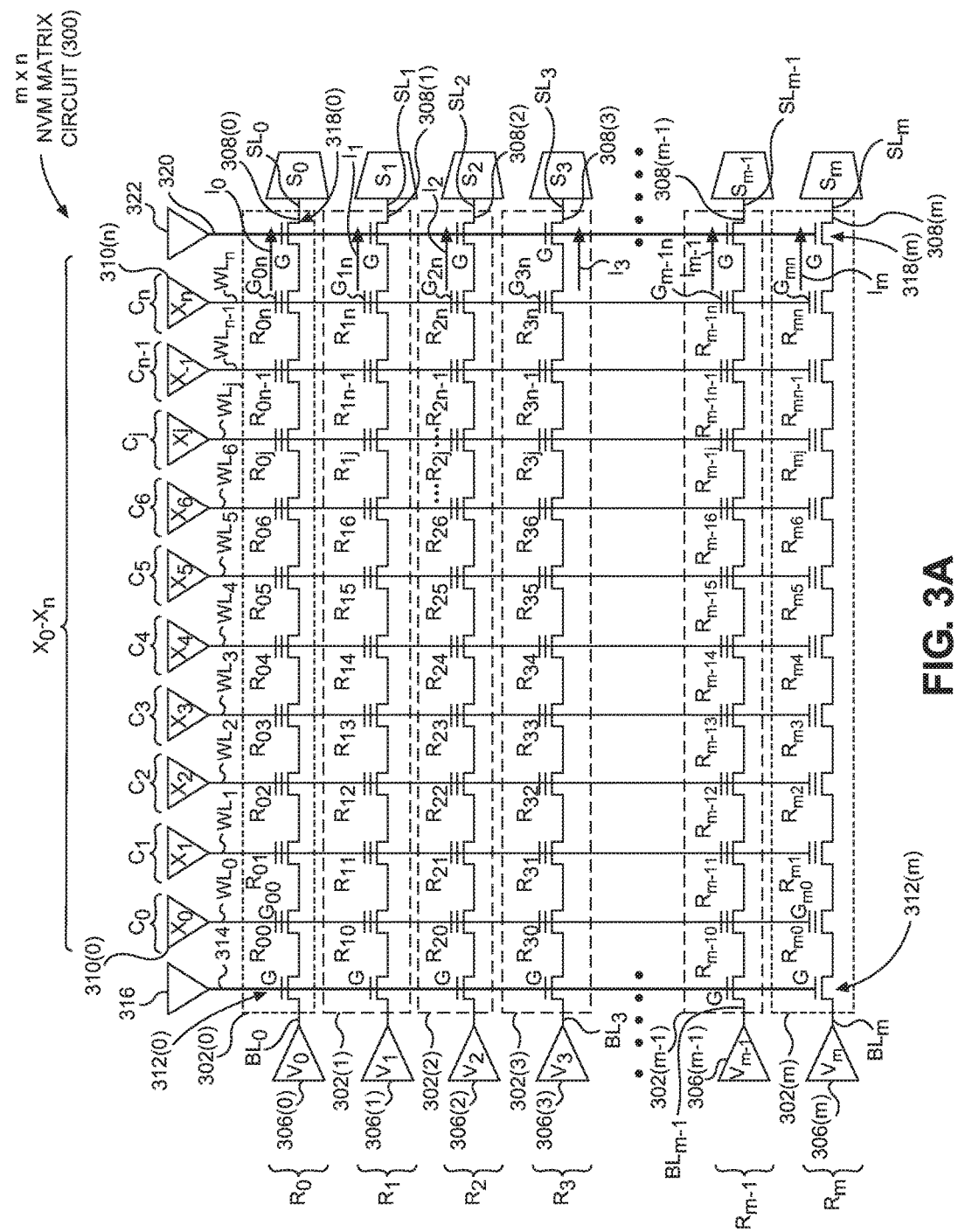
FIG. 3A is a schematic diagram of an exemplary non-volatile (NV) memory (NVM) matrix circuit without need for cross-bar connections employing NVM storage string circuits in the form of NAND NVM flash circuits and each comprised of a plurality of NVM flash bit cell circuits for performing matrix computations.

In this regard, FIG. 3A is a schematic diagram of an exemplary NVM matrix circuit 300 that can perform matrix multiplication without the use of cross-bar connections. The NVM matrix circuit 300 employs NVM storage string circuits 302(0)-302(m) in 'm+1' memory rows $R_0$-$R_m$ that each include a plurality of NVM bit cell circuits $R_{00}$-$R_{mn}$ in FIG. 3A. In this example, the NVM storage string circuits 302(0)-302(m) are NAND NVM flash circuits wherein the NVM bit cell circuits $R_{00}$-$R_{mn}$ are NVM flash circuits. However, the NVM storage string circuits 302(0)-302(m) can be provided as other types of NVM matrix circuits as discussed in more detail below in other aspects. The NVM bit cell circuits $R_{00}$-$R_{mn}$ in each respective NVM storage string circuit 302(0)-302(m) are arranged in memory rows $R_0$-$R_m$ and memory columns $C_0$-$C_n$. The NVM matrix circuit 300 includes a respective bit line $BL_0$-$BL_m$ for each memory row $R_0$-$R_m$. Bit line driver circuits 306(0)-306(m) are provided that are each configured to drive a respective line voltage $V_0$-$V_m$ on the respective bit lines $BL_0$-$BL_m$. Source lines $SL_0$-$SL_m$ are also provided that are each coupled to a respective output node 308(0)-308(m). The NVM storage string circuits 302(0)-302(m) are coupled between a corresponding bit line $BL_0$-$BL_m$ and a corresponding source line $SL_0$-$SL_m$ in each respective memory row $R_0$-$R_m$. The source lines $SL_0$-$SL_m$ are configured to carry a respective current $I_0$-$I_m$ to the respective output nodes 308(0)-308(m) as an output vector $S_0$-$S_m$ when their respective NVM bit cell circuits $R_{00}$-$R_{mn}$ are activated. For example, the output vector $S_0$-$S_m$ may be a binary post-synapse vector.

With continuing reference to FIG. 3A, the NVM matrix circuit 300 also includes a respective word line $WL_0$-$WL_n$ for each memory column $C_0$-$C_n$. Word line driver circuits 310(0)-310(n) are provided that are each configured to drive a respective input vector $X_0$-$X_n$ comprising a plurality of input voltages on the respective word lines $WL_0$-$WL_n$. As will be discussed in more detail below, the word lines $WL_0$-$WL_n$ are coupled to respective gate nodes $G_{00}$-$G_{mn}$ of the NVM bit cell circuits $R_{00}$-$R_{mn}$ in a given memory column $C_0$-$C_n$ to control the resistances of the NVM bit cell circuits $R_{00}$-$R_{mn}$ being applied to the respective source lines $SL_0$-$SL_m$. For example, the input vector $X_0$-$X_n$ may be a binary pre-synapse data vector. The NVM matrix circuit 300 also includes first access transistors 312(0)-312(m) coupled between a respective bit line $BL_0$-$BL_m$ and an NVM storage string circuit 302(0)-302(m). The first access transistors 312(0)-312(m) each comprise a first access gate node G coupled to a respective first access line 314 configured to be driven with a first access voltage by a first access line driver circuit 316. The first access transistors 312(0)-312(m) are each configured to control whether a corresponding line voltage $V_0$-$V_m$ applied on a respective bit line $BL_0$-$BL_m$ is applied to a respective NVM storage string circuit 302(0)-302(m) in a corresponding memory row $R_0$-$R_m$. The first access transistors 312(0)-312(m) are configured to pass a line voltage $V_0$-$V_m$ on respective bit lines $BL_0$-$BL_m$ in response to a first access signal (voltage) driven by the first access line driver circuit 316 onto a second access line 320 to the first access gate node G of the first access transistors 312(0)-312(m) sufficient to turn on the first access transistors 312(0)-312(m). The NVM matrix circuit 300 also includes second access transistors 318(0)-318(m) coupled between a respective NVM storage string circuit 302(0)-302(m) and a source line $SL_0$-$SL_m$ coupled to the output nodes 308(0)-308(m). The second access transistors 318(0)-318(m) are each configured to couple a respective NVM storage string circuit 302(0)-302(m) to a respective source line $SL_0$-$SL_m$ and a respective output node 308(0)-308(m) in response to a second access signal (voltage) driven by the second access line driver circuit 322 onto the second access line 320 to a second access gate node G of the second access transistors 318(0)-318(m) sufficient to turn on the second access transistors 318(0)-318(m). As shown in FIG. 3A, there is no cross-bar coupling between the word lines $WL_0$-$WL_n$ and the bit lines $BL_0$-$BL_m$. The access transistors 312(0)-312(m), 318(0)-318(m) of the NVM storage string circuits 302(0)-302(m) can provide further isolation between the word lines $WL_0$-$WL_n$ and the bit lines $BL_0$-$BL_m$.

Figure 3B:
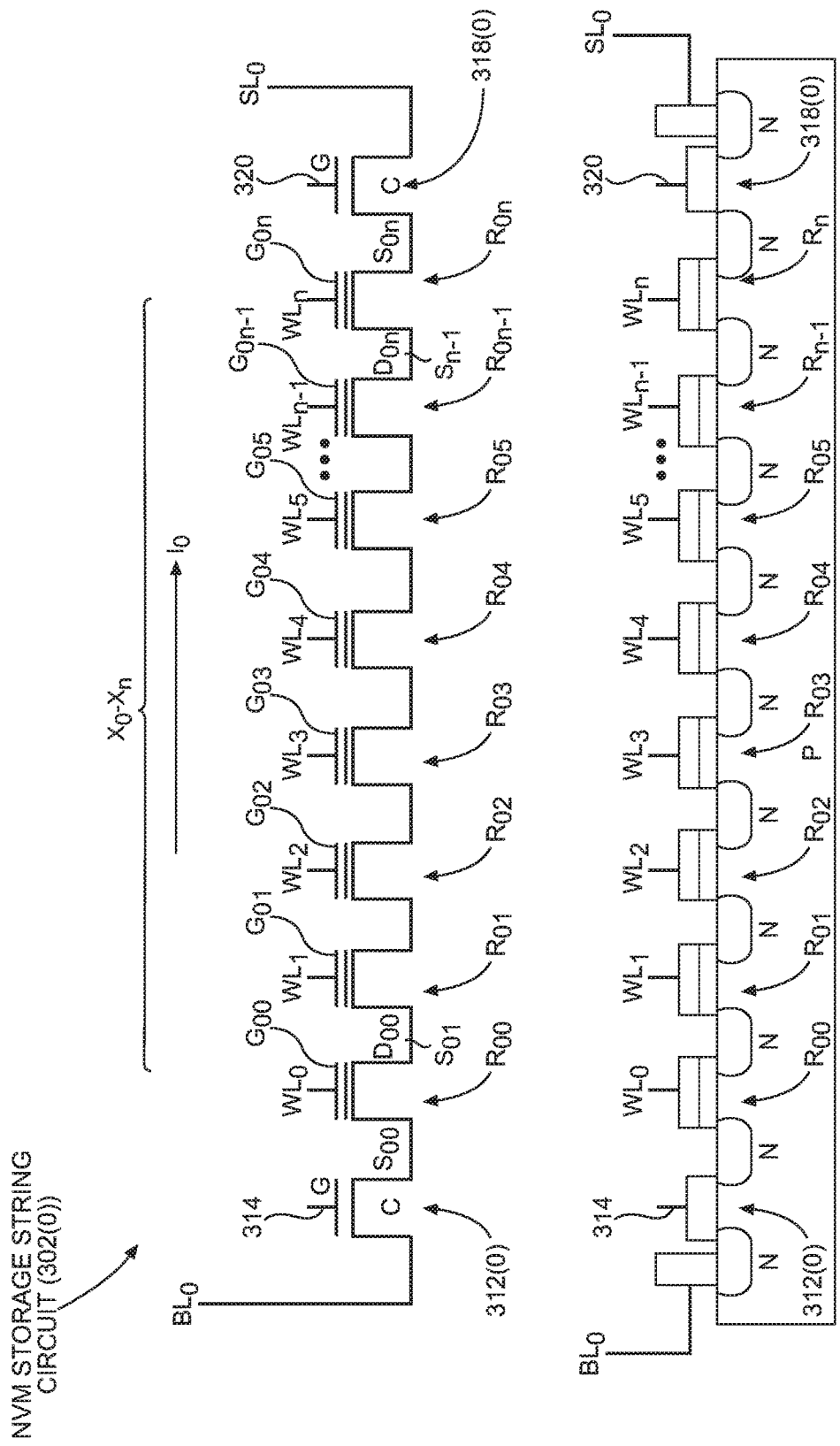
FIG. 3B is a schematic diagram of an exemplary two-dimensional (2D) NAND NVM flash circuit that can be an NVM bit cell circuit in the NVM matrix circuit in FIG. 3A.

With continuing reference to FIG. 3A, each NVM bit cell circuit $R_{00}$-$R_{mn}$ in the NVM matrix circuit 300 is an NVM flash circuit that does not need power to retain data in this example. FIG. 3B is a schematic diagram of an exemplary two-dimensional (2D) NAND flash memory circuit that can be provided as the NVM storage string circuits 302(0)-302(m) in the NVM matrix circuit 300 in FIG. 3A. FIG. 3B illustrates an exemplary NVM storage string circuit 302(0) that can be provided in memory row $R_0$ in the NVM matrix circuit 300 in FIG. 3A as an example in both a circuit and layout diagram. As shown in FIG. 3B, the NVM bit cell circuits $R_{00}$-$R_{mn}$ are each coupled to each other in a series-coupled, string fashion, which source nodes $S_{00}$-$S_{0n-1}$ of the NVM bit cell circuits $R_{00}$-$R_{n-1}$ are coupled to drain nodes $D_{01}$-$D_{0n}$ of an adjacent NVM bit cell circuit $R_{01}$-$R_{0n}$. The end NVM bit cell circuits $R_{00}$, $R_n$ in the NVM storage string circuit 302(0) are coupled to respective access transistors 312(0), 318(0). Each NVM bit cell circuit $R_{00}$-$R_{0n}$ has a resistance representing a stored memory state. Each NVM bit cell circuit $R_{00}$-$R_{mn}$ has a transistor comprising a gate $G_{00}$-$G_{0n}$ that is coupled to a respective word line $WL_0$-$WL_n$ based on in which memory column $C_0$-$C_n$ the NVM bit cell circuit $R_{00}$-$R_{mn}$ is located. Each NVM bit cell circuit $R_{00}$-$R_{mn}$ is configured to be activated to activate a semiconductor channel to couple its resistance on a respective source line $SL_0$-$SL_m$ in its memory row $R_0$-$R_m$. The collective memory states in the NVM bit cell circuits $R_{00}$-$R_{0n}$ form a data vector stored in the NVM storage string circuit 302(0). As shown in FIG. 3B, there is no cross-bar coupling between the word line $WL_0$ and the bit line $BL_0$, which is also true between all word lines $WL_0$-$WL_n$ and the respective bit lines $BL_0$-$BL_m$.

With continuing reference to FIG. 3B, as will be discussed in more detail below, when a line voltage in applied to bit line $BL_0$ and access voltages are applied to the access gate nodes G of the access transistors 312(0)-312(m) sufficient to activate the semiconductor channels C of the access transistors 312(0)-312(m), the NVM storage string circuit 302 (0) is coupled to the bit line $BL_0$ and the source line $SL_0$. The input voltages as an input vector $X_0$-$X_n$ applied to the word lines $WL_0$-$WL_n$ and gate nodes $G_{00}$-$G_{0n}$ of the respective NVM bit cell circuits $R_{00}$-$R_{0n}$ as an input vector $X_0$-$X_n$ control activation of the respective NVM bit cell circuits $R_{00}$-$R_{0n}$. When activated, the NVM bit cell circuits $R_{00}$-$R_{0n}$ couple their resistances to the source line $SL_0$. The resistances of the NVM bit cell circuits $R_{00}$-$R_{0n}$ are a function of their stored memory states. Thus, the resistances of the NVM bit cell circuits $R_{00}$-$R_{0n}$ can represent a weight vector. The current $I_0$ flowing on a respective source line $SL_0$ to the output node 308(0) is a function of the sum of the dot product multiplications of the respective input vector $X_0$-$X_n$ multiplied by the corresponding memory states in the NVM bit cell circuits $R_{00}$-$R_{0n}$ of the NVM storage string circuit 302(0). Thus, with reference to FIG. 3A, all the NVM bit cell circuits $R_{00}$-$R_{0n}$ for the NVM storage string circuits 302(0)-302(m) in the NVM matrix circuit 300 in FIG. 3A can represent a weight matrix. The current $I_0$-$I_m$ flowing from the respective source lines $SL_0$-$SL_M$ of the respective NVM storage string circuits 302(0)-302(m) to output nodes 308 (0)-308(m) is a function of the respective line voltages $V_0$-$V_m$ driven by the bit line driver circuits 306(0)-306(m) on the respective source lines $SL_0$-$SL_m$ divided by the summed channel resistances of the NVM bit cell circuits $R_{00}$-$R_{mn}$ of the NVM storage string circuits 302(0)-302(m). The currents $I_0$-$I_m$ may be analog representations of a summation of the dot product multiplications which can be converted to binary values. In other words, the NVM matrix circuit 300 in FIG. 3A is configured to produce currents $I_0$-$I_m$ on an input layer according to the following formula:

$$I_i = V_{BL} \Big/ \sum_j R_{ij}$$

where:
  i=memory row 0 to m;
  j=memory column 0 to n;
  $V_{BL}$=voltage $V_i$; and
  $R_{ij}$=resistance of an NVM bit cell circuit.

Thus, with continuing reference to FIG. 3A, the NVM matrix circuit 300 is configured to perform matrix multiplication of each of the 1×n weight vectors stored as respective memory states in each of the NVM storage string circuits 302(0)-302(m) by the n×1 input vector $X_0$-$X_n$ simultaneously. The dot products of these vector multiplications are provided as a function of the respective amplitudes of the currents $I_0$-$I_m$ generated at the output nodes 308(0)-308(m) according to the current formula provided above.

Further, if the word lines $WL_0$-$WL_m$ are coupled to a pre-neuron layer and the output nodes 308(0)-308(m) are coupled to a post-neuron layer, the NVM matrix circuit 300 is also configured to train the channel resistance of the NVM bit cell circuits $R_{00}$-$R_{mn}$ by supporting backwards propagation of a weight update according to the following formula:

$$\Delta R_{ij} = \eta \cdot S_{post,i} \cdot S_{post+1,j}$$

where:
  $R_{ij}$=resistance of an NVM bit cell circuit; and
  S=value at source lines of NVM bit cell circuits.

Figure 4A:
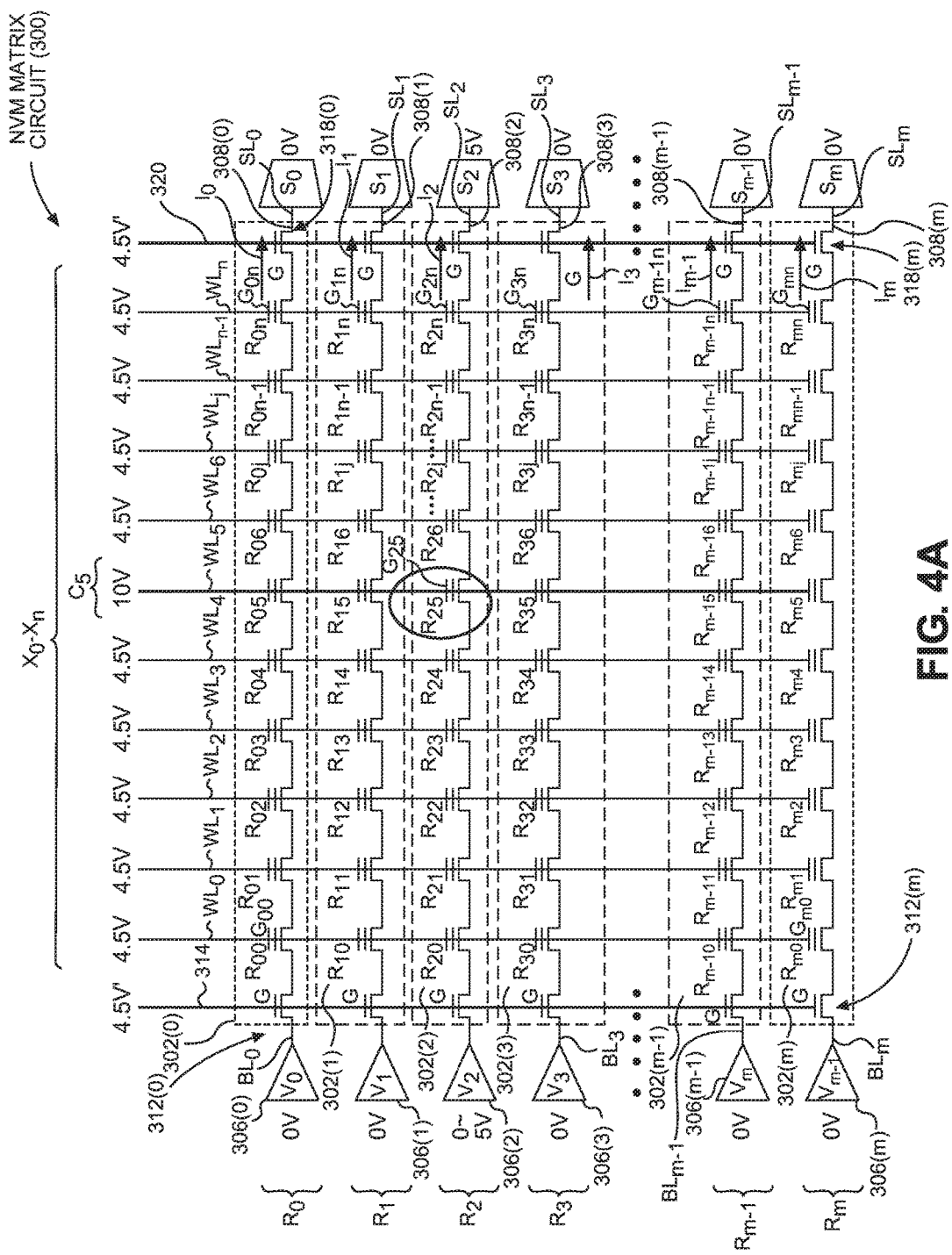
FIG. 4A illustrates an exemplary logic '0' write operation in the NVM matrix circuit in FIG. 3A.
Figure 4B:
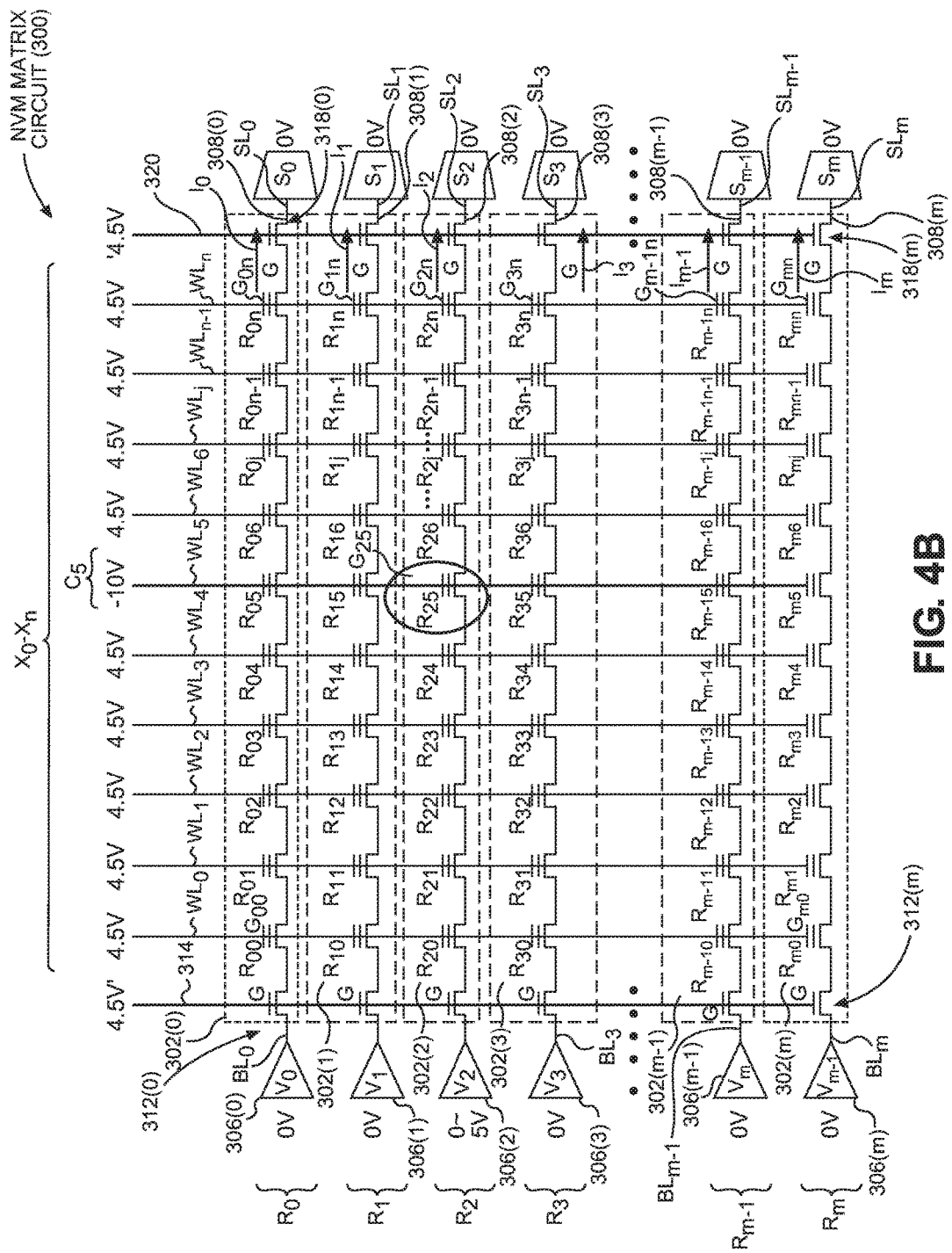
FIG. 4B illustrates an exemplary logic '1' write operation in the NVM matrix circuit in FIG. 3A.

The weight matrix of the NVM matrix circuit 300 provided as stored memory states in the NVM bit cell circuits $R_{00}$-$R_{mn}$ can be set to the desired memory states in a write operation to provide the desired weight matrix. For example, FIG. 4A illustrates writing a logic '0' in a write operation to the NVM bit cell circuit $R_{25}$ in the NVM matrix circuit 300 in FIG. 3A. As shown therein, to write a logic '0' to NVM bit cell circuit $R_{25}$ in this example, a 0 V or 5 V line voltage is applied by the bit line driver circuit 306(2) on the bit line $BL_2$ for memory row $R_2$ depending on whether the NVM bit cell circuit $R_{25}$ stores a memory state with or without a charge trap, respectively. A line voltage of 5V is applied on source line $SL_2$ coupled to the output node 308(2). An input voltage of 10V is applied to the word line $WL_2$ to be applied to the gate node $G_{25}$ of the NVM bit cell circuit $R_{25}$ to program the memory state of the NVM bit cell circuit $R_{25}$ to a logic '0' memory state. Similarly, FIG. 4B illustrates writing a logic '1' in a write operation to the NVM bit cell circuit $R_{25}$ in the NVM matrix circuit 300 in FIG. 3A. As shown therein, to write a logic '1' to NVM bit cell circuit $R_{25}$ in this example, a 0 V or 5 V line voltage is applied by the bit line driver circuit 306(2) on the bit line $BL_2$ for memory row $R_2$ depending on whether the NVM bit cell circuit $R_{25}$ stores a memory state without or with a charge trap, respectively. A line voltage of 0V is applied on the source line $SL_2$ coupled to the output node 308(2). A voltage of −10 V is applied to the word line $WL_2$ to be applied to the gate node $G_{25}$ of the NVM bit cell circuit $R_{25}$ to program the memory state of NVM bit cell circuit $R_{25}$ to a logic '1' memory state.

Figure 5:
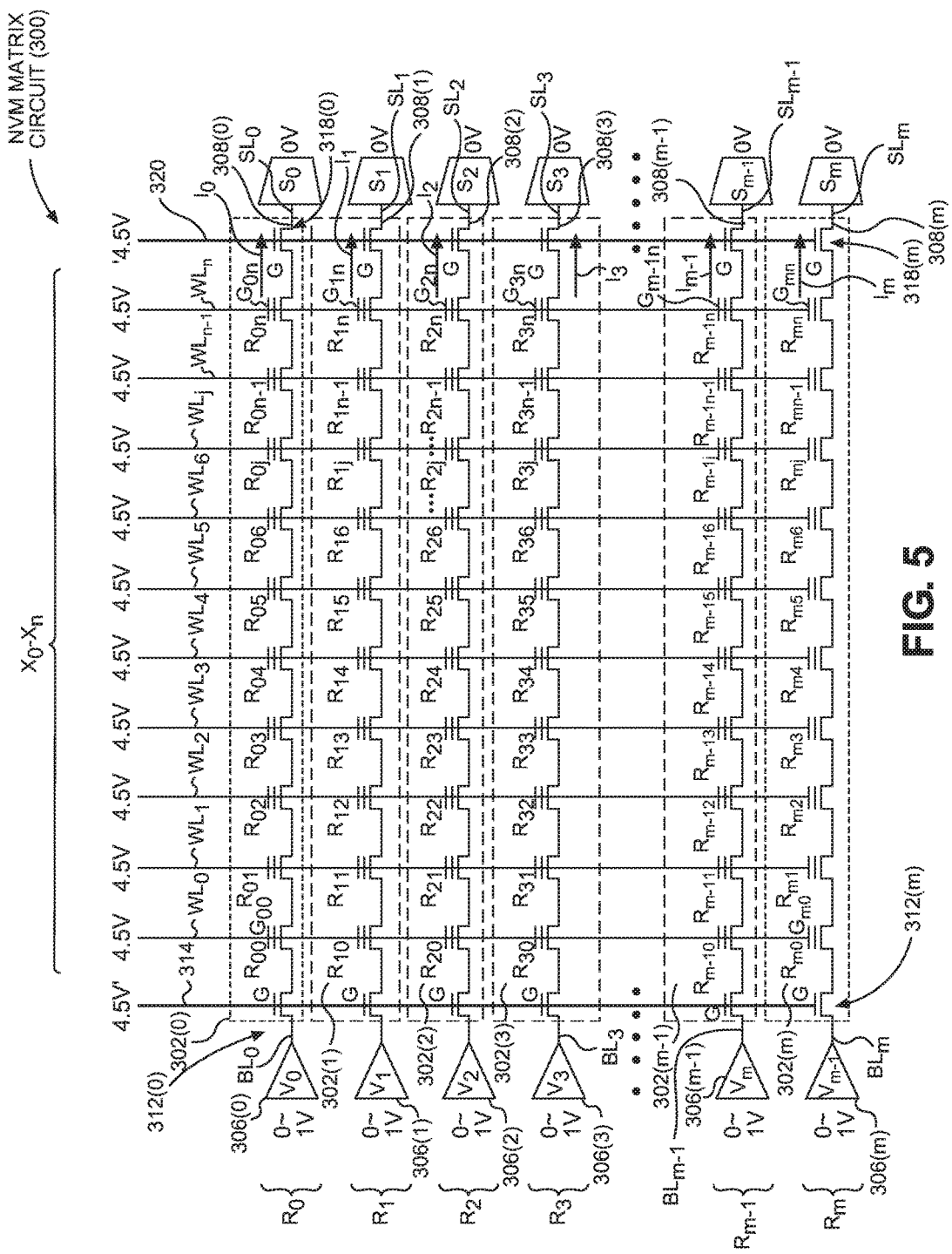
FIG. 5 illustrates an exemplary read operation in the NVM matrix circuit in FIG. 3A.

FIG. 5 illustrates an exemplary read operation in the NVM matrix circuit 300 in FIG. 3A. A read operation is performed to cause the NVM matrix circuit 300 to perform a matrix computation. To multiply the input vector $X_0$-$X_n$ times the memory states of each of the NVM storage string circuits 302(0)-302(m) to generate respective currents $I_0$-$I_m$ on the source lines $SL_0$-$SL_m$ coupled to the output nodes 308(0)-308(m), all the NVM bit cell circuits $R_{00}$-$R_{mn}$ are activated in this example. In this regard, in this example, an input voltage of 4.5 V is applied as the input vector $X_0$-$X_n$ to each of the respective word lines $WL_0$-$WL_n$ to cause the channel resistances of each of the NVM bit cell circuits $R_{00}$-$R_{mn}$ added in series to contribute to the overall series resistance of the respective source lines $SL_0$-$SL_m$. Their channel resistances contribute to the overall series resistance of respective source lines $SL_0$-$SL_m$ and are a function of the memory states stored in the NVM bit cell circuits $R_{00}$-$R_{mn}$.

The currents $I_0$-$I_m$ at the output nodes 308(0)-308(m) are a function of the sum of the dot product multiplications of input vectors $X_0$-$X_n$ multiplied by the respective memory states of the NVM bit cell circuits $R_{00}$-$R_{mn}$ each in the respective NVM storage string circuits 302(0)-302(m) as weight vectors.

Figure 6A:
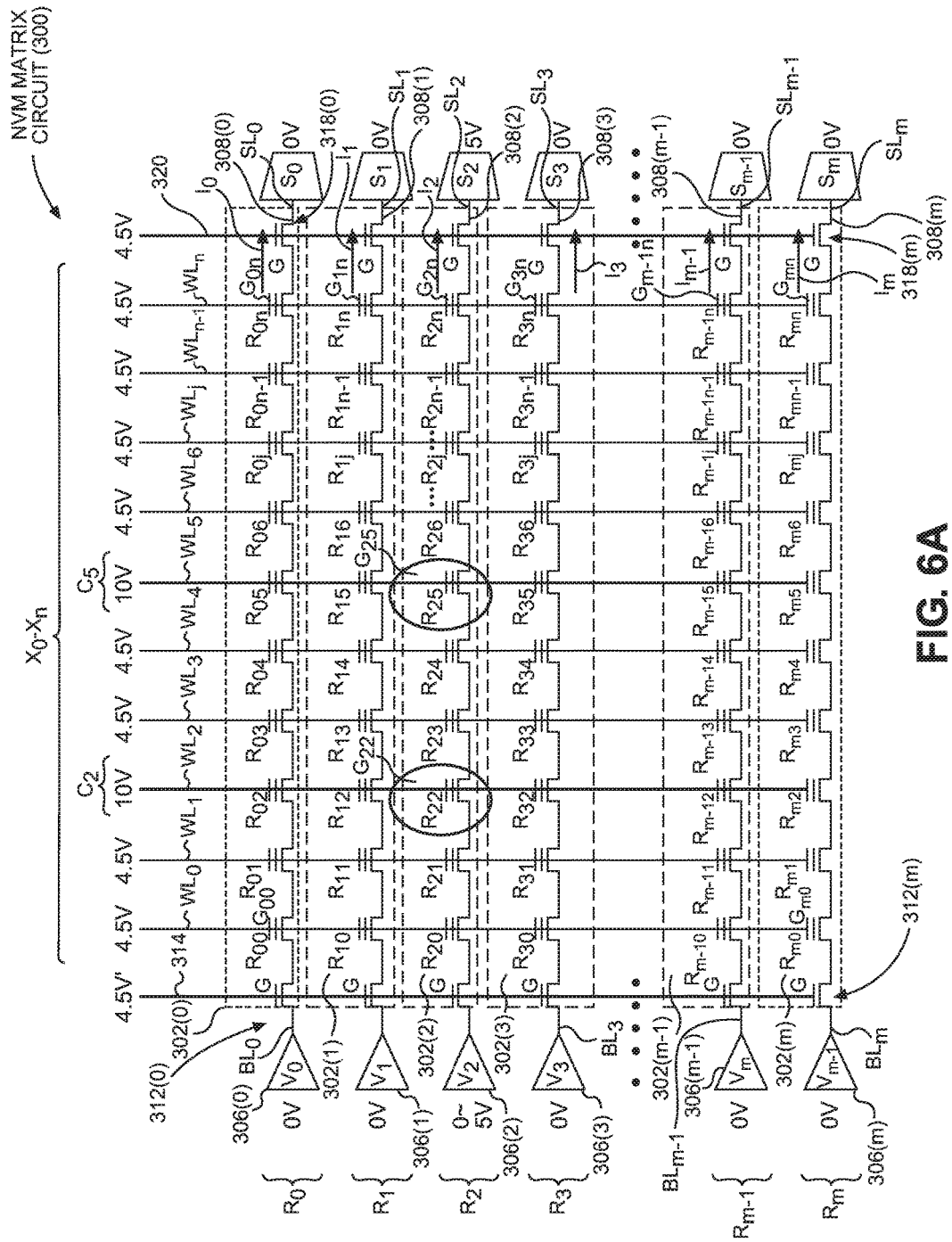
FIG. 6A illustrates another exemplary logic '0' write operation in the NVM matrix circuit in FIG. 3A.
Figure 6B:
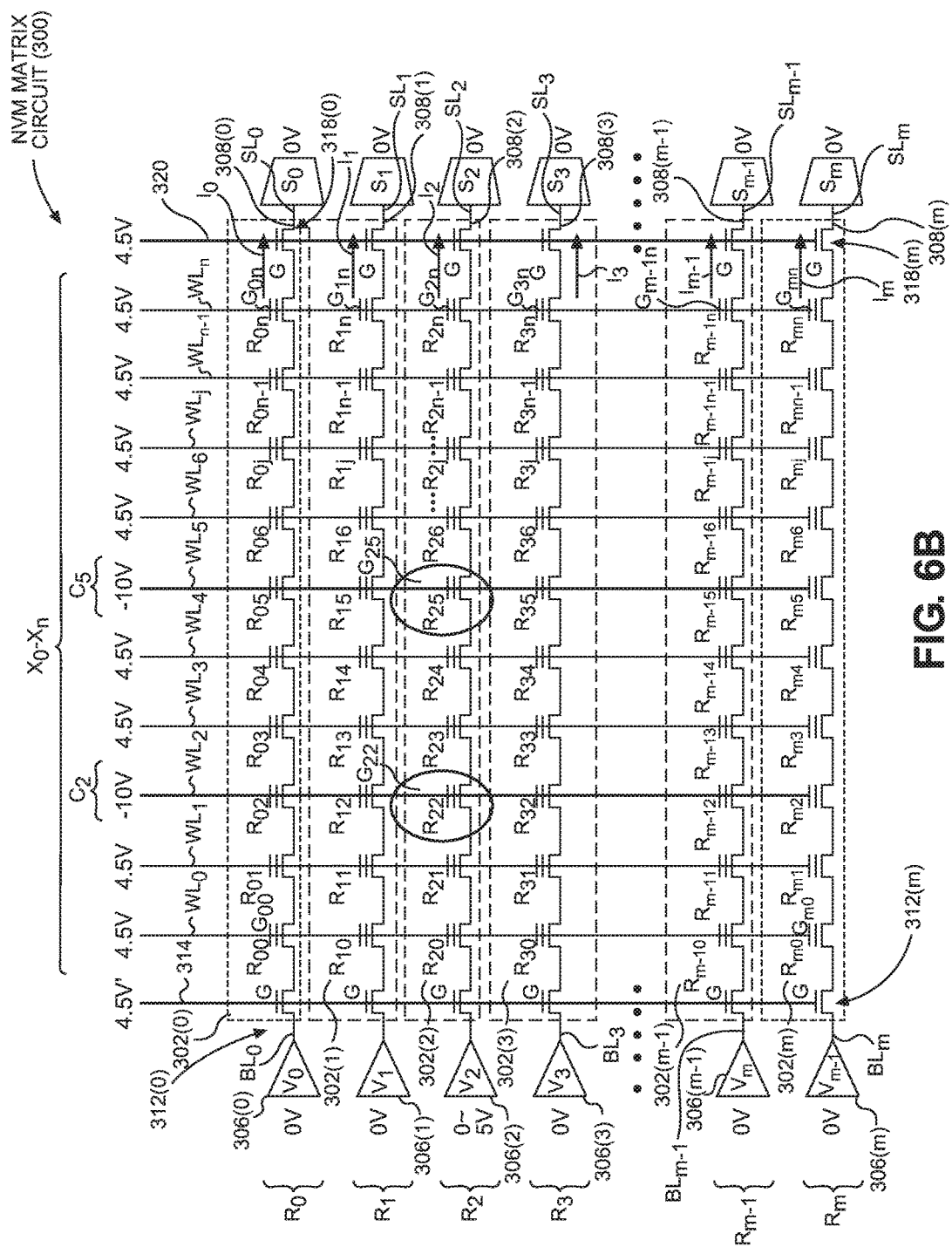
FIG. 6B illustrates another exemplary logic '1' write operation in the NVM matrix circuit in FIG. 3A.

More than one NVM bit cell circuit $R_{00}$-$R_{mn}$ in a given memory row $R_0$-$R_m$ in the NVM matrix circuit 300 in FIG. 3A can be written to at a time as part of a write operation. In this regard, FIG. 6A illustrates writing a logic '0' in a write operation to the NVM bit cell circuits $R_{22}$ and $R_{25}$ in the NVM matrix circuit 300 in FIG. 3A. As shown in FIG. 6A, to write a logic '0' to NVM bit cell circuits $R_{22}$ and $R_{25}$ in this example, a 0 V or 5 V line voltage is applied by the bit line driver circuit 306(2) on the bit line $BL_2$ for memory row $R_2$ depending on whether the NVM bit cell circuits $R_{22}$ and $R_{25}$ store a memory state with or without a charge trap, respectively. A line voltage of 5 V is applied on the source line $SL_2$. An input (i.e., program) voltage of 10V is applied to the word lines $WL_2$ and $WL_5$ to be applied to both gate nodes $G_{22}$ and $G_{25}$ of the NVM bit cell circuits $R_{22}$ and $R_{25}$ to program the NVM bit cell circuits $R_{22}$ and $R_{25}$ to a logic '0' memory state. A different input voltage not sufficient to program the NVM bit cell circuits $R_{00}$-$R_{m0}$, $R_{01}$-$R_{m1}$, $R_{03}$-$R_{m3}$, $R_{04}$-$R_{m4}$, $R_{06}$-$R_{mn}$ in memory columns $C_0$, $C_1$, $C_3$, $C_4$, and $C_6$-$C_n$ can be applied to write lines $WL_0$, $WL_1$, $WL_3$, $WL_4$, and $WL_6$-$WL_n$ for the write operation. Similarly, FIG. 6B illustrates writing a logic '1' in a write operation to the NVM bit cell circuits $R_{22}$ and $R_{25}$ in the NVM matrix circuit 300 in FIG. 3A. As shown in FIG. 6B, to write a logic '1' to NVM bit cell circuits $R_{22}$ and $R_{25}$ in this example, a 0 V or 5 V line voltage is applied by the bit line driver circuit 306(2) on the bit line $BL_2$ for memory row $R_2$ depending on whether the NVM bit cell circuits $R_{22}$ and $R_{25}$ store a memory state without or with a charge trap, respectively. A voltage of 0 V is applied on the source line $SL_2$. An input (i.e., program) voltage of −10V is applied to the word lines $WL_2$ and $WL_5$ to be applied to both gate nodes $G_{22}$ and $G_{25}$ of the NVM bit cell circuits $R_{22}$ and $R_{25}$ to program the NVM bit cell circuits $R_{22}$ and $R_{25}$ to a logic '1' memory state.

Figure 7A:
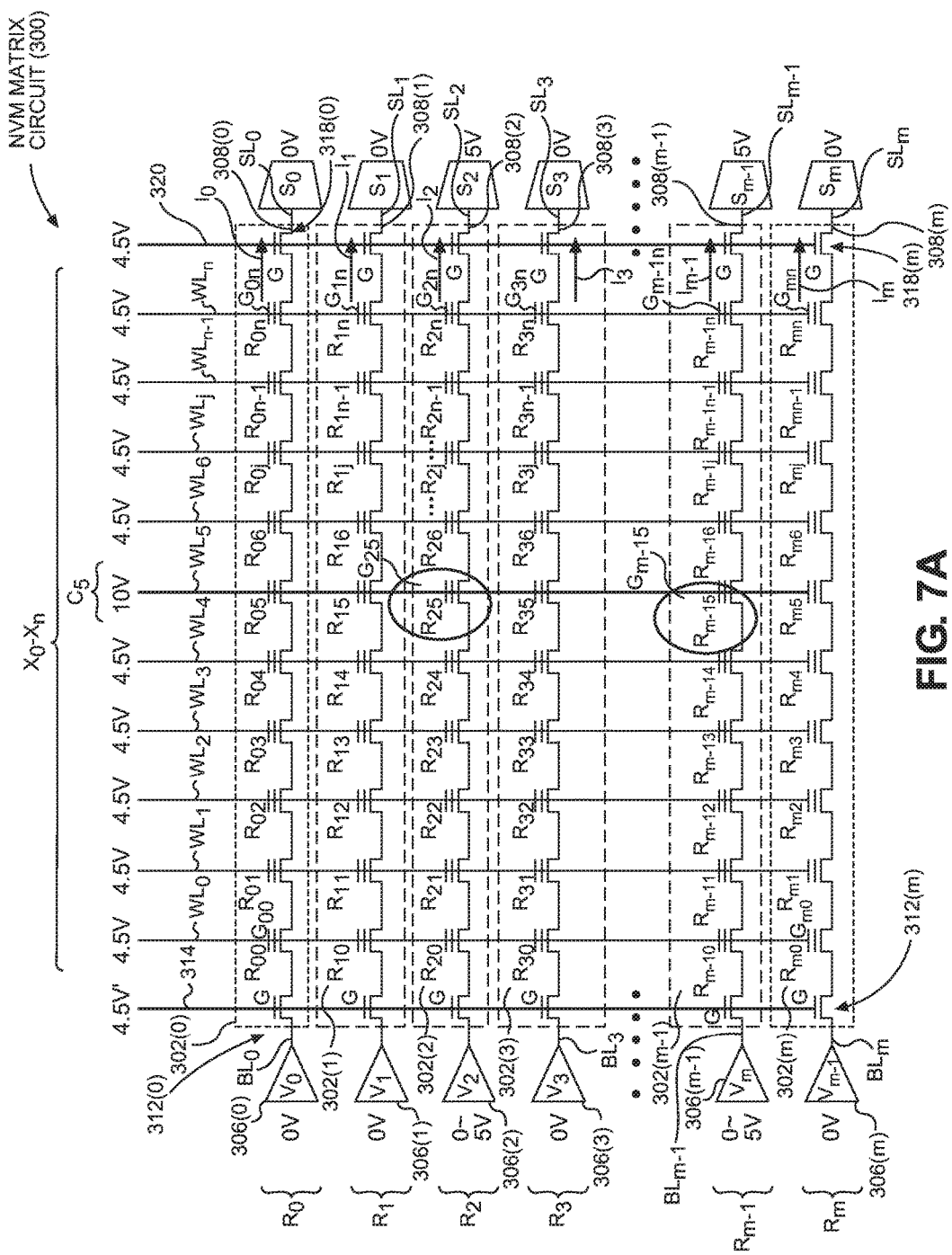
FIG. 7A illustrates another exemplary logic '0' write operation in the NVM matrix circuit in FIG. 3A.
Figure 7B:
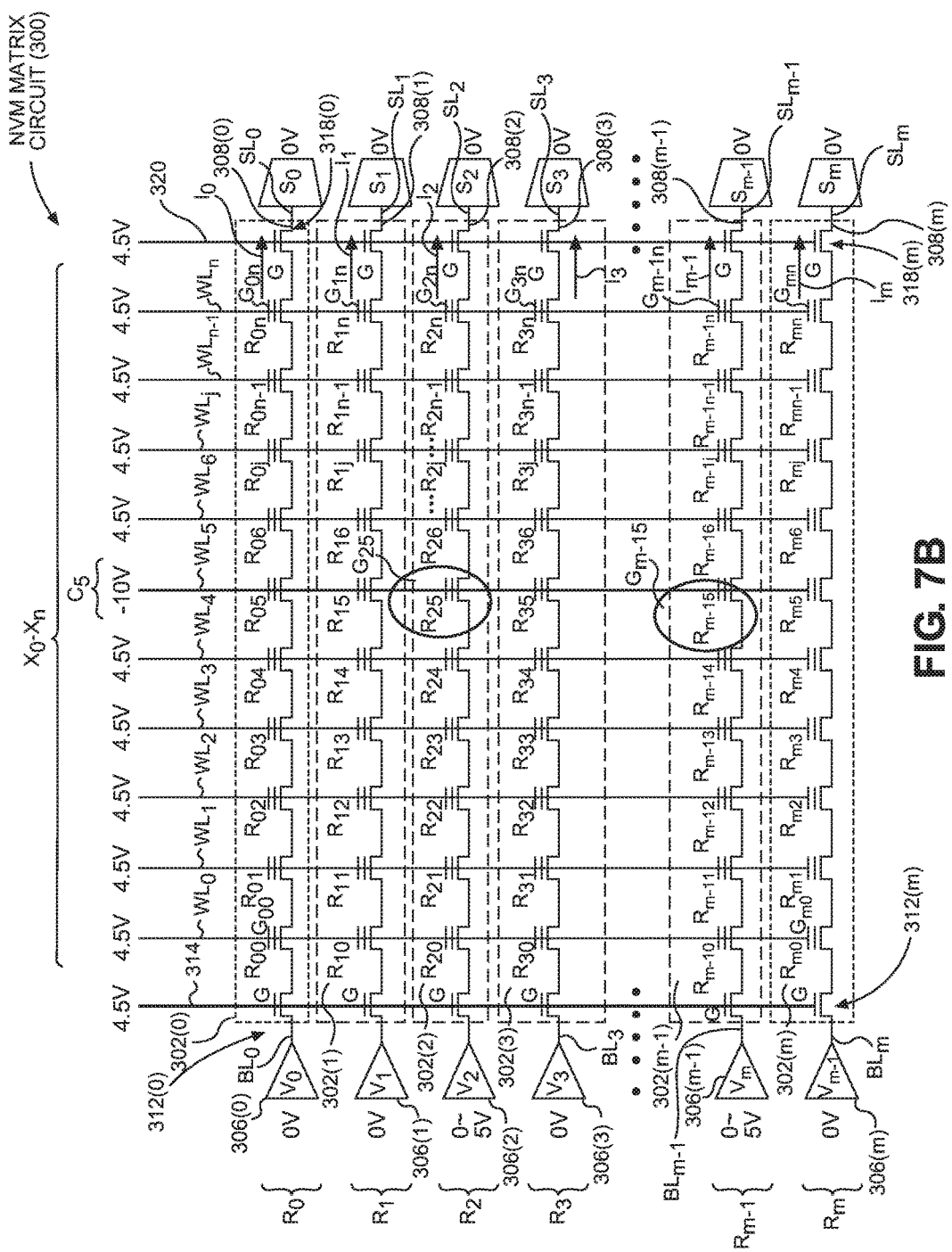
FIG. 7B illustrates another exemplary logic '1' write operation in the NVM matrix circuit in FIG. 3A.

More than one NVM bit cell circuits $R_{00}$-$R_{mn}$ in a given memory column $C_0$-$C_n$ in the NVM matrix circuit 300 in FIG. 3A can be written to at a time as part of a write operation. In this regard, FIG. 7A illustrates writing a logic '0' in a write operation to both NVM bit cell circuits $R_{25}$ and $R_{m-15}$ in memory column $C_5$ in the NVM matrix circuit 300 in FIG. 3A. As shown in FIG. 7A, to write a logic '0' to NVM bit cell circuits $R_{25}$ and $R_{m-15}$ in this example, a 0 V or 5 V line voltage is applied by the bit line driver circuits 306(2), 306(m−1) on the bit lines $BL_2$ and $BL_{m-1}$ for memory rows $R_2$ and $R_{m-1}$ depending on whether the NVM bit cell circuits $R_{25}$ and $R_{m-15}$ store a memory state with or without a charge trap, respectively. A line voltage of 5 V is applied on the source lines $SL_2$ and $SL_{m-1}$. An input (i.e., program) voltage of 10V is applied to the word line $WL_2$ to be applied to gate nodes $G_{25}$ and $G_{m-15}$ of the NVM bit cell circuits $R_{25}$ and $R_{m-15}$ to program the NVM bit cell circuits $R_{25}$ and $R_{m-15}$ to a logic '0' memory state. Similarly, FIG. 7B illustrates writing a logic '1' in a write operation to both NVM bit cell circuits $R_{25}$ and $R_{m-15}$ in memory column $C_5$ in the NVM matrix circuit 300 in FIG. 3A. As shown in FIG. 7B, to write a logic '1' to NVM bit cell circuits $R_{25}$ and $R_{m-15}$ in this example, a 0 V or 5 V line voltage is applied by the bit line driver circuits 306(2), 306(m−1) on the bit lines $BL_2$ and $BL_{m-1}$ for memory row $R_2$ depending on whether the NVM bit cell circuits $R_{25}$ and $R_{m-15}$ store a memory state without or with a charge trap, respectively. A line voltage of 0 V is applied on the source lines $SL_2$ and $SL_{m-1}$. An input (i.e., program) voltage of −10V is applied to the word line $WL_2$ to be applied to gates $G_{25}$ and $G_{m-15}$ of the NVM bit cell circuits $R_{25}$ and $R_{m-15}$ to program the NVM bit cell circuits $R_{25}$ and $R_{m-15}$ to a logic '1' memory state.

Figure 8A:
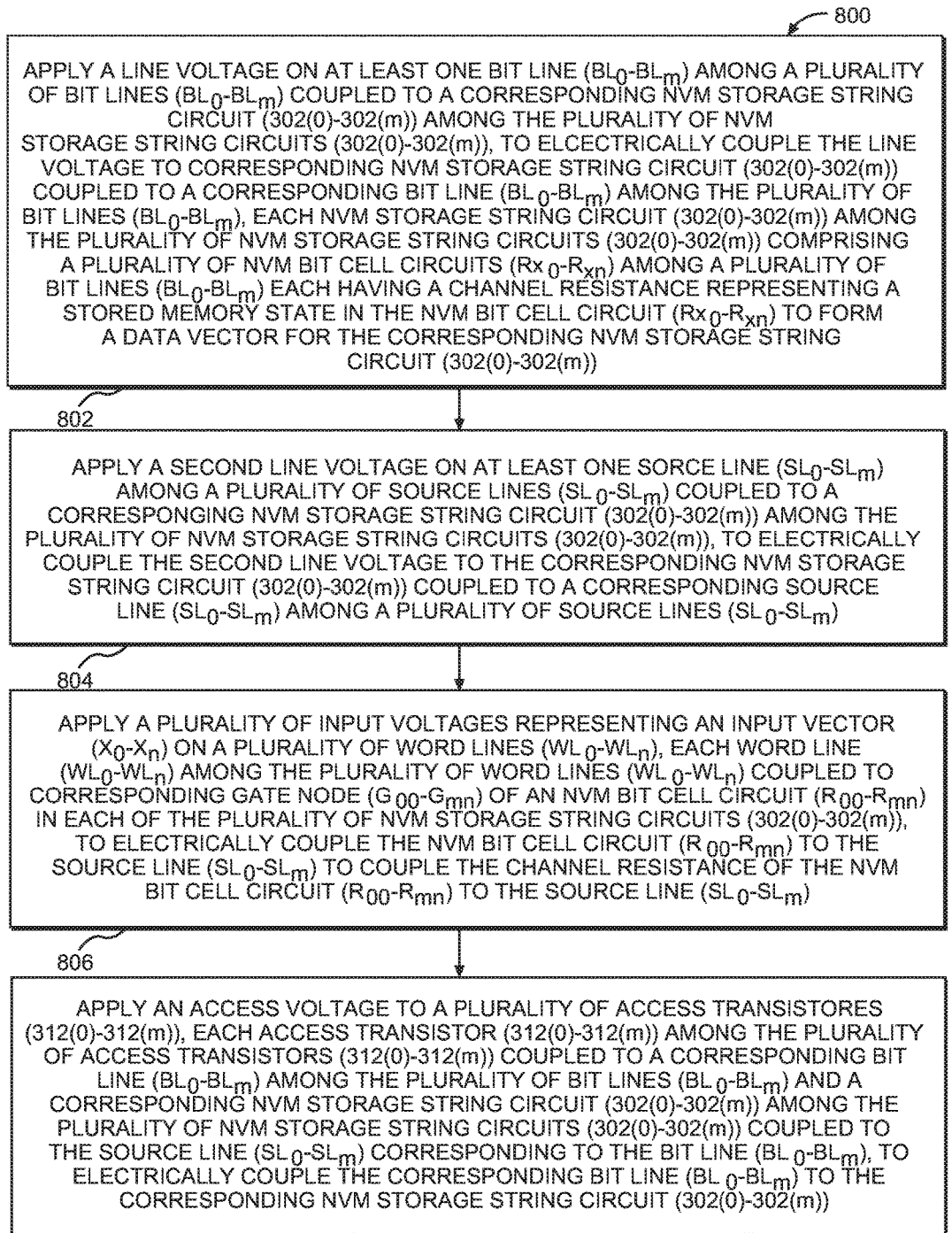
FIG. 8A is a flowchart illustrating an exemplary process of performing a write operation in the NVM matrix circuit in FIG. 3A.
Figure 8B:
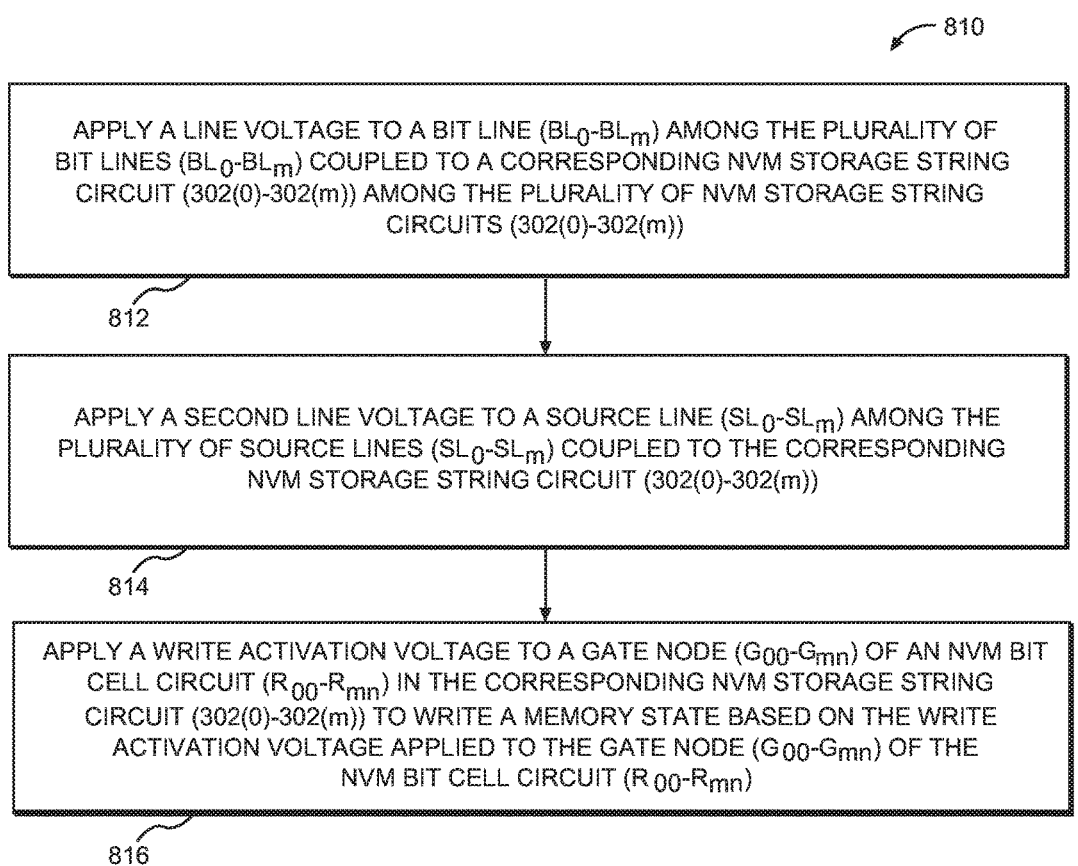
FIG. 8B is a flowchart illustrating an exemplary process of performing a read operation in the NVM matrix circuit in FIG. 3A.

FIG. 8A is a flowchart illustrating an exemplary process 800 of performing a read operation in the NVM matrix circuit 300 in FIG. 3A. Examples of read operations to the NVM matrix circuit 300 in FIG. 3A were discussed above with regard to FIGS. 6A-7B. In this regard, with reference to FIGS. 3A and 8A, the process 800 includes applying a line voltage on at least one bit line $BL_0$-$BL_m$ among a plurality of bit lines $BL_0$-$BL_m$ coupled to a corresponding NVM storage string circuit 302(0)-302(m) among the plurality of NVM storage string circuits 302(0)-302(m), to electrically couple the line voltage to the corresponding NVM storage string circuit 302(0)-302(m) coupled to a corresponding bit line $BL_0$-$BL_m$ among the plurality of bit lines $BL_0$-$BL_m$ (block 802 in FIG. 8A). Each of the plurality of NVM storage string circuits 302(0)-302(m) comprise a plurality of NVM bit cell circuits $R_{x0}$-$R_{xn}$ among a plurality of bit lines $BL_0$-$BL_m$ each having a channel resistance representing a stored memory state in the NVM bit cell circuit $R_{x0}$-$R_{xn}$ to form a data vector for the corresponding NVM storage string circuit 302(0)-302(m). The process 800 also involves applying a second line voltage on at least one source line $SL_0$-$SL_m$ among a plurality of source lines $SL_0$-$SL_m$ coupled to a corresponding NVM storage string circuit 302(0)-302(m) among the plurality of NVM storage string circuits 302(0)-302(m), to electrically couple a second line voltage to the corresponding NVM storage string circuit 302(0)-302(m) coupled to a corresponding source line $SL_0$-$SL_m$ among a plurality of source lines $SL_0$-$SL_m$ (block 804 in FIG. 8A). The process 800 also involves applying a plurality of input voltages representing an input vector $X_0$-$X_n$ on a plurality of word lines $WL_0$-$WL_n$, each word line $WL_0$-$WL_n$ among the plurality of word lines $WL_0$-$WL_n$ coupled to a corresponding gate node $G_{00}$-$G_{mn}$ of an NVM bit cell circuit $R_{00}$-$R_{mn}$ in each of the plurality of NVM storage string circuits 302(0)-302(m), to electrically couple the NVM bit cell circuit $R_{00}$-$R_{mn}$ to the source line $SL_0$-$SL_m$ to couple the channel resistance of the NVM bit cell circuit $R_{00}$-$R_{mn}$ to the source line $SL_0$-$SL_m$ (block 806 in FIG. 8A). The process 800 also involves applying an access voltage to a plurality of access transistors 312(0)-312(m), each access transistor 312(0)-312(m) among the plurality of access transistors 312(0)-312(m) coupled to a corresponding bit line $BL_0$-$BL_m$ among the plurality of bit lines $BL_0$-$BL_m$ and a corresponding NVM storage string circuit 302(0)-302(m) among the plurality of NVM storage string circuits 302(0)-302(m). The plurality of NVM storage string circuits 302(0)-302(m) are coupled to a respective source line $SL_0$-$SL_m$ corresponding to the bit line $BL_0$-$BL_m$, to electrically couple the corresponding bit line $BL_0$-$BL_m$ to the corresponding NVM storage string circuit 302(0)-302(m) (block 808 in FIG. 8A). FIG. 8B is a flowchart illustrating an exemplary process 810 of performing a read operation in the NVM matrix circuit 300 in FIG. 3A. Examples of write operations to the NVM matrix circuit 300 in FIG. 3A were discussed above with regard to FIGS. 5A and 5B. In this regard, with reference to FIGS. 3A and 8B, the process 810 includes applying a line voltage to a bit line $BL_0$-$BL_m$ among the plurality of bit lines $BL_0$-$BL_m$ coupled to a corresponding NVM storage string circuit 302(0)-302(m) among the plurality of NVM storage string circuits 302(0)-302(m) (block 812 in FIG. 8B). The process 810 also involves applying a second line voltage to a source line $SL_0$-$SL_m$ among the plurality of source lines $SL_0$-$SL_m$ coupled to the corresponding NVM storage string circuit 302(0)-302(m) (block 814 in FIG. 8B). The process 810 also involves applying a write activation voltage to a gate node $G_{00}$-$G_{mn}$ of an NVM bit cell circuit $R_{00}$-$R_{mn}$ in the corresponding NVM storage string circuit 302(0)-302(m) to write a memory state based on the write activation voltage applied to the gate node $G_{00}$-$G_{mn}$ of the NVM bit cell circuit $R_{00}$-$R_{mn}$ (block 816 in FIG. 8B).

Figure 9:
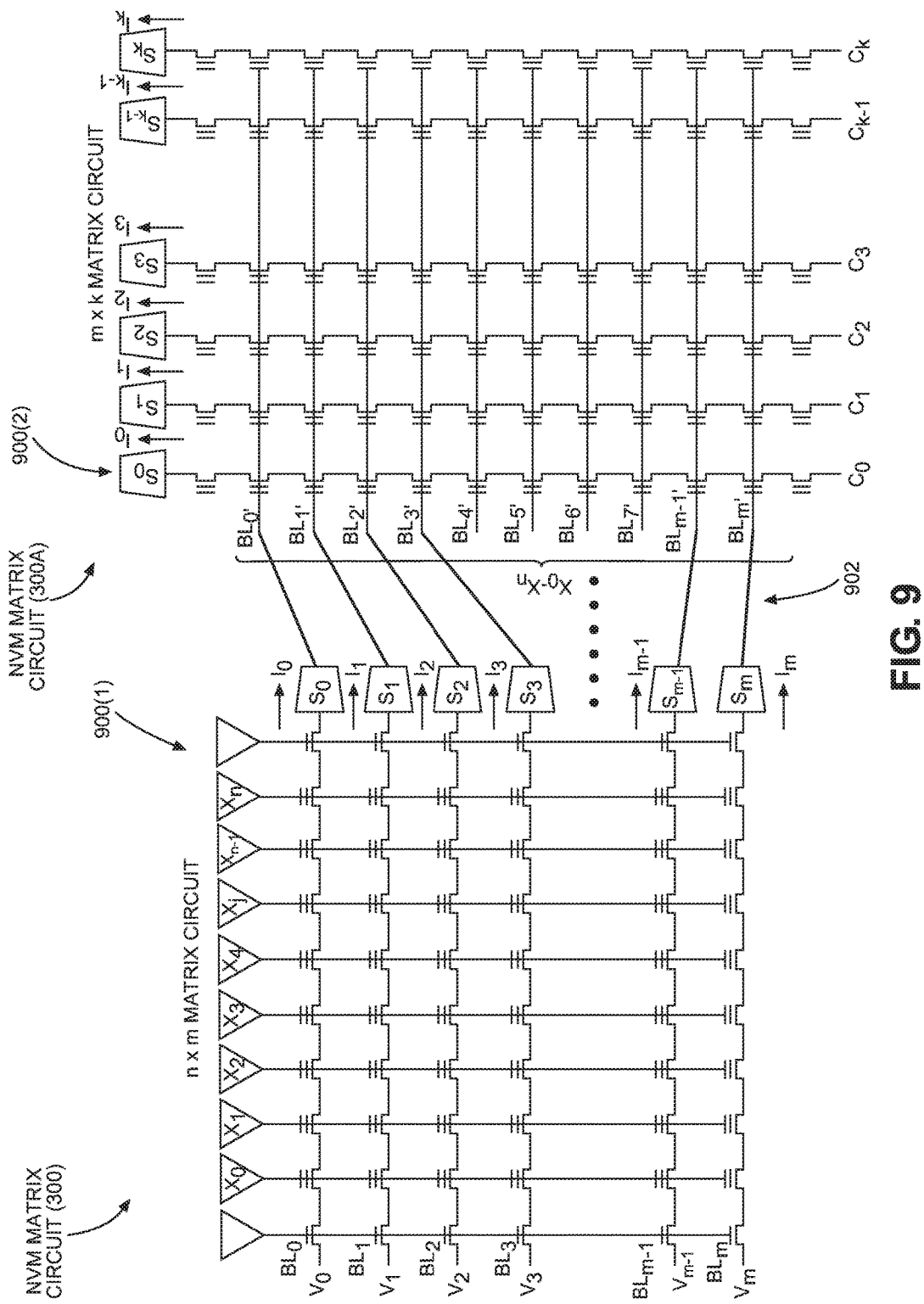
FIG. 9 is an example of the NVM matrix system that includes the NVM matrix circuit in FIG. 3A and another NVM matrix circuit like the NVM matrix circuit in FIG. 3A being configured and/or reconfigured and coupled to the first NVM matrix circuit to provide neuron layers for a synapse NVM matrix circuit.

The NVM matrix circuit 300 in FIG. 3A can also be employed and reconfigured to provide reconfigured neuron paths to support universal deep learning or artificial intelligence (AI) tasks for different neuron layers and neurons. In this regard, FIG. 9 is an example of an NVM matrix system that includes an NVM matrix circuit 300 in FIG. 3A being configured as an n×m NVM matrix circuit 300 like shown in FIG. 3A. Another NVM matrix circuit 300A is provided that is similar to the NVM matrix circuit 300, but is configured as an m×k NVM matrix circuit. The NVM matrix circuits 300, 300A can be coupled together to form first and second respective neuron layers 900(1), 900(2) with output vectors $S_0$-$S_m$ providing intermediate neurons 902. This allows a dot product output vector $S_0$-$S_m$ as a result of the matrix calculation of n×m NVM matrix circuit 300 to be used as an input vector $X_0$-$X_m$ to the NVM matrix circuit 300A to produce dot produce output vectors $S_0$-$S_k$. Thus, the NVM matrix circuit 300 being coupled to the other NVM matrix circuit 300A is configured to produce currents $I_0$-$I_k$ on a hidden layer according to the following formula:

$$I_l = V_{BL} \Big/ \sum_h R_{hl}$$

where:
h=memory row 0 to m;
l=memory column 0 to k;
$V_{BL}$=voltage of bit lines $BL_0'$-$BL_m'$; and
$R_{hl}$=channel resistances of an NVM bit cell circuit in the NVM matrix circuit 300A.

The operation of the matrix calculations and write operations that can be performed in the NVM matrix circuits 300, 300A in FIG. 9 can be as previously described for the NVM matrix circuit 300.

Figure 10:
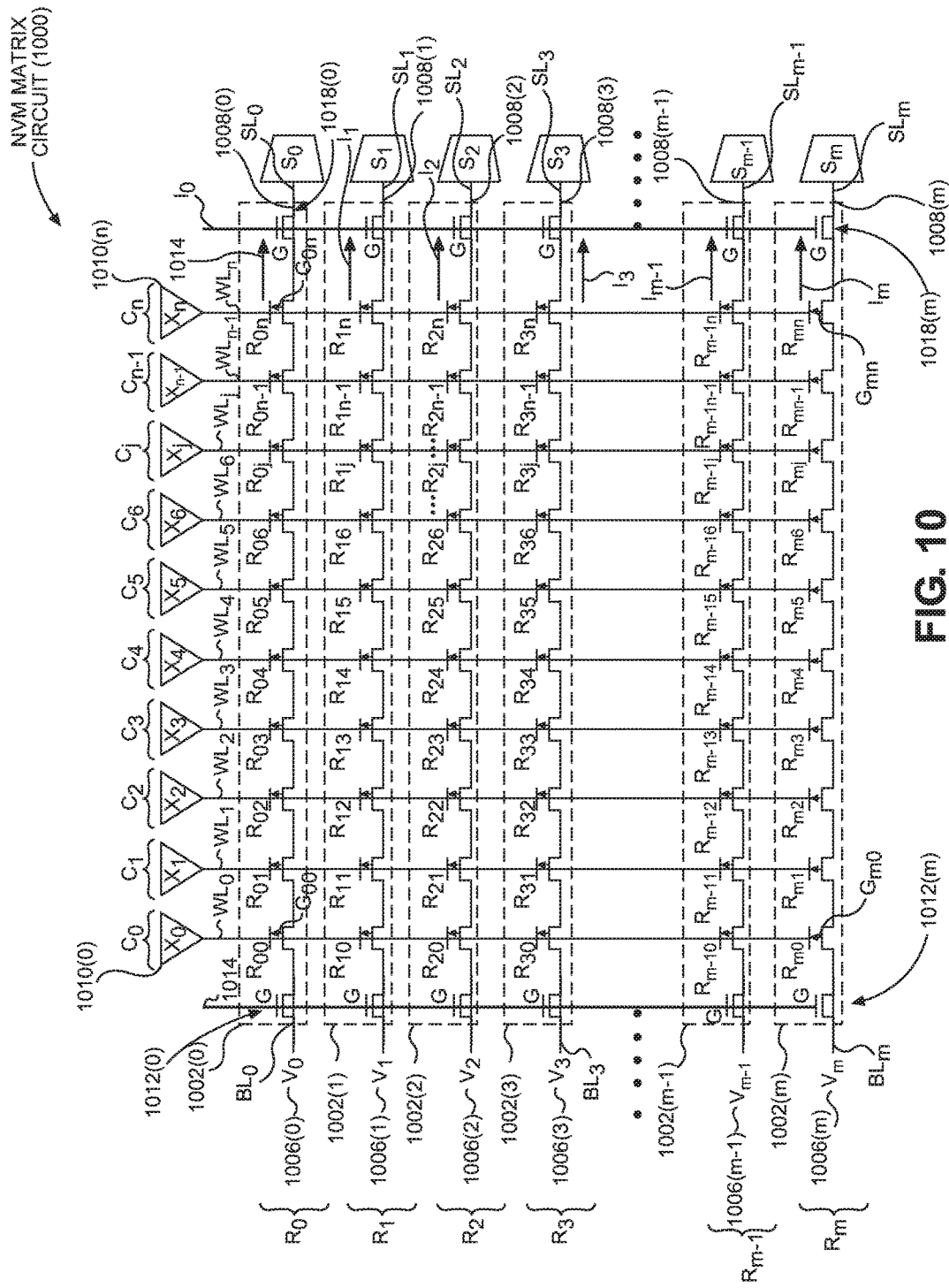
FIG. 10 is a schematic diagram of an exemplary NVM matrix circuit without need for cross-bar connections employing NVM storage string circuits in the form of NAND NVM ferroelectric (Fe) Field-Effect Transistor (FET) (FeFET) circuits each comprising a plurality of NVM FeFET bit cell circuits for performing matrix computations.

Other types of NVM bit cell circuits can be employed besides NAND NVM flash memory circuits like shown in the NVM matrix circuit 300 in FIG. 3A. For example, FIG. 10 is a schematic diagram of another exemplary NVM matrix circuit 1000 without need for cross-bar connections between bit lines and word lines like not included the NVM matrix circuit 300 in FIG. 3A. However, the NVM matrix circuit 1000 includes NVM storage string circuits 1002(0)-1002(m) in the form of NAND NVM ferroelectric (Fe) Field-Effect Transistor (FET) (FeFET) circuits in this example. The NVM bit cell circuits $R_{00}$-$R_{mn}$ in each respective NVM storage string circuits 1002(0)-1002(m) are NVM FeFET circuits arranged in memory rows $R_0$-$R_m$ and memory columns $C_0$-$C_n$. The NVM matrix circuit 1000 includes a respective bit line $BL_0$-$BL_m$ for each memory row $R_0$-$R_m$. Bit line driver circuits 1006(0)-1006(m) are provided that are each configured to drive a respective line voltage $V_0$-$V_m$ on the respective bit lines $BL_0$-$BL_m$. Source lines $SL_0$-$SL_m$ are also provided that are each coupled to a respective output node 1008(0)-1008(m). The NVM storage string circuits 1002(0)-1002(m) are coupled between a corresponding bit line $BL_0$-$BL_m$ and a corresponding source lines $SL_0$-$SL_m$ in each respective memory row $R_0$-$R_m$. The source lines $SL_0$-$SL_m$ are configured to carry a respective current $I_0$-$I_m$ to the respective output nodes 1008(0)-1008(m) as an output vector when their respective NVM bit cell circuits $R_{00}$-$R_{mn}$ are activated. For example, the output vector may be a binary post-synapse vector.

With continuing reference to FIG. 10, the NVM matrix circuit 1000 also includes a respective word line $WL_0$-$WL_n$ for each memory column $C_0$-$C_n$. Word line driver circuits 1010(0)-1010(n) are provided that are each configured to drive a respective input vector $X_0$-$X_n$ comprising a plurality of input voltages on the respective word lines $WL_0$-$WL_n$. For example, the input vector $X_0$-$X_n$ may be a binary pre-synapse data vector. The NVM matrix circuit 1000 also includes first access transistors 1012(0)-1012(m) coupled between a respective bit line $BL_0$-$BL_m$ and an NVM storage string circuit 1002(0)-1002(m). The first access transistors 1012(0)-1012(m) each comprise a first access gate node G coupled to a respective first access line 1014 configured to be driven with a first access voltage by a first access line driver circuit 1016. The first access transistors 1012(0)-1012(m) are each configured to control whether a corresponding line voltage $V_0$-$V_m$ applied on a respective bit line $BL_0$-$BL_m$ is applied to a respective NVM storage string circuit 1002(0)-1002(m) in a corresponding memory row $R_0$-$R_m$. The first access transistors 1012(0)-1012(m) are configured to pass a line voltage $V_0$-$V_m$ on respective bit lines $BL_0$-$BL_m$ in response to a first access signal (voltage) driven by the first access line driver circuit 1016 onto a second access line 1020 to the first access gate node G of the first access transistors 1012(0)-1012(m) sufficient to turn on the first access transistors 1012(0)-1012(m). The NVM matrix circuit 1000 also includes second access transistors 1018(0)-1018(m) coupled between a respective NVM storage string circuit 1002(0)-1002(m) and a source line $SL_0$-$SL_m$ coupled to the output nodes 1008(0)-1008(n). The second access transistors 1018(0)-1018(m) are each configured to couple a respective NVM storage string circuit 1002(0)-1002(m) to a respective source line $SL_0$-$SL_m$ and a respective output node 1008(0)-1008(m) in response to a second access signal (voltage) driven by a second access line driver circuit 1022 onto the second access line 1020 to the second access gate node G of the second access transistors 1018(0)-1018(m) sufficient to turn on the second access transistors 1018(0)-1018(m). As shown in FIG. 10, there is no cross-bar coupling between the word lines $WL_0$-$WL_n$ and the bit lines $BL_0$-$BL_m$. The access transistors 1012(0)-1012(m), 1018(0)-1018(m) of the NVM storage string circuits 1002(0)-1002(m) provide isolation between the word lines $WL_0$-$WL_n$ and the bit lines $BL_0$-$BL_m$.

With continuing reference to FIG. 10, each NVM bit cell circuit $R_{00}$-$R_{mn}$ in the NVM matrix circuit 1000 is an NVM FeFET circuit that does not need power to retain data in this example. The NVM bit cell circuits $R_{00}$-$R_{mn}$ in this example are each coupled to each other in a series-coupled, string fashion. Using the NVM storage string circuit 1002(0) in memory row $R_0$ as an example, source nodes of the NVM bit cell circuits $R_{00}$-$R_{n-1}$ are coupled to the drain nodes of an adjacent NVM bit cell circuit $R_{01}$-$R_{0n}$. The end NVM bit cell circuits $R_{00}$, $R_{0n}$ in the NVM storage string circuit 1002(0) are coupled to respective access transistors 1012(0), 1018(0). Each NVM bit cell circuit $R_{00}$-$R_{0n}$ has a resistance representing a stored memory state. Each NVM bit cell circuit $R_{00}$-$R_{mn}$ has a transistor comprising a gate $G_{00}$-$G_{0n}$ that is coupled to a respective word line $WL_0$-$WL_n$ based on in which memory column $C_0$-$C_n$ the NVM bit cell circuit $R_{00}$-$R_{mn}$ is located. Each NVM bit cell circuit $R_{00}$-$R_{mn}$ is configured to be activated to activate a semiconductor channel to couple its resistance on a respective source line $SL_0$-$SL_m$ in its memory row $R_0$-$R_m$. The collective memory states in the NVM bit cell circuits $R_{00}$-$R_{0n}$ form a data vector stored in the NVM storage string circuit 1002(0). As shown in FIG. 10, there is no cross-bar coupling between the word line $WL_0$ and the bit line $BL_0$, which is also true between all word lines $WL_0$-$WL_n$ and the respective bit lines $BL_0$-$BL_m$.

With continuing reference to FIG. 10, when a line voltage is applied to bit line $BL_0$ and access voltages are applied to the access gate nodes G of the access transistors 1012(0)-1012(m) sufficient to activate the semiconductor channels C of the access transistors 1012(0)-1012(m), the NVM storage string circuit 1002(0) is coupled to the bit line $BL_0$ and the source line $SL_0$. The input voltages as an input vector $X_0$-$X_n$ applied to the word lines $WL_0$-$WL_n$ and the gate nodes $G_{00}$-$G_{0n}$ as an input vector $X_0$-$X_n$ control activation of the respective NVM bit cell circuits $R_{00}$-$R_{0n}$. When activated, the NVM bit cell circuits $R_{00}$-$R_{0n}$ couple their resistances to the source line $SL_0$. The resistances of the NVM bit cell circuits $R_{00}$-$R_{0n}$ are a function of their stored memory states. Thus, the resistances of the NVM bit cell circuits $R_{00}$-$R_{0n}$ can represent a weight vector. The current $I_0$ flowing on a respective source line $SL_0$ to the output node 1008(0) is a function of the sum of the dot product multiplications of the respective input vector $X_0$-$X_n$ multiplied by the corresponding memory states in the NVM bit cell circuits $R_{00}$-$R_{0n}$ of the NVM storage string circuit 1002(0). Thus, with reference to FIG. 10, all the NVM bit cell circuits $R_{00}$-$R_{0n}$ for the NVM storage string circuits 1002(0)-1002(m) in the NVM matrix circuit 1000 in FIG. 10 can represent a weight matrix. The current $I_0$-$I_m$ flowing from the respective source lines $SL_0$-$SL_m$ of the respective NVM storage string circuits 1002(0)-1002(m) to output nodes 1008(0)-1008(m) is a function of the respective line voltages $V_0$-$V_m$ driven by the bit line driver circuits 1006(0)-1006(m) on the respective source lines $SL_0$-$SL_m$ divided by the summed channel resistances of the NVM bit cell circuits $R_{00}$-$R_{mn}$ of the NVM storage string circuits 1002(0)-1002(m). The currents $I_0$-$I_m$ may be analog representations of a summation of the dot product multiplications which can be converted to binary values. In other words, the NVM matrix circuit 1000 in FIG. 10 is configured to produce currents $I_0$-$I_m$ on an input layer according to the following formula:

$$I_i = V_{BL} \Big/ \sum_j R_{ij}$$

where:
  i=memory row 0 to m;
  j=memory column 0 to n;
  $V_{BL}$=voltage $V_i$; and
  $R_{ij}$=channel resistance of an NVM bit cell circuit.

Thus, with continuing reference to FIG. 10, the NVM matrix circuit 1000 is configured to perform matrix multiplication of each of the 1×n weight vectors stored as respective memory states in each of the NVM storage string circuits 1002(0)-1002(m) by the n×1 input vector $X_0$-$X_n$ simultaneously. The summed dot product multiplications of these vector multiplications are provided as a function of these respective amplitudes of the currents $I_0$-$I_m$ generated at the output nodes 1008(0)-1008(m) according to the current formula provided above.

Further, if the word lines $WL_0$-$WL_m$ are coupled to a pre-neuron layer and the output nodes 1008(0)-1008(m) are coupled to a post-neuron layer, the NVM matrix circuit 1000 is also configured to train the channel resistance of the NVM bit cell circuits $R_{00}$-$R_{mn}$ by supporting backwards propagation of a weight update according to the following formula:

$$\Delta R_{ij} = \eta \cdot S_{post,i} \cdot S_{post+1,j}$$

where:
  $R_{ij}$=channel resistance of an NVM bit cell circuit; and
  S=value at source lines of NVM bit cell circuits.

The weight matrix of the NVM matrix circuit 1000 provided as stored memory states in the NVM bit cell circuits $R_{00}$-$R_{mn}$ can be set to the desired memory states in a write operation to provide the desired weight matrix. The write and read operations previously described for the NVM matrix circuit 300 in FIG. 3A can be applied to the NVM matrix circuit 1000 in FIG. 10.

Figure 11:
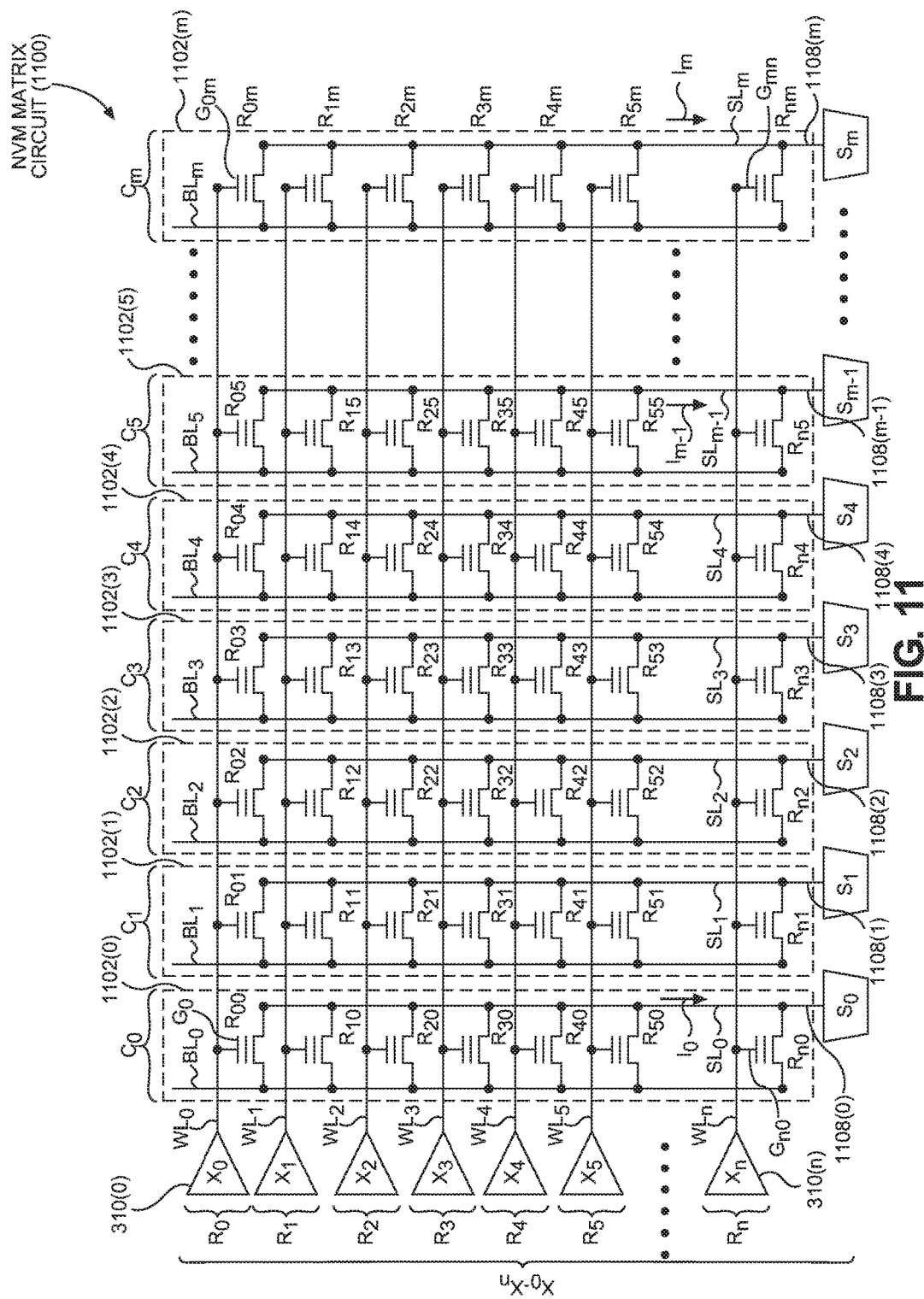
FIG. 11 is a schematic diagram of an exemplary NVM matrix circuit without need for cross-bar connections employing NVM storage string circuits in the form of AND NVM flash circuits each comprised of a plurality of NVM flash bit cell circuits for performing matrix computations.

FIG. 11 illustrates an NVM matrix circuit 1100 that is a reconfiguration of the NVM matrix circuit 300 in FIG. 3A into an n×m matrix by switching the memory rows and columns to have memory rows $R_0$-$R_n$ and memory columns $C_0$-$C_m$. The NVM matrix circuit 1100 includes NVM storage string circuits 1102(0)-1102(m) in the form of AND NVM flash circuits in this example, which are provided in respective memory columns $C_0$-$C_m$ to provide NVM bit cell circuits $R_{00}$-$R_{nm}$. Thus, each NVM bit cell circuit $R_{00}$-$R_{nm}$ is an NVM flash circuit. The word lines $WL_0$-$WL_n$ and bit lines $BL_0$-$BL_m$ are reversed between memory rows $R_0$-$R_n$ and columns $C_0$-$C_m$ from the NVM matrix circuit 300 in FIG. 3A, but are still coupled to the NVM bit cell circuits $R_{00}$-$R_{nm}$ in the same manner as in the NVM matrix circuit 300 in FIG. 3A. In this regard, as shown in FIG. 11, word lines $WL_0$-$WL_n$ that receive input vector $X_0$-$X_n$ in the form of input voltages are provided for each memory row $R_0$-$R_n$. The bit lines $BL_0$-$BL_m$ are provided for each memory column $C_0$-$C_m$. Common components between the NVM matrix circuit 300 in FIG. 3A and the NVM matrix circuit 1100 in FIG. 11 are shown with common element numbers and thus will not be re-described. Read and write operations similar to that described above with regard to the NVM matrix circuit 300 can be performed in the NVM matrix circuit 1100 in FIG. 11.

Each NVM bit cell circuit $R_{00}$-$R_{nm}$ has a channel resistance representing a stored memory state. The channel resistances of the NVM bit cell circuits $R_{00}$-$R_{nm}$ represent a weight matrix. Each NVM bit cell circuit $R_{00}$-$R_{nm}$ has a transistor comprising a gate node $G_{00}$-$G_{nm}$ that is coupled to a respective word line $WL_0$-$WL_n$ based on in which memory row $R_0$-$R_n$ the NVM bit cell circuit $R_{00}$-$R_{nm}$ is located. Each NVM bit cell circuit $R_{00}$-$R_{nm}$ is configured to activate its semiconductor channel to couple its channel resistance (i.e., conductance) between the respective bit lines $BL_0$-$BL_m$ the respective source line $SL_0$-$SL_m$ in parallel with other activated NVM bit cell circuits $R_{00}$-$R_{nm}$ in the same memory column $C_0$-$C_m$. Current $I_0$-$I_m$ flows from a respective source line $SL_0$-$SL_m$ to output nodes 1108(0)-1108(m) as a function of the respective line voltage $V_0$-$V_m$ driven by the bit line driver circuit 1006(0)-1006(m) to the NVM bit cell circuits $R_{00}$-$R_{nm}$ in their respective memory column $C_0$-$C_m$ divided by the parallel channel resistances of the NVM bit cell circuits $R_{00}$-$R_{nm}$ in a respective memory column $C_0$-$C_m$. As shown in FIG. 11, each NVM bit cell circuit $R_{00}$-$R_{nm}$ in an NVM storage string circuit 1102(0)-1102(m) comprises a source node (or drain node) coupled to a corresponding bit line $BL_0$-$BL_m$ and a drain node (or source node) coupled to a corresponding source line $SL_0$-$SL_m$ to be configured to be coupled in parallel with other NVM bit cell circuits $R_{00}$-$R_{nm}$ in a respective memory column $C_0$-$C_m$. Thus, for example, current $I_0$ flowing on a respective source line $SL_0$ to the output node 1008(0) is a function of the sum of the dot products, meaning a respective input vector $X_0$-$X_n$ multiplied by the corresponding memory states in the NVM bit cell circuits $R_{00}$-$R_{0n}$ in their respective, corresponding memory column $C_0$-$C_m$. The currents $I_0$-$I_m$ may be analog representations of a summation of the dot product multiplications which can be converted to binary values. In other words, the NVM matrix circuit 1100 is configured to produce currents $I_0$-$I_m$ on an input layer according to the following formula:

$$I_i = \sum_j V_{BL}/R_{ij}$$

where:
  i=memory column 0 to m;
  j=memory row 0 to n;
  $V_{BL}$=voltage $V_i$; and
  $R_{ij}$=channel resistance of an NVM bit cell circuit.

If the word lines $WL_0$-$WL_m$ are coupled to a pre-neuron layer and the output nodes 1108(0)-1108(m) are coupled to a post-neuron layer, the NVM matrix circuit 1100 is also configured to train the channel resistance of the NVM bit cell circuits $R_{00}$-$R_{mn}$ by supporting backwards propagation of a weight update according to the following formula:

$$\Delta R_{ij} = \eta \cdot S_{post,i} \cdot S_{post+1,j}$$

where:
  $R_{ij}$=channel resistance of an NVM bit cell circuit; and
  S=value at source lines of NVM storage string circuits.

Figure 12:
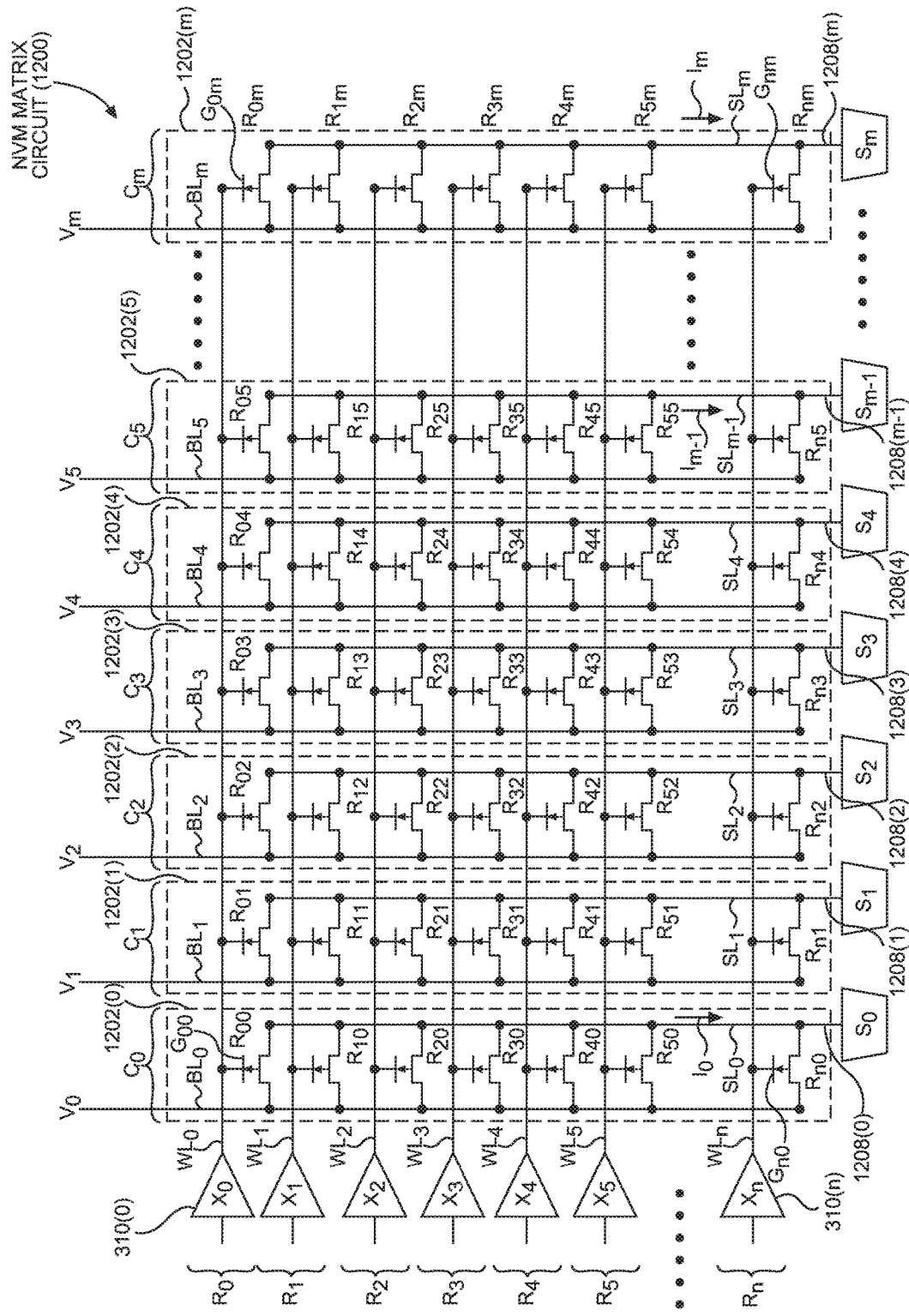
FIG. 12 is a schematic diagram of an exemplary NVM matrix circuit without need for cross-bar connections employing NVM storage string circuits in the form of AND NVM FeFET circuits each comprised of a plurality of NVM FeFET bit cell circuits for performing matrix computations.

FIG. 12 illustrates an NVM matrix circuit 1200 that is a reconfiguration of the NVM matrix circuit 300 in FIG. 3A into an n×m matrix by switching the memory rows and columns to have memory rows $R_0$-$R_n$ and memory columns $C_0$-$C_m$. The NVM matrix circuit 1200 includes NVM storage string circuits 1202(0)-1202(m) in the form of AND NVM FeFET circuits in this example, which are provided in respective memory columns $C_0$-$C_m$ to provide NVM bit cell circuits $R_{00}$-$R_{nm}$. Thus, each NVM bit cell circuit $R_{00}$-$R_{nm}$ is an NVM FeFET circuit. The word lines $WL_0$-$WL_n$ and bit lines $BL_0$-$BL_m$ are reversed between memory rows $R_0$-$R_n$ and columns $C_0$-$C_m$ from the NVM matrix circuit 300 in FIG. 3A, but are still coupled to the NVM bit cell circuits $R_{00}$-$R_{nm}$ in the same manner as in the NVM matrix circuit 300 in FIG. 3A. In this regard, as shown in FIG. 12, word lines $WL_0$-$WL_n$ that receive input vector $X_0$-$X_n$ in the form of input voltages are provided for each memory row $R_0$-$R_n$. The bit lines $BL_0$-$BL_m$ are provided for each memory column $C_0$-$C_m$. Common components between the NVM matrix circuit 300 in FIG. 3A and the NVM matrix circuit 1200 in FIG. 12 are shown with common element numbers and thus will not be re-described. Read and write operations similar to that described above with regard to the NVM matrix circuit 300 can be performed in the NVM matrix circuit 1200 in FIG. 12.

Each NVM bit cell circuit $R_{00}$-$R_{nm}$ has a channel resistance representing a stored memory state. The channel resistances of the NVM bit cell circuits $R_{00}$-$R_{nm}$ represent a weight matrix. Each NVM bit cell circuit $R_{00}$-$R_{nm}$ has a transistor comprising a gate node $G_{00}$-$G_{nm}$ that is coupled to a respective word line $WL_0$-$WL_n$ based on in which memory row $R_0$-$R_n$ the NVM bit cell circuit $R_{00}$-$R_{nm}$ is located. Each NVM bit cell circuit $R_{00}$-$R_{nm}$ is configured to activate its semiconductor channel to couple its channel resistance (i.e., conductance) between the respective bit lines $BL_0$-$BL_m$ and the respective source lines $SL_0$-$SL_m$ in parallel with other activated NVM bit cell circuit $R_{00}$-$R_{nm}$ in the same memory column $C_0$-$C_m$. Current $I_0$-$I_m$ flows from a respective source line $SL_0$-$SL_m$ to output nodes 1208(0)-1208(m) as a function of the respective line voltage $V_0$-$V_m$ driven to the NVM bit cell circuits $R_{00}$-$R_{nm}$ in their respective memory column $C_0$-$C_m$ divided by the parallel channel resistances of the NVM bit cell circuits $R_{00}$-$R_{nm}$ in a respective memory column $C_0$-$C_m$. As shown in FIG. 12, each NVM bit cell circuit $R_{00}$-$R_{nm}$ in an NVM storage string circuit 1202(0)-1202(m) comprises a source node (or drain node) coupled to a corresponding bit line $BL_0$-$BL_m$ and a drain node (or source node) coupled to a corresponding source line $SL_0$-$SL_m$ to be configured to be coupled in parallel with other NVM bit cell circuits $R_{00}$-$R_{nm}$ in a respective memory column $C_0$-$C_m$. Thus, for example, current $I_0$ flowing on a respective source line $SL_0$ to the output node 1208(0) is a function of the sum of the dot product multiplications, meaning a respective input vector $X_0$-$X_n$ multiplied by the corresponding memory states in NVM bit cell circuits $R_{00}$-$R_{0n}$ in their respective, corresponding memory column $C_0$-$C_m$. The currents $I_0$-$I_m$ may be analog representations of a summation of the dot product multiplications which can be converted to binary values. In other words, the NVM matrix circuit 1200 is configured to produce currents $I_0$-$I_m$ on an input layer according to the following formula:

$$I_i = \sum_j V_{BL}/R_{ij}$$

where:
  i=memory column 0 to m;
  j=memory row 0 to n;
  $V_{BL}$=voltage $V_i$; and
  $R_{ij}$=channel resistance of an NVM bit cell circuit.

If the word lines $WL_0$-$WL_m$ are coupled to a pre-neuron layer and the output nodes 1208(0)-1208(m) are coupled to a post-neuron layer, the NVM matrix circuit 1200 is also configured to train the channel resistance of the NVM bit cell circuits $R_{00}$-$R_{nm}$ by supporting backwards propagation of a weight update according to the following formula:

$$\Delta R_{ij} = \eta \cdot S_{post,i} \cdot S_{post+1,j}$$

where:
  $R_{ij}$=channel resistance of an NVM bit cell circuit; and
  S=value at source lines of NVM storage string circuits.

Figure 13:
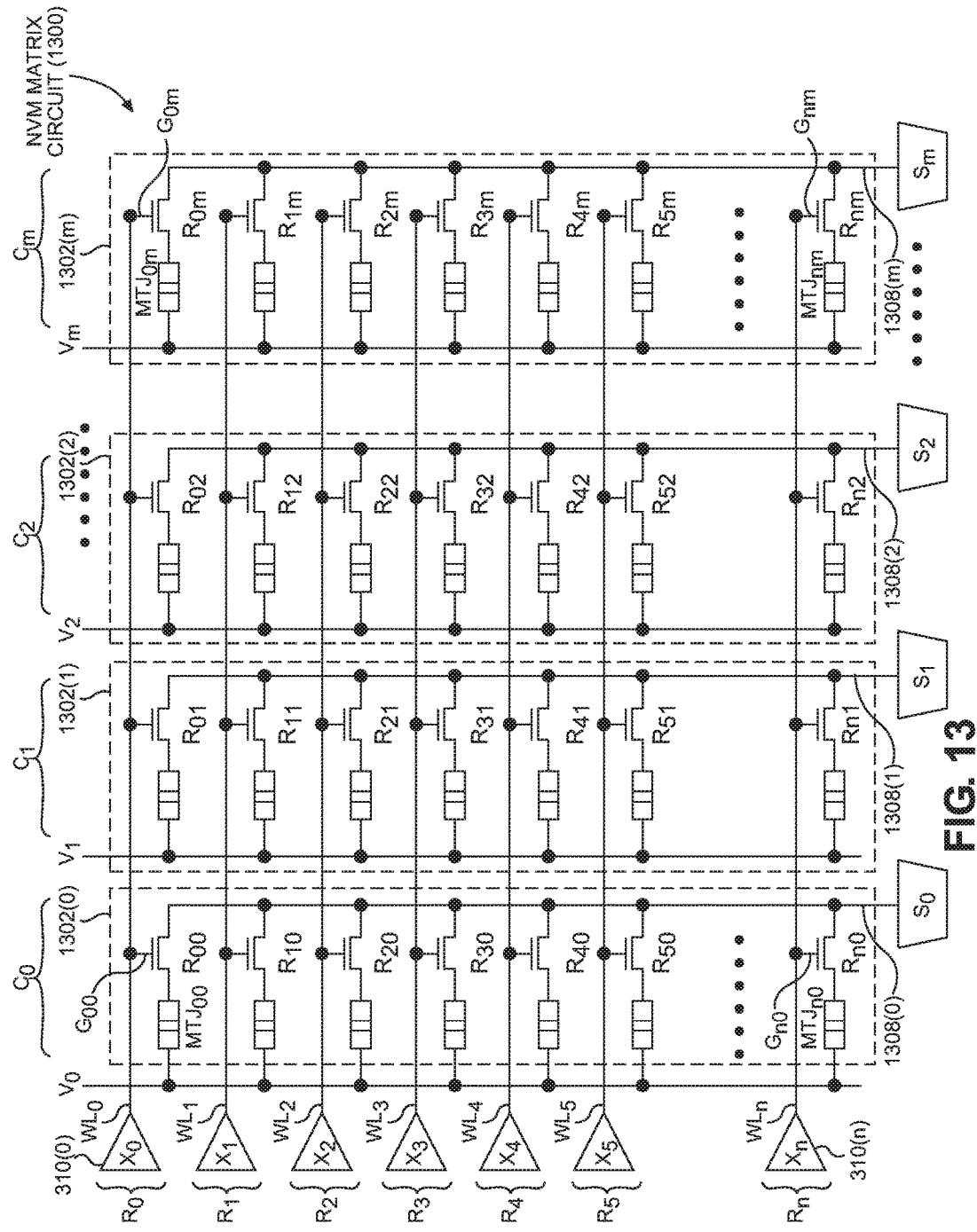
FIG. 13 is a schematic diagram of an exemplary NVM matrix circuit without need for cross-bar connections employing NVM storage string circuits in the form of AND NVM magneto-resistive random access memory (MRAM) circuits each comprised of a plurality of NVM MRAM bit cell circuits for performing matrix computations.

FIG. 13 illustrates an NVM matrix circuit 1300 that is also a reconfiguration of the NVM matrix circuit 300 in FIG. 3A into an n×m matrix by switching the memory rows and columns to have memory row $R_0$-$R_n$ and memory columns $C_0$-$C_m$. The NVM matrix circuit 1300 includes NVM storage string circuits 1302(0)-1302(m) in the form of AND NVM magneto-resistive random access memory (MRAM) circuits in this example, which are provided in respective memory columns $C_0$-$C_m$ to provide NVM bit cell circuits $R_{00}$-$R_{nm}$. Thus, each NVM bit cell circuit $R_{00}$-$R_{nm}$ is an NVM MRAM circuit. The word lines $WL_0$-$WL_n$ and bit lines $BL_0$-$BL_m$ are reversed between memory rows $R_0$-$R_n$ and columns $C_0$-$C_m$ from the NVM matrix circuit 300 in FIG. 3A, but are still coupled to the NVM bit cell circuits $R_{00}$-$R_{nm}$ in the same manner as in the NVM matrix circuit 300 in FIG. 3A. In this regard, as shown in FIG. 13, word lines $WL_0$-$WL_n$ that receive input vectors $X_0$-$X_n$ in the form of input voltages are provided for each memory row $R_0$-$R_n$. The bit lines $BL_0$-$BL_m$ are provided for each memory column $C_0$-$C_m$. Common components between the NVM matrix circuit 300 in FIG. 3A and the NVM matrix circuit 1300 in FIG. 13 are shown with common element numbers and thus will not be re-described. Read and write operations similar to that described above with regard to the NVM matrix circuit 300 can be performed in the NVM matrix circuit 1300 in FIG. 13.

Each NVM bit cell circuit $R_{00}$-$R_{nm}$ has a resistance representing a stored memory state. In this example, the resistances of the NVM bit cell circuits $R_{00}$-$R_{nm}$ are a function of whether a magnetic tunnel junction (MTJ) in the NVM bit cell circuits $R_{00}$-$R_{nm}$ are in a parallel (P) or anti-parallel (AP) magnetization state representing a memory state. The resistances of the NVM bit cell circuits $R_{00}$-$R_{nm}$ represent a weight matrix. Each NVM bit cell circuit $R_{00}$-$R_{nm}$ has a transistor comprising a gate node $G_{00}$-$G_{nm}$ that is coupled to a respective word line $WL_0$-$WL_n$ based on in which memory row $R_0$-$R_n$ the NVM bit cell circuit $R_{00}$-$R_{nm}$ is located. Each NVM bit cell circuit $R_{00}$-$R_{nm}$ is configured to activate its semiconductor channel to couple the MTJ resistance (i.e., conductance) between the respective bit lines $BL_0$-$BL_m$ and the respective source line $SL_0$-$SL_m$ in parallel with other activated NVM bit cell circuits $R_{00}$-$R_{nm}$ in the same memory column $C_0$-$C_m$. Current $I_0$-$I_m$ flows from a respective source line $SL_0$-$SL_M$ to output nodes 1308(0)-1308(m) as a function of the respective line voltage $V_0$-$V_m$ driven to the NVM bit cell circuits $R_{00}$-$R_{nm}$ in their respective memory column $C_0$-$C_m$ divided by the parallel channel resistances of the NVM bit cell circuits $R_{00}$-$R_{nm}$ in a respective memory column $C_0$-$C_m$. As shown in FIG. 13, each NVM bit cell circuit $R_{00}$-$R_{nm}$ in an NVM storage string circuit 1302(0)-1302(m) comprises a source node (or drain node) coupled to a corresponding bit line $BL_0$-$BL_m$ and a drain node (or source node) coupled to a corresponding source line $SL_0$-$SL_m$ to be configured to be coupled in parallel with other NVM bit cell circuits $R_{00}$-$R_{nm}$ in a respective memory column $C_0$-$C_m$. Thus for example, current $I_0$ flowing on a respective source line $SL_0$ to the output node 1308(0) is a function of the sum of the dot product multiplications, meaning a respective input vector $X_0$-$X_n$ is multiplied by the corresponding memory states in NVM bit cell circuits $R_{00}$-$R_{0n}$ in their respective, corresponding memory column $C_0$-$C_m$. The currents $I_0$-$I_m$ may be analog representations of a summation of the dot product multiplications which can be converted to binary values. In other words, the NVM matrix circuit 1300 is configured to produce currents $I_0$-$I_m$ on an input layer according to the following formula:

$$I_i = \sum_j V_{BL}/R_{ij}$$

where:
 i=memory column 0 to m;
 j=memory row 0 to n;
 $V_{BL}$=voltage $V_i$; and
 $R_{ij}$=channel resistance of an NVM bit cell circuit.

If the word lines $WL_0$-$WL_m$ are coupled to a pre-neuron layer and the output nodes 1308(0)-1308(m) are coupled to a post-neuron layer, the NVM matrix circuit 1300 is also configured to train the channel resistance of the NVM bit cell circuits $R_{00}$-$R_{mn}$ by supporting backwards propagation of a weight update according to the following formula:

$$\Delta R_{ij} = \eta \cdot S_{post,i} \cdot S_{post+1,j}$$

where:
 $R_{ij}$=channel resistance of an NVM bit cell circuit; and
 S=value at source lines of NVM storage string circuits.

Figure 14:
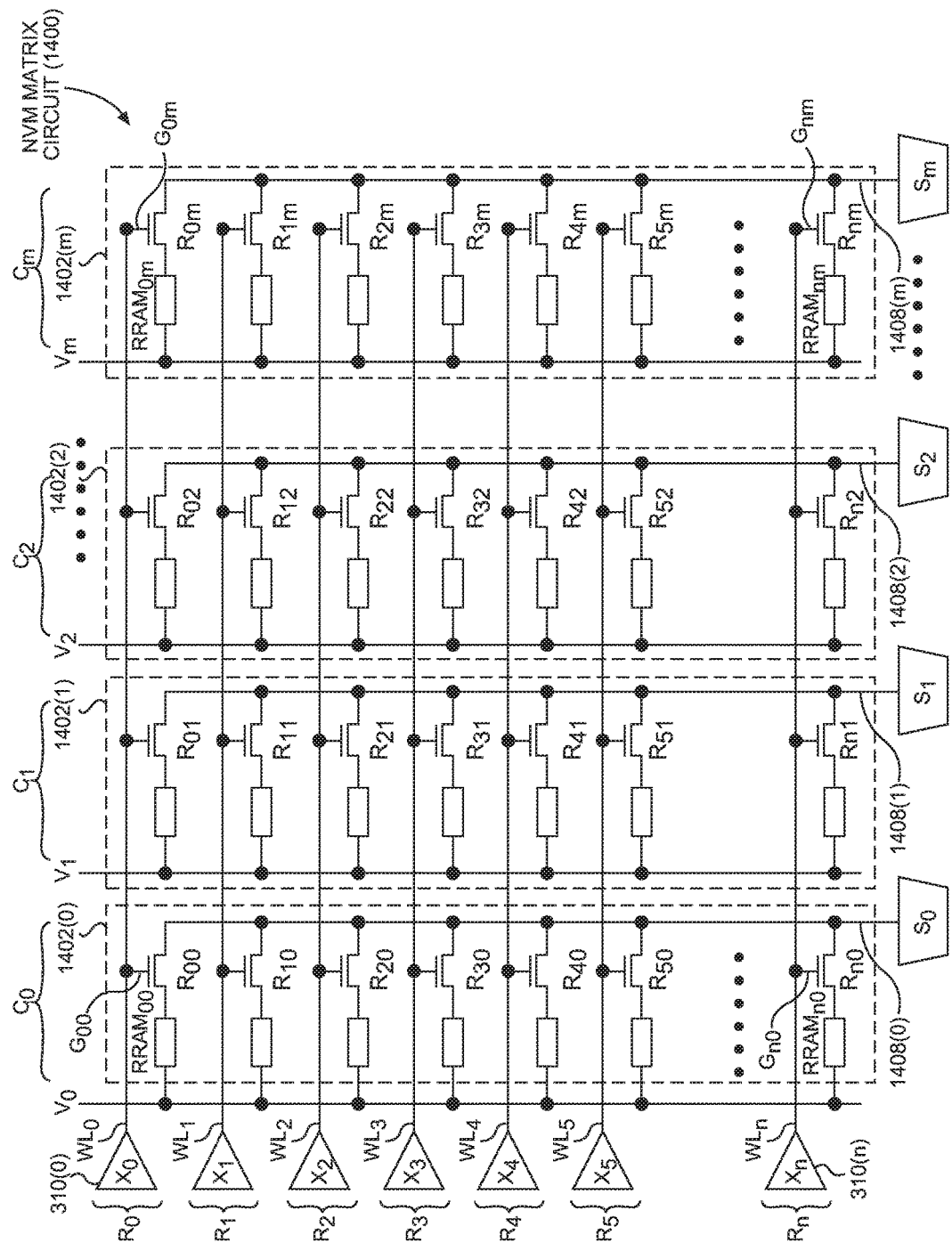
FIG. 14 is a schematic diagram of an exemplary NVM matrix circuit without need for cross-bar connections employing NVM storage string circuits in the form of AND NVM resistive random access memory (RRAM) circuits each comprised of a plurality of NVM RRAM bit cell circuits for performing matrix computations.

FIG. 14 illustrates another NVM matrix circuit 1400 that is also a reconfiguration of the NVM matrix circuit 300 in FIG. 3A into an n×m matrix by switching the memory rows and columns to have memory row $R_0$-$R_n$ and memory columns $C_0$-$C_m$. The NVM matrix circuit 1400 includes NVM storage string circuits 1402(0)-1402(m) in the form of AND NVM resistive random access memory (RRAM) circuits in this example, which are provided in respective memory columns $C_0$-$C_m$ to provide NVM bit cell circuits $R_{00}$-$R_{nm}$. Thus, each NVM bit cell circuit $R_{00}$-$R_{nm}$ is an NVM RRAM circuit. The word lines $WL_0$-$WL_n$ and bit lines $BL_0$-$BL_m$ are reversed between memory rows $R_0$-$R_n$ and columns $C_0$-$C_m$ from the NVM matrix circuit 300 in FIG. 3A, but are still coupled to the NVM bit cell circuits $R_{00}$-$R_{nm}$ in the same manner as in the NVM matrix circuit 300 in FIG. 3A. In this regard, as shown in FIG. 14, word lines $WL_0$-$WL_n$ that receive input vectors $X_0$-$X_n$ in the form of input voltages are provided for each memory row $R_0$-$R_n$. The bit lines $BL_0$-$BL_m$ are provided for each memory column $C_0$-$C_m$. Common components between the NVM matrix circuit 300 in FIG. 3A and the NVM matrix circuit 1400 in FIG. 14 are shown with common element numbers and thus will not be re-described. Read and write operations similar to that described above with regard to the NVM matrix circuit 300 can be performed in the NVM matrix circuit 1400 in FIG. 14.

Each NVM bit cell circuit $R_{00}$-$R_{nm}$ has a resistance representing a stored memory state. In this example, the resistances of the NVM bit cell circuits $R_{00}$-$R_{nm}$ are a function of the resistance of the NVM bit cell circuits $R_{00}$-$R_{nm}$ based on their memory state. The resistances of the NVM bit cell circuits $R_{00}$-$R_{nm}$ represent a weight matrix. Each NVM bit cell circuit $R_{00}$-$R_{nm}$ has a transistor comprising a gate node $G_{00}$-$G_{nm}$ that is coupled to a respective word line $WL_0$-$WL_n$ based on in which memory row $R_0$-$R_n$ the NVM bit cell circuit $R_{00}$-$R_{nm}$ is located. Each NVM bit cell circuit $R_{00}$-$R_{nm}$ is configured to activate its semiconductor channel to couple the MTJ resistance (i.e., conductance) between the respective bit lines $BL_0$-$BL_m$ and the respective source lines $SL_0$-$SL_m$ in parallel with other activated NVM bit cell circuit $R_{00}$-$R_{nm}$ in the same memory column $C_0$-$C_m$. Current $I_0$-$I_m$ flows from a respective source line $SL_0$-$SL_m$ to output nodes 1408(0)-1408(m) as a function of the respective line voltage $V_0$-$V_m$ driven to the NVM bit cell circuits $R_{00}$-$R_{nm}$ in their respective memory column $C_0$-$C_m$ divided by the parallel channel resistances of the NVM bit cell circuits $R_{00}$-$R_{nm}$ in a respective memory column $C_0$-$C_m$. As shown in FIG. 14, each NVM bit cell circuit $R_{00}$-$R_{nm}$ in an NVM storage string circuit 1402(0)-1402(m) comprises a source node (or drain node) coupled to a corresponding bit line $BL_0$-$BL_m$ and a drain node (or source node) coupled to a corresponding source line $SL_0$-$SL_m$ to be configured to be coupled in parallel with other NVM bit cell circuits $R_{00}$-$R_{nm}$ in a respective memory column $C_0$-$C_m$. Thus for example, current $I_0$ flowing on a respective source line $SL_0$ to the output node 1408(0) is a function of the sum of the dot product multiplications, meaning a respective input vector $X_0$-$X_n$ is multiplied by the corresponding memory states in NVM bit cell circuits $R_{00}$-$R_{0n}$ in their respective, corresponding memory column $C_0$-$C_m$. The currents $I_0$-$I_m$ may be analog representations of a summation of the dot product multiplications which can be converted to binary values. In other words, the NVM matrix circuit 1400 is configured to produce currents $I_0$-$I_m$ on an input layer according to the following formula:

$$I_j = \sum_i V_{BL}/R_{ij}$$

where:
  i=memory column 0 to m;
  j=memory row 0 to n;
  $V_{BL}$=voltage $V_i$; and
  $R_{ij}$=channel resistance of an NVM bit cell circuit.

If the word lines $WL_0$-$WL_m$ are coupled to a pre-neuron layer and the output nodes 1408(0)-1408(m) are coupled to a post-neuron layer, the NVM matrix circuit 1400 is also configured to train the channel resistance of the NVM bit cell circuits $R_{00}$-$R_{mn}$ by supporting backwards propagation of a weight update according to the following formula:

$$\Delta R_{ij} = \eta \cdot S_{post,i} \cdot S_{post+1,j}$$

where:
  $R_{ij}$=channel resistance of an NVM bit cell circuit; and
  S=value at source lines of NVM storage string circuits.

Figure 15:
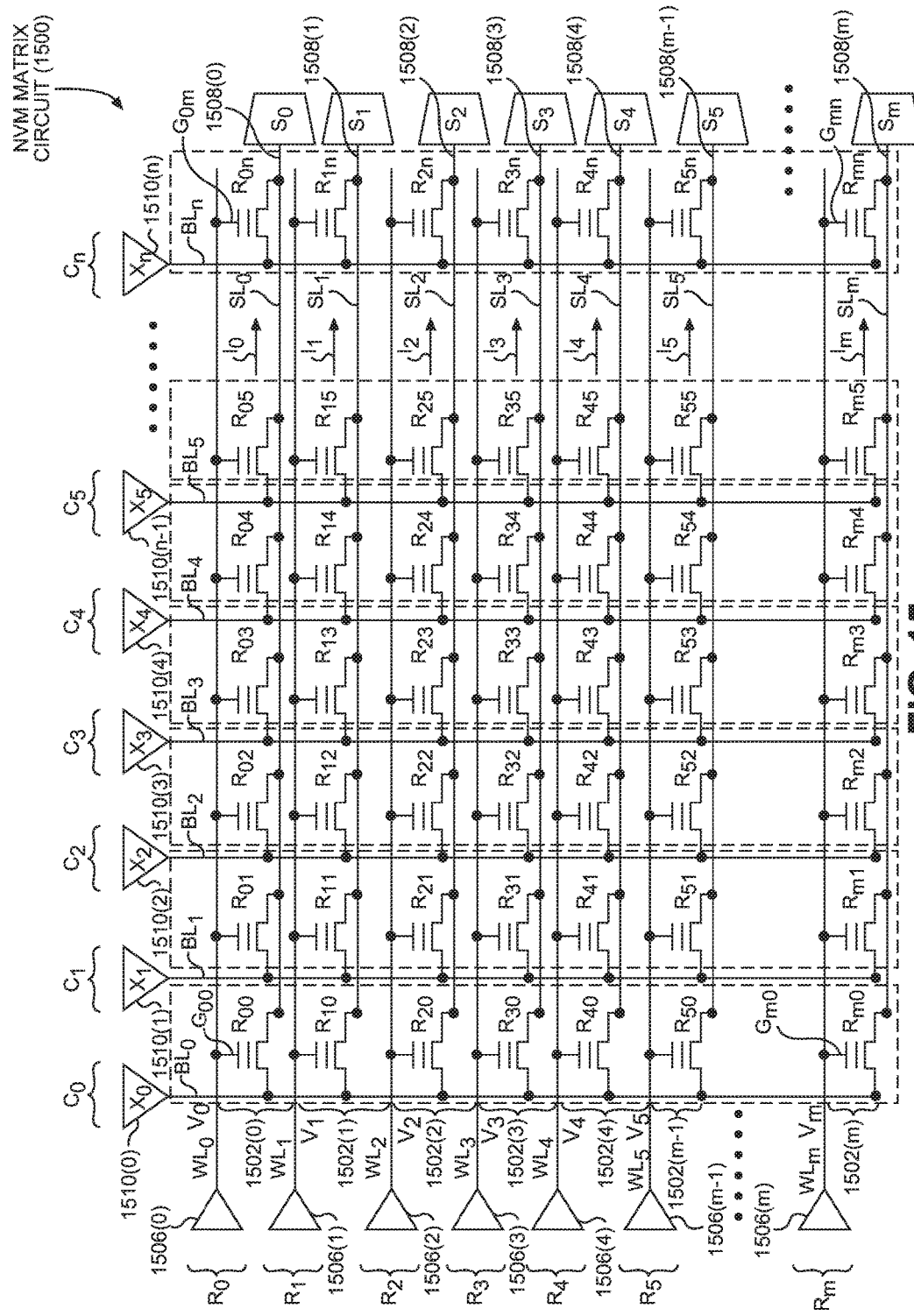
FIG. 15 is a schematic diagram of an exemplary NVM matrix circuit without need for cross-bar connections employing NVM storage string circuits in the form of NOR NVM flash circuits each comprised of a plurality of NVM flash bit cell circuits for performing matrix computations.

FIG. 15 is a schematic diagram of another exemplary NVM matrix circuit 1500 that can perform matrix multiplication without the use of cross-bar connections employing OR-based NVM storage string circuits 1502(0)-1502(m) provided as NOR NVM flash circuits in this example. In this manner, as discussed below, the summed channel conductances affect the currents $I_0$-$I_m$ to flow to output nodes 1508(0)-1508(m) representing dot product matrix multiplication calculations. In this regard, the NVM matrix circuit 1500 employs NVM storage string circuits 1502(0)-1502(m) in 'm+1' memory rows $R_0$-$R_m$ that each include a plurality of NVM bit cell circuits $R_{00}$-$R_{mn}$. Thus, the NVM bit cell circuits $R_{00}$-$R_{mn}$ are arranged in memory rows $R_0$-$R_m$ and memory columns $C_0$-$C_n$. The NVM matrix circuit 1500 includes a respective word line $WL_0$-$WL_m$ for each memory row $R_0$-$R_m$. Word line driver circuits 1506(0)-1506(m) are provided that are each configured to drive a respective voltage $V_0$-$V_m$ on the respective word lines $WL_0$-$WL_m$. Source lines $SL_0$-$SL_m$ for each NVM storage string circuit 1502(0)-1502(m) include respective output nodes 1508(0)-1508(m). The source lines $SL_0$-$SL_m$ are configured to provide a respective current $I_0$-$I_m$ to the respective output nodes 1508(0)-1508(m) to be provided as an output vector $S_0$-$S_m$. For example, the output vector $S_0$-$S_m$ may be a binary post-synapse vector. The NVM matrix circuit 1500 also includes a respective bit line $BL_0$-$BL_n$ for each memory column $C_0$-$C_n$ in this example. For example, the input vector $X_0$-$X_n$ may be a binary pre-synapse vector. Bit line driver circuits 1510(0)-1510(n) are provided that are each configured to drive a respective input vector $X_0$-$X_n$ in the form of input voltages on the respective bit lines $BL_0$-$BL_n$ in this example. Note however that alternatively, the word lines $WL_0$-$WL_m$ provided in the respective memory rows $R_0$-$R_m$ could be configured to receive the input vector X, and respective fixed voltages be applied to the bit lines $BL_0$-$BL_n$ in the respective memory columns $C_0$-$C_n$ with the respective voltages $V_0$-$V_m$ applied.

With continuing reference to FIG. 15, each NVM bit cell circuit $R_{00}$-$R_{mn}$ has a conductance representing a stored memory state. The series conductances of the NVM bit cell circuits $R_{00}$-$R_{mn}$ in FIG. 15 represent a weight matrix. Each NVM bit cell circuit $R_{00}$-$R_{mn}$ in this example has a transistor comprising a gate node $G_{00}$-$G_{mn}$ that is coupled to a respective word line $WL_0$-$WL_m$ based on which memory row $R_0$-$R_m$ the NVM bit cell circuit $R_{00}$-$R_{mn}$ is located. Each NVM bit cell circuit $R_{00}$-$R_{mn}$ is configured to activate its respective semiconductor channel on a respective source line $SL_0$-$SL_m$ to couple its conductance on the respective source line $SL_0$-$SL_m$. The current $I_0$-$I_m$ flowing from the respective NVM storage string circuits 1502(0)-1502(m) on the respective source lines $SL_0$-$SL_m$ to output nodes 1508(0)-1508(m) is a function of the respective voltages $V_0$-$V_m$ driven by the word line driver circuits 1506(0)-1506(m) on respective word lines $WL_0$-$WL_m$ divided by the summed conductances of the NVM bit cell circuits $R_{00}$-$R_{mn}$. Thus for example, current $I_0$ flowing on a respective source line $SL_0$ to the output node 1508(0) is a function of the sum of the dot product multiplications, meaning an input vector $X_0$-$X_n$ is multiplied by the corresponding memory states in the NVM bit cell circuits $R_{00}$-$R_{0n}$. The currents $I_0$-$I_m$ may be analog representations of a summation of the dot product multiplications which can be converted to binary values. In other words, the NVM matrix circuit 1500 is configured to produce currents $I_0$-$I_m$ according to the following formula:

$$I_i = \sum_j V_{BL,j} \cdot G_{ij}$$

where:
  i=memory row 0 to m;
  j=memory column 0 to n;
  $V_{BL}$=voltage $V_j$; and
  $G_{ij}$=conductance of an NVM bit cell circuit.

The conductances $G_{ij}$ of the respective NVM bit cell circuits $R_{00}$-$R_{mn}$ correlate to the voltages $V_0$-$V_m$ applied to the word lines $WL_0$-$WL_m$. If the bit lines $BL_0$-$BL_n$ are coupled to a pre-neuron layer and the output nodes 1508(0)-1508(m) are coupled to a post-neuron layer, the NVM matrix circuit 1500 is also configured to train the channel resistance of the NVM bit cell circuits $R_{00}$-$R_{mn}$ by supporting backwards propagation of a weight update according to the following formula:

$$\Delta G_{ij} = \eta \cdot S_{post,i} \cdot S_{post+1,j}$$

where:
  $G_{ij}$=conductance of an NVM bit cell circuit; and
  S=source lines of NVM storage string circuits.

Read and write operations similar to that described above with regard to the NVM matrix circuit 300 in FIG. 3A can be performed in the NVM matrix circuit 1500 in FIG. 15.

Figure 16:
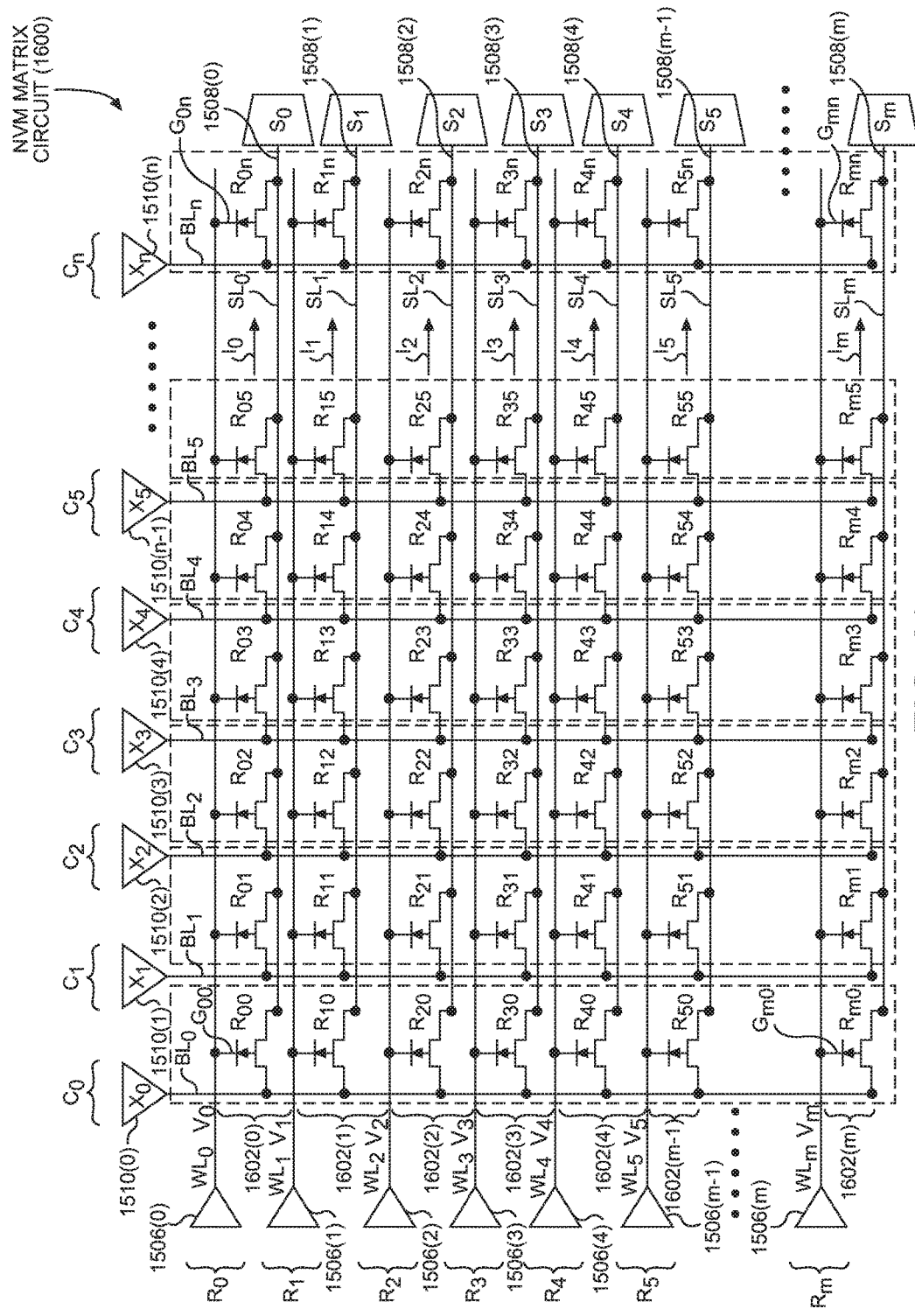
FIG. 16 is a schematic diagram of an exemplary NVM matrix circuit without need for cross-bar connections employing NVM storage string circuits in the form of NOR NVM FeFET circuits each comprised of a plurality of NVM FeFET bit cell circuits for performing matrix computations.

Other types of NVM bit cell circuits can be employed besides NOR flash circuits like shown in the NVM matrix circuit 1500 in FIG. 15. For example, FIG. 16 is a schematic diagram of another exemplary matrix circuit 1600 without need for cross-bar connections like the NVM matrix circuit 1500 in FIG. 15. However, the NVM matrix circuit 1600 in FIG. 16 includes NVM storage string circuits 1602(0)-1602(m) in the form of NOR NVM FeFET circuits. Each NVM storage string circuit 1602(0)-1602(m) includes an NVM matrix circuit $R_{00}$-$R_{mn}$ in the form of NVM Fe-FET circuits in this example. Common components between the NVM matrix circuit 1500 in FIG. 15 and the NVM matrix circuit 1600 in FIG. 16 are shown with common element numbers and thus will not be re-described. Read and write operations similar to that described above with regard to the NVM matrix circuit 300 in FIG. 3A can be performed in the NVM matrix circuit 1600 in FIG. 16.

Figure 17:
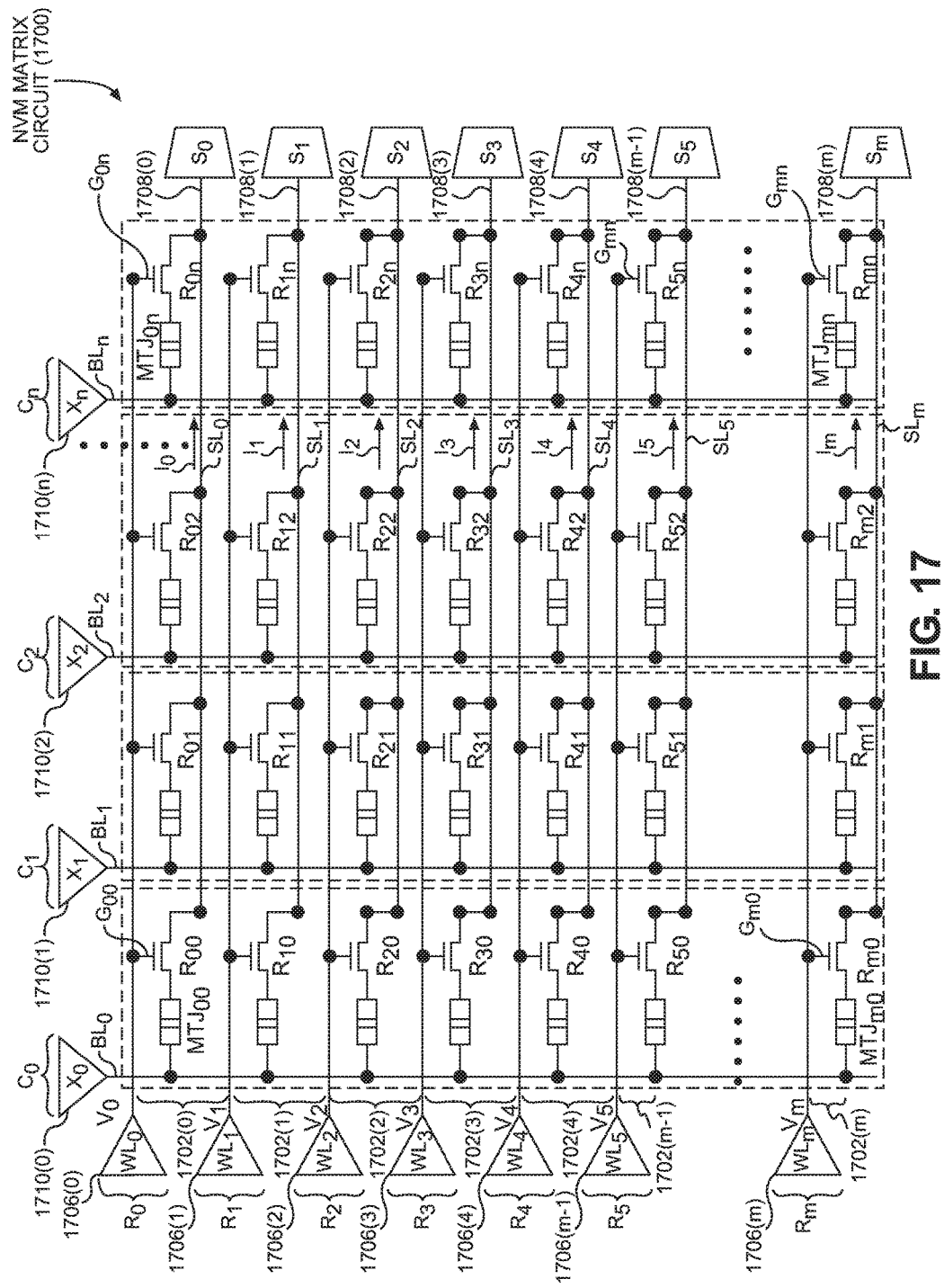
FIG. 17 is a schematic diagram of an exemplary NVM matrix circuit without need for cross-bar connections employing NVM storage string circuits in the form of NOR NVM MRAM circuits each comprised of a plurality of NVM MRAM bit cell circuits for performing matrix computations.

FIG. 17 is a schematic diagram of another exemplary NVM matrix circuit 1700 that can perform matrix multiplication without the use of cross-bar connections employing OR-based NVM storage string circuits 1702(0)-1702(m) provided as NOR NVM MRAM circuits in this example. In this manner, as discussed below, the summed conductances of the MTJs in the NVM storage string circuits 1702(0)-1702(m) affect the currents $I_0$-$I_m$ to flowing to output nodes 1708(0)-1708(m) representing dot product matrix multiplication calculations. In this regard, the NVM matrix circuit 1700 employs NVM storage string circuits 1702(0)-1702(m) in 'm+1' memory rows $R_0$-$R_m$ that each include a plurality of NVM bit cell circuits $R_{00}$-$R_{mn}$. Thus, the NVM bit cell circuits $R_{00}$-$R_{mn}$ are arranged in memory rows $R_0$-$R_m$ and memory columns $C_0$-$C_n$. The NVM matrix circuit 1700 includes a respective word line $WL_0$-$WL_m$ for each memory row $R_0$-$R_m$. Word line driver circuits 1706(0)-1706(m) are provided that are each configured to drive a respective voltage $V_0$-$V_m$ on the respective word lines $WL_0$-$WL_m$. Source lines $SL_0$-$SL_m$ for each NVM storage string circuit 1702(0)-1702(m) include respective output nodes 1708(0)-1708(m). The source lines $SL_0$-$SL_m$ are configured to provide a respective current $I_0$-$I_m$ to the respective output nodes 1708(0)-1708(m) to be provided as an output vector $S_0$-$S_m$. For example, the output vector $S_0$-$S_m$ may be a binary post-synapse vector. The NVM matrix circuit 1700 also includes a respective bit line $BL_0$-$BL_n$ for each memory column $C_0$-$C_n$ in this example. Bit line driver circuits 1710(0)-1710(n) are provided that are each configured to drive a respective input vector $X_0$-$X_n$ in the form of input voltages on the respective bit lines $BL_0$-$BL_n$ in this example. Note however that alternatively, the word lines $WL_0$-$WL_m$ provided in the respective memory rows $R_0$-$R_m$ could be configured to receive the input vector X, and respective fixed voltages be applied to the bit lines $BL_0$-$BL_n$ in the respective memory columns $C_0$-$C_n$ with the respective voltages $V_0$-$V_m$ applied. For example, the input vector $X_0$-$X_n$ may be a binary pre-synapse vector.

With continuing reference to FIG. 17, each NVM bit cell circuit $R_{00}$-$R_{mn}$ has a conductance representing a stored memory state. The series conductances of the NVM bit cell circuits $R_{00}$-$R_{mn}$ in FIG. 17 represent a weight matrix. Each NVM bit cell circuit $R_{00}$-$R_{mn}$ in this example has a transistor comprising a gate node $G_{00}$-$G_{mn}$ that is coupled to a respective word line $WL_0$-$WL_m$ based on which memory row $R_0$-$R_m$ the NVM bit cell circuit $R_{00}$-$R_{mn}$ is located. Each NVM bit cell circuit $R_{00}$-$R_{mn}$ is configured to activate its respective semiconductor channel on a respective source line $SL_0$-$SL_m$ to couple the conductance of its respective MTJ on the respective source line $SL_0$-$SL_m$. The current $I_0$-$I_m$ flowing from the respective NVM storage string circuits 1702(0)-1702(m) on the respective source lines $SL_0$-$SL_m$ to output nodes 1708(0)-1708(m) is a function of the respective voltages $V_0$-$V_m$ driven by word line driver circuits 1706(0)-1706(m) on respective word lines $WL_0$-$WL_m$ divided by the summed conductances of the NVM bit cell circuits $R_{00}$-$R_{mn}$. Thus for example, current $I_0$ flowing on a respective source line $SL_0$ to the output node 1708(0) is a function of the sum of the dot product multiplications, meaning input vector $X_0$-$X_n$ is multiplied by the corresponding memory states in the NVM bit cell circuits $R_{00}$-$R_{0n}$. The currents $I_0$-$I_m$ may be analog representations of a summation of the dot product multiplications which can be converted to binary values. In other words, the NVM matrix circuit 1700 is configured to produce currents $I_0$-$I_m$ according to the following formula:

$$I_i = \sum_j V_{BL,j} \cdot G_{ij}$$

where:
  i=memory row 0 to m;
  j=memory column 0 to n;
  $V_{BL}$=voltage $V_j$; and
  $G_{ij}$=conductance of an NVM bit cell circuit.

The conductances $G_{ij}$ of the respective NVM bit cell circuits $R_{00}$-$R_{mn}$ correlate to the voltages $V_0$-$V_m$ applied to the word lines $WL_0$-$WL_m$. If the bit lines $BL_0$-$BL_n$ are coupled to a pre-neuron layer and the output nodes 1708(0)-1708(m) are coupled to a post-neuron layer, the NVM matrix circuit 1700 is also configured to train the channel resistance of the NVM bit cell circuits $R_{00}$-$R_{mn}$ by supporting backwards propagation of a weight update according to the following formula:

$$\Delta G_{ij} = \eta \cdot S_{post,i} \cdot S_{post+1,j}$$

where:
  $G_{ij}$=conductance of an NVM bit cell circuit; and
  S=source lines of NVM storage string circuits.

FIG. 18 is a schematic diagram of another exemplary NVM matrix circuit 1800 that can perform matrix multiplication without the use of cross-bar connections employing OR-based NVM storage string circuits 1802(0)-1802(m) provided as NOR NVM RRAM circuits in this example. In this manner, as discussed below, the summed conductances of the NVM storage string circuits 1802(0)-1802(m) affect the currents $I_0$-$I_m$ to flowing to output nodes 1808(0)-1808(m) representing dot product matrix multiplication calculations. In this regard, the NVM matrix circuit 1800 employs NVM storage string circuits 1802(0)-1802(m) in 'm+1' memory rows $R_0$-$R_m$ that each include a plurality of NVM bit cell circuits $R_{00}$-$R_{mn}$. Thus, the NVM bit cell circuits $R_{00}$-$R_{mn}$ are arranged in memory rows $R_0$-$R_m$ and memory columns $C_0$-$C_n$. The NVM matrix circuit 1800 includes a respective word line $WL_0$-$WL_m$ for each memory row $R_0$-$R_m$. Word line driver circuits 1806(0)-1806(m) are provided that are each configured to drive a respective voltage $V_0$-$V_m$ on the respective word lines $WL_0$-$WL_m$. Source lines $SL_0$-$SL_m$ for each NVM storage string circuit 1802(0)-1802(m) include respective output nodes 1808(0)-1808(m). The source lines $SL_0$-$SL_m$ are configured to provide a respective current $I_0$-$I_m$ to the respective output nodes 1808(0)-1808(m) to be provided as an output vector $S_0$-$S_m$. For example, the output vector $S_0$-$S_m$ may be a binary post-synapse vector. The NVM matrix circuit 1800 also includes a respective bit line $BL_0$-$BL_n$ for each memory column $C_0$-$C_n$ in this example. Bit line driver circuits 1810(0)-1810(n) are provided that are each configured to drive a respective input vector $X_0$-$X_n$ in the form of input voltages on the respective bit lines $BL_0$-$BL_n$ in this example. Note however that alternatively, the word lines $WL_0$-$WL_m$ provided in the respective memory rows $R_0$-$R_m$ could be configured to receive the input vector X, and respective fixed voltages be applied to the bit lines $BL_0$-$BL_n$ in the respective memory columns $C_0$-$C_n$ with the respective voltages $V_0$-$V_m$ applied. For example, the input vector $X_0$-$X_n$ may be a binary pre-synapse vector.

With continuing reference to FIG. 18, each NVM bit cell circuit $R_{00}$-$R_{mn}$ has a conductance representing a stored memory state. The series conductances of the NVM bit cell circuits $R_{00}$-$R_{mn}$ in FIG. 18 represent a weight matrix. Each NVM bit cell circuit $R_{00}$-$R_{mn}$ in this example has a transistor comprising a gate node $G_{00}$-$G_{mn}$ that is coupled to a respective word line $WL_0$-$WL_m$ based on which memory row $R_0$-$R_m$ the NVM bit cell circuit $R_{00}$-$R_{mn}$ is located. Each NVM bit cell circuit $R_{00}$-$R_{mn}$ is configured to activate its respective semiconductor channel on a respective source line $SL_0$-$SL_m$ to couple the conductance of its respective MTJ on the respective source line $SL_0$-$SL_m$. The current $I_0$-$I_m$ flowing from the respective NVM storage string circuits 1802(0)-1802(m) on the respective source lines $SL_0$-$SL_m$ to output nodes 1808(0)-1808(m) is a function of the respective voltages $V_0$-$V_m$ driven by the word line driver circuits 1806(0)-1806(m) on respective word lines $WL_0$-$WL_m$ divided by the summed conductances of the NVM bit cell circuits $R_{00}$-$R_{mn}$. Thus for example, current $I_0$ flowing on a respective source line $SL_0$ to the output node 1808(0) is a function of the sum of the dot product multiplications, meaning input vector $X_0$-$X_n$ is multiplied by the corresponding memory states in the NVM bit cell circuits $R_{00}$-$R_{0n}$. The currents $I_0$-$I_m$ may be analog representations of a summation of the dot products which can be converted to binary values. In other words, the NVM matrix circuit 1800 is configured to produce currents $I_0$-$I_m$ according to the following formula:

$$I_i = \sum_j V_{BL,j} \cdot G_{ij}$$

where:
i=memory row 0 to m;
j=memory column 0 to n;
$V_{BL}$=voltage $V_j$; and
$G_{ij}$=conductance of an NVM bit cell circuit.

The conductances $G_{ij}$ of the respective NVM bit cell circuits $R_{00}$-$R_{mn}$ correlate to the voltages $V_0$-$V_m$ applied to the word lines $WL_0$-$WL_m$. If the bit lines $BL_0$-$BL_n$ are coupled to a pre-neuron layer and the output nodes 1808(0)-1808(m) are coupled to a post-neuron layer, the NVM matrix circuit 1800 is also configured to train the channel resistance of the NVM bit cell circuits $R_{00}$-$R_{mn}$ by supporting backwards propagation of a weight update according to the following formula:

$$\Delta G_{ij} = \eta \cdot S_{post,i} \cdot S_{post+1,j}$$

where:
$G_{ij}$=conductance of an NVM bit cell circuit; and
S=source lines of NVM storage string circuits.

The concepts for the NVM matrix circuits above can also be used for an MLC NVM matrix circuit for performing matrix computations with multi-bit input vectors. In exemplary aspects disclosed herein, and as will be discussed in more detail below, an MLC NVM matrix circuit is provided that includes a plurality of NVM storage string circuits organized in respective memory rows. Each NVM storage string circuit includes a plurality of MLC NVM storage circuits. Thus, the plurality of MLC NVM storage circuits, which are each associated with an NVM storage string circuit, are arranged and addressable in respective memory rows and columns in the MLC NVM matrix circuit. Each MLC NVM storage circuit contains a plurality of NVM bit cell circuits that are each configured to store a 1-bit respective memory state. The respective memory states of the NVM bit cell circuits in a given MLC NVM storage circuit provide a multi-bit storage state in the MLC NVM storage circuit. Thus for example, the MLC NVM matrix circuit may form an m×n MLC NVM matrix circuit, where 'm' represents the number of memory rows of NVM storage string circuits provided, and 'n' represents the number of MLC NVM storage circuits within each NVM storage string circuit provided in respective memory columns. Each MLC NVM storage circuit stores a multi-bit memory state according to the individual stored memory states of the NVM bit cell circuits in its respective MLC NVM storage circuit. A plurality of bit lines are provided that are each configured to be coupled to a respective NVM storage string circuit. A plurality of source lines are provided that are each configured to be coupled to a respective NVM storage string circuit. Each MLC NVM storage circuit has a plurality of stored memory states represented by a resistance of their NVM bit cell circuits. Each MLC NVM storage circuit is coupled to a respective source line along with the other MLC NVM storage circuits in its respective memory row. Each NVM bit cell circuit includes a transistor whose gate node is coupled to a respective word line among a plurality of word lines configured to receive a multi-bit input vector of 1×n size for example. Each entry in the input vector represents a multi-bit input configured to be coupled to m×n word lines that are coupled to the respective gate nodes of the NVM bit cell circuits in respective MLC NVM storage circuits and control whether the resistance of a given NVM bit cell circuit is contributed to the overall resistance of its respective MLC NVM storage circuit. For example, the input vector could be a pre-synapse weight vector for example. Each source line is coupled to a respective output node wherein the source lines for all the NVM storage string circuits can collectively provide an output vector. The output vector may be a post-synapse vector for example.

To multiply the multi-bit input vector of 1×n size times the m×n MLC NVM matrix circuit formed by the plurality of NVM storage string circuits, a line voltage is applied to the bit lines of the NVM storage string circuits while input voltages representing the input vector are applied to n×m word lines to be applied to respective gate nodes of the NVM bit cell circuits in respective MLC NVM storage circuits. This causes a summation current to be generated on each source line based on the weighted summed contribution of each MLC NVM storage circuit total resistance (based on the individual resistance of their respective NVM bit cell circuits) to its respective source line. Each output node forms an output vector, which is the result of the 1×n multi-bit input vector times one (1) column n of the m×n MLC NVM matrix circuit. By the NVM bit cell circuits of the MLC NVM storage circuits including a transistor coupled to a word line that controls the resistance contributed by its respective NVM storage string circuit on its respective source line, a cross-bar connection between the word lines and the bit lines does not have to be provided, which avoids creating sneak path currents in the MLC NVM matrix circuit. The word lines and the bit lines are isolated from each other through the NVM bit cell circuits of their respective MLC NVM storage circuits.

In this regard, FIG. 19 is a schematic diagram of an exemplary MLC NVM matrix circuit 1900 that can perform matrix multiplication with multi-bit input vectors, and without the need to employ cross-bar connections. The MLC NVM matrix circuit 1900 employs NVM storage string circuits 1902(0)-1902(m) in 'm+1' memory rows $R_0$-$R_m$ that each include a plurality of MLC NVM storage circuits MLC-$R_{00}$-MLC-$R_{mn}$. In this example, the MLC NVM storage circuits MLC-$R_{00}$-MLC-$R_{mn}$ are NAND MLC NVM flash circuits. However, the NVM storage string circuits 1902(0)-1902($m$) can be provided as other types of NVM matrix circuits as discussed in more detail below in other aspects. The MLC NVM storage circuits MLC-$R_{00}$-MLC-$R_{mn}$ in each respective NVM storage string circuit 1902(0)-1902($m$) are arranged in memory rows $R_0$-$R_m$ and memory columns $C_0$-$C_n$. The MLC NVM matrix circuit 1900 includes a respective bit line $BL_0$-$BL_m$ for each memory row $R_0$-$R_m$. Bit line driver circuits 1906(0)-1906($m$) are provided that are each configured to drive a respective line voltage $V_0$-$V_m$ on the respective bit lines $BL_0$-$BL_m$. Source lines $SL_0$-$SL_m$ are also provided that are each coupled to a respective output node 1908(0)-1908($m$). The NVM storage string circuits 1902(0)-1902($m$) are coupled between a corresponding bit line $BL_0$-$BL_m$ and a corresponding source line $SL_0$-$SL_m$ in each respective memory row $R_0$-$R_m$. The source lines $SL_0$-$SL_m$ are configured to carry a respective current $I_0$-$I_m$ to the respective output nodes 1908(0)-1908($m$) as an output vector $S_0$-$S_m$ when their respective MLC NVM storage circuits MLC-$R_{00}$-MLC-$R_{mn}$ are activated. For example, the output vector $S_0$-$S_m$ may be a binary post-synapse vector.

With continuing reference to FIG. 19, the MLC NVM matrix circuit 1900 also includes respective word lines $WL_{00}$-$WL_{m0}$-$WL_{00}$-$WL_{mn}$ for each memory column $C_0$-$C_n$. Word line driver circuits 1910(0)-1910($n$) are provided that are each configured to drive a respective multi-bit input vector $X_0$-$X_n$ comprising a plurality of input voltages on the respective word lines $WL_{00}$-$WL_{m0}$-$WL_{00}$-$WL_{mn}$. Each column $C_0$-$C_n$. of the multi-bit input vector $X_0$-$X_n$ contains a plurality of signals that correspond to a plurality of word lines $WL_{00}$-$WL_{m0}$-$WL_{00}$-$WL_{mn}$ for their respective memory columns $C_0$-$C_n$. As will be discussed in more detail below, the word lines $WL_{00}$-$WL_{m0}$-$WL_{00}$-$WL_{mn}$ are coupled to respective inputs $G_{00}$-$G_{mn}$ of the MLC NVM storage circuits MLC-$R_{00}$-MLC-$R_{mn}$ in a given memory column $C_0$-$C_n$ to control the resistance of the MLC NVM storage circuits MLC-$R_{00}$-MLC-$R_{mn}$ being applied to the respective source lines $SL_0$-$SL_m$. For example, the input vector $X_0$-$X_n$ may be a binary pre-synapse data vector.

With continuing reference to FIG. 19, the MLC NVM matrix circuit 1900 also includes first access transistors 1912(0)-1912($m$) coupled between a respective bit line $BL_0$-$BL_m$ and an NVM storage string circuit 1902(0)-1902($m$). The first access transistors 1912(0)-1912($m$) each comprise a first access gate node G coupled to a respective first access line 1914 configured to be driven with a first access voltage by a first access line driver circuit 1916. The first access transistors 1912(0)-1912($m$) are each configured to control whether a corresponding line voltage $V_0$-$V_m$ applied on a respective bit line $BL_0$-$BL_m$ is applied to a respective NVM storage string circuit 1902(0)-1902($m$) in a corresponding memory row $R_0$-$R_m$. The first access transistors 1912(0)-1912($m$) are configured to pass a line voltage $V_0$-$V_m$ on respective bit lines $BL_0$-$BL_m$ in response to a first access signal (voltage) driven by the first access line driver circuit 1916 onto a second access line 1920 to the first access gate node G of the first access transistors 1912(0)-1912($m$) sufficient to turn on the first access transistors 1912(0)-1912($m$). The MLC NVM matrix circuit 1900 also includes second access transistors 1918(0)-1918($m$) coupled between a respective NVM storage string circuit 1902(0)-1902($m$) and a source line $SL_0$-$SL_m$ coupled to the output nodes 1908(0)-1908($m$). The second access transistors 1918(0)-1918($m$) are each configured to couple a respective NVM storage string circuit 1902(0)-1902($m$) to a respective source line $SL_0$-$SL_m$ and a respective output node 1908(0)-1908($m$) in response to a second access signal (voltage) driven by a second access line driver circuit 1922 onto the second access line 1920 to a second access gate node G of the second access transistors 1918(0)-1918($m$) sufficient to turn on the second access transistors 1918(0)-1918($m$). As shown in FIG. 19, there is no cross-bar coupling between the word lines $WL_{00}$-$WL_{m0}$-$WL_{00}$-$WL_{mn}$ and the bit lines $BL_0$-$BL_m$. The access transistors 1912(0)-1912($m$), 1918(0)-1918($m$) of the NVM storage string circuits 1902(0)-1902($m$) can provide further isolation between the word lines $WL_{00}$-$WL_{m0}$-$WL_{00}$-$WL_{mn}$ and the bit lines $BL_0$-$BL_m$.

Figure 20A:
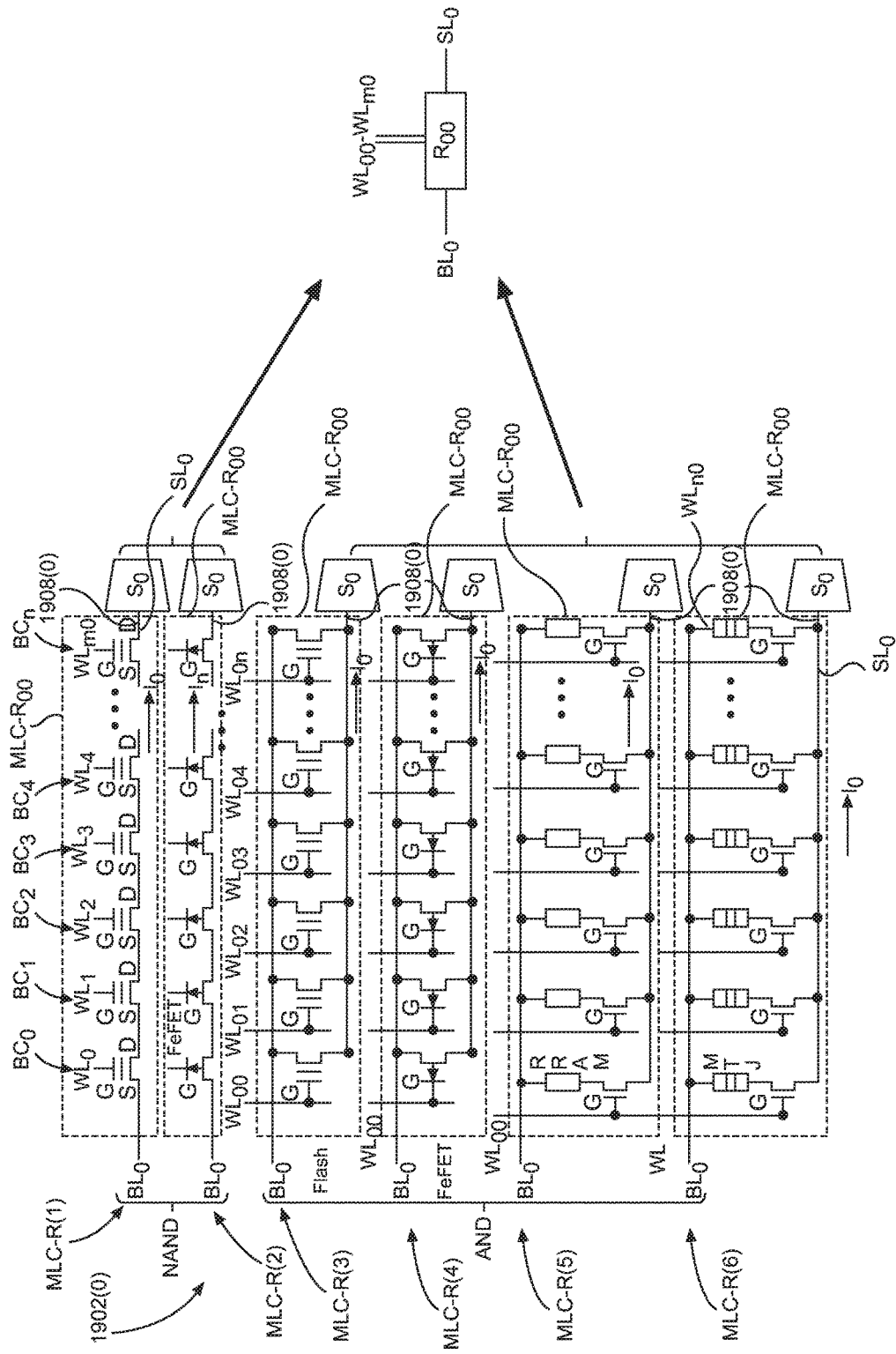
FIG. 20A is a schematic diagram of different types of NAND and AND NVM bit cell circuits that can be provided in the MLC NVM storage circuits in an MLC NVM matrix circuit, including the MLC NVM matrix circuit in FIG. 19.

With continuing reference to FIG. 19, each MLC NVM storage circuit MLC-$R_{00}$-MLC-$R_{mn}$ in the MLC NVM matrix circuit 1900 is an NVM flash circuit that does not need power to retain data in this example. Each MLC NVM storage circuits MLC-$R_{00}$-MLC-$R_{mn}$ in the MLC NVM matrix circuit 1900 includes a plurality of NVM bit cell circuits that are each coupled to one another to provide for each MLC NVM storage circuit MLC-$R_{00}$-MLC-$R_{mn}$. This is shown by example in FIG. 20A. FIG. 20A is a schematic diagram of different types of MLC NVM storage circuits MLC-R(1)-MLC-R(6) that can be employed in any of the MLC NVM storage circuits MLC-$R_{00}$-MLC-$R_{mn}$ in the MLC NVM matrix circuit 1900 in FIG. 19. The MLC NVM storage circuits MLC-R(1), MLC-R(2) are comprised of NAND NVM flash circuits and NAND NVM FeFET circuits, respectively. The MLC NVM storage circuits MLC-R(3)-MLC-R(6) are comprised of AND NVM flash circuits, AND NVM FeFET circuits, AND NVM RRAM circuits, and AND NVM MRAM circuits, respectively.

Taking MLC NVM storage circuit MLC-R(1) as an example, assume that MLC NVM storage circuit MLC-R(1) is employed as MLC NVM storage circuit MLC-$R_{00}$ in the MLC NVM matrix circuit 1900 in FIG. 19. As shown in FIG. 20A, the MLC NVM storage circuit MLC-R(1) is comprised of a plurality of NVM bit cell circuits $BC_0$-$BC_n$. The NVM bit cell circuits $BC_0$-$BC_n$ are each coupled to each other in a series-coupled, string fashion, with their source nodes S coupled to drain nodes D of an adjacent NVM bit cell circuit $BC_0$-$BC_n$. The end NVM bit cell circuit $BC_0$, $BC_n$ in the MLC NVM storage circuit MLC-R(1) can be coupled to respective access transistors 1912(0), 1918(0) shown in FIG. 19. Each NVM bit cell circuit $BC_0$-$BC_n$ has a resistance representing a stored memory state. Each NVM bit cell circuit $BC_0$-$BC_n$ has a transistor comprising a gate node G that is coupled to a respective word line $WL_{00}$-$WL_{n0}$ based on in which memory column $C_0$-$C_n$ the NVM bit cell circuit $BC_0$-$BC_n$ is located. Each NVM bit cell circuit $BC_0$-$BC_n$ is configured to be activated by a signal on a respective word line $WL_{00}$-$WL_{m0}$ to activate a semiconductor channel C to couple its resistance on the source line $SL_0$ in its memory row $R_0$. The collective memory states in the NVM bit cell circuits $BC_0$-$BC_n$ form a multi-bit data vector stored in the NVM storage string circuit 1902(0). As shown in FIG. 20A, there is no cross-bar coupling between the word lines $WL_{00}$-$WL_{m0}$ and the bit line $BL_0$, which is also true between all word lines $WL_{00}$-$WL_{m0}$ and the respective bit lines $BL_0$-$BL_m$.

With reference back to FIG. 19, as will be discussed in more detail below, when a line voltage is applied to bit line $BL_0$ and access voltages are applied to the access gate nodes G of the access transistors 1912(0)-1912($m$) sufficient to activate semiconductor channels C of the access transistors 1912(0)-1912($m$), the NVM storage string circuit 1902(0) is coupled to the bit line $BL_0$ and the source line $SL_0$. The input voltages as a multi-bit input vector $X_0$-$X_n$ with each entry in the multi-bit input vector $X_0$-$X_n$ being 1×m in size is applied to the word lines $WL_{00}$-$WL_{m0}$ and inputs $G_{00}$-$G_{0n}$ of the respective MLC NVM storage circuits MLC-$R_{00}$-MLC-$R_{0n}$ as the multi-bit input vector $X_0$-$X_n$ to control activation of the respective NVM bit cell circuits $BC_0$-$BC_n$ in each of the MLC NVM storage circuits MLC-$R_{00}$-MLC-$R_{0n}$. When activated, the NVM bit cell circuits $BC_0$-$BC_n$ in each of the MLC NVM storage circuits MLC-$R_{00}$-MLC-$R_{0n}$ couple their resistance to the source line $SL_0$ coupled to their respective MLC NVM storage circuit MLC-$R_{00}$-MLC-$R_{0n}$. The resistances of the MLC NVM storage circuits MLC-$R_{00}$-MLC-$R_{0n}$ are a function of their stored memory states of their respective NVM bit cell circuits $BC_0$-$BC_n$. Thus, the resistance of the MLC NVM storage circuits MLC-$R_{00}$-MLC-$R_{0n}$ can represent a weight vector. The current $I_0$ flowing on a respective source line $SL_0$ to the output node 1908(0) is a function of the sum of the dot product multiplications of the respective multi-bit input vector $X_0$-$X_n$ multiplied by the corresponding memory states in the NVM bit cell circuits $BC_0$-$BC_n$ of the NVM storage string circuit 1902(0). Thus, with reference to FIG. 19, all the MLC NVM storage circuits MLC-$R_{00}$-MLC-$R_{0n}$ for the NVM storage string circuits 1902(0)-1902(m) in the MLC NVM matrix circuit 1900 in FIG. 19 can represent a multi-bit weight matrix. The current $I_0$-$I_m$ flowing from the respective source lines $SL_0$-$SL_m$ of the respective NVM storage string circuits 1902(0)-1902(m) to output nodes 1908(0)-1908(m) is a function of the respective line voltages $V_0$-$V_m$ driven by the bit line driver circuits 1906(0)-1906(m) on the respective source lines $SL_0$-$SL_m$ divided by the summed resistance of the MLC NVM storage circuits MLC-$R_{00}$-MLC-$R_{0n}$ of the NVM storage string circuits 1902(0)-1902(m). The currents $I_0$-$I_m$ may be analog representations of a summation of the dot product multiplications which can be converted to binary values. In other words, the MLC NVM matrix circuit 1900 in FIG. 19 is configured to produce currents $I_0$-$I_m$ on an input layer according to the following formula:

$$I_i = V_{BL} \bigg/ \sum_j R_{ij}$$

where:
 i=memory row 0 to m;
 j=memory column 0 to n;
 $V_{BL}$=voltage $V_i$; and
 $R_{ij}$=resistance of an MLC NVM storage circuit.

Thus, with continuing reference to FIG. 19, the MLC NVM matrix circuit 1900 is configured to perform matrix multiplication on m number of 1×n weight vectors stored as respective memory states in each of the respective MLC NVM storage circuits MLC-$R_{00}$-MLC-$R_{mn}$ by a respective n×1 multi-bit input vector $X_0$-$X_n$ simultaneously. The dot products of these vector multiplications are provided as a function of respective amplitudes of the currents $I_0$-$I_m$ generated at the output nodes 1908(0)-1908(m) according to the current formula provided above.

Further, if the word lines $WL_{00}$-$WL_{mn}$ are coupled to a pre-neuron layer and the output nodes 1908(0)-1908(m) are coupled to a post-neuron layer, the MLC NVM matrix circuit 1900 is also configured to train the resistance of the MLC NVM storage circuits MLC-$R_{00}$-MLC-$R_{mn}$ by supporting backwards propagation of a weight update according to the following formula:

$$\Delta R_{ij} = \eta \cdot S_{post,i} \cdot S_{post+1,j}$$

where:
 $R_{ij}$=resistance of an MLC NVM storage circuit; and
 S=value at source lines of MLC NVM storage circuits.

The weight matrix of the MLC NVM matrix circuit 1900 provided as stored memory states in the MLC NVM storage circuits MLC-$R_{00}$-MLC-$R_{mn}$ can be set to the desired memory states in a write operation to provide the desired weight matrix. For example, to write a logic '0' to NVM bit cell circuit $BC_5$ in MLC NVM storage circuit MLC-$R_{25}$, a 0 V or 5 V line voltage is applied by the bit line driver circuit 1906(2) on the bit line $BL_2$ for memory row $R_2$ depending on whether the MLC NVM storage circuit MLC-$R_{25}$ stores memory states with or without a charge trap, respectively. A line voltage of 5V is applied on source line $SL_2$ coupled to the output node 1908(2). An input voltage of 10V is applied to the word line $WL_{25}$ to be applied to the input $G_{25}$ of the MLC NVM storage circuit MLC-$R_{25}$ and the gate G of the NVM bit cell circuit $BC_5$ to program the memory states of the NVM bit cell circuit $BC_5$ in the MLC NVM storage circuit MLC-$R_{25}$ to a logic '0' memory state. Similarly, to write a logic '1' to NVM bit cell circuit $BC_5$ in MLC NVM storage circuit MLC-$R_{25}$, a 0 V or 5 V line voltage is applied by the bit line driver circuit 1906(2) on the bit line $BL_2$ for memory row $R_2$ depending on whether the MLC NVM storage circuit MLC-$R_{25}$ stores memory states with or without a charge trap, respectively. A line voltage of 5V is applied on source line $SL_2$ coupled to the output node 1908(2). An input voltage of 10V is applied to the word line $WL_{25}$ to be applied to the input $G_{25}$ of the MLC NVM storage circuit MLC-$R_{25}$ and the gate G of the NVM bit cell circuit $BC_5$ to program the memory states of the NVM bit cell circuit $BC_5$ in the MLC NVM storage circuit MLC-$R_{25}$ to a logic '1' memory state.

A read operation is performed to cause the MLC NVM matrix circuit 1900 in FIG. 19 to perform a matrix computation. To multiply the multi-bit input vector $X_0$-$X_n$ times the memory states of each of the NVM storage string circuits 1902(0)-1902(m) to generate respective currents $I_0$-$I_m$ on the source lines $SL_0$-$SL_m$ coupled to the output nodes 1908(0)-1908(m), all the MLC NVM storage circuits MLC-$R_{00}$-MLC-$R_{mn}$ are activated in this example. In this regard, in this example, an input voltage of 4.5 V is applied as the input vector $X_0$-$X_n$ to each of the respective word lines $WL_{00}$-$WL_{mn}$ to cause the resistance of each of the MLC NVM storage circuits MLC-$R_{00}$-MLC-$R_{mn}$ added in series to contribute to the overall series resistance of the respective source lines $SL_0$-$SL_m$. Their resistances contribute to the overall series resistance of respective source lines $SL_0$-$SL_m$ and are a function of the memory states stored in the NVM bit cell circuits $BC_0$-$BC_n$ of the MLC NVM storage circuits MLC-$R_{00}$-MLC-$R_{mn}$. The currents $I_0$-$I_m$ at the output nodes 1908(0)-1908(m) are a function of the sum of the dot product multiplications of multi-bit input vectors $X_0$-$X_n$ multiplied by the respective memory states of the MLC NVM storage circuits MLC-$R_{00}$-MLC-$R_{mn}$ each in the respective NVM storage string circuits 1902(0)-1902(m) as weight vectors.

Figure 20B:
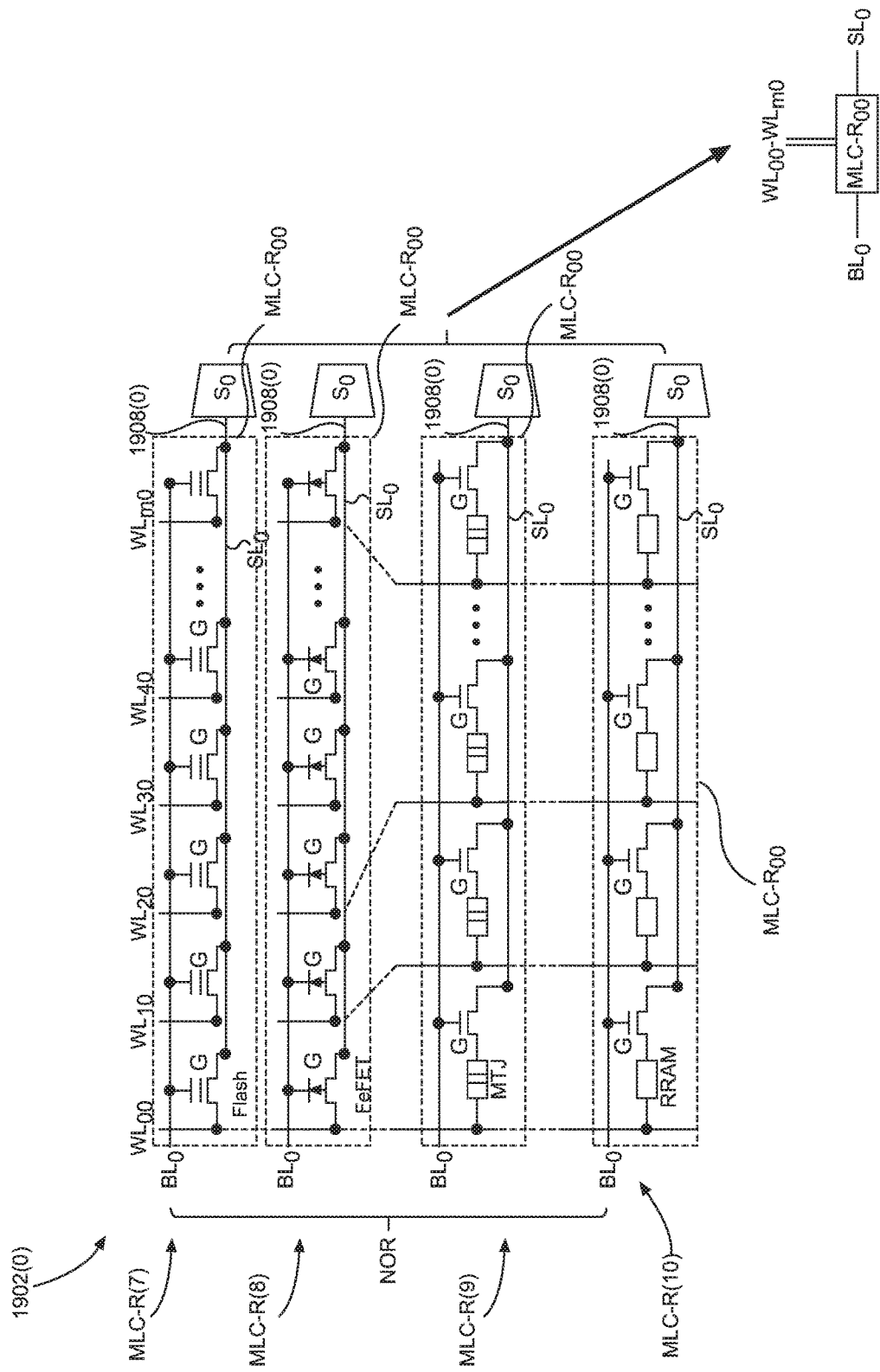
FIG. 20B is a schematic diagram of different types of NOR NVM bit cell circuits that can be provided in the MLC NVM storage circuits in an MLC NVM matrix circuit, including the MLC NVM matrix circuit in FIG. 19.

The MLC NVM storage circuits MLC-$R_{00}$-MLC-$R_{mn}$ in the MLC NVM matrix circuit 1900 in FIG. 19 can be provided as other types of NVM circuits other than NAND flash circuits. For example, FIG. 20A also shows using other types of NVM circuits as the NVM bit cell circuits $BC_0$-$BC_n$ in an MLC NVM storage circuit MLC-$R_{00}$-MLC-$R_{mn}$, using MLC NVM storage circuit MLC-$R_{00}$ as an example. As shown in FIG. 20A, the MLC NVM storage circuit MLC-$R_{00}$ could be the MLC NVM storage circuit MLC-R(2) employing NAND NVM FeFET circuits. The MLC NVM storage circuit MLC-$R_{00}$ could be the MLC NVM storage circuit MLC-R(3) employing AND NVM flash circuits. The MLC NVM storage circuit MLC-R$_{00}$ could be the MLC NVM storage circuit MLC-R(4) employing AND FeFET circuits. The MLC NVM storage circuit MLC-R$_{00}$ could be the MLC NVM storage circuit MLC-R(5) employing AND RRAM circuits. The MLC NVM storage circuit MLC-R$_{00}$ could be the MLC NVM storage circuit MLC-R(6) employing AND MRAM circuits. FIG. 20B also shows using other types of NVM circuits as the NVM bit cell circuits BC$_0$-BC$_n$ in an MLC NVM storage circuits MLC-R$_{00}$-MLC-R$_{mn}$, using MLC NVM storage circuit MLC-R$_{00}$ as an example. As shown in FIG. 20B, the MLC NVM storage circuit MLC-R$_{00}$ could be the MLC NVM storage circuit MLC-R(7) employing NOR NVM flash circuits. The MLC NVM storage circuit MLC-R$_{00}$ could be the MLC NVM storage circuit MLC-R(8) employing NOR NVM FeFET circuits. The MLC NVM storage circuit MLC-R$_{00}$ could be the MLC NVM storage circuit MLC-R(9) employing NOR MRAM circuits. The MLC NVM storage circuit MLC-R$_{00}$ could be the MLC NVM storage circuit MLC-R(10) employing NOR RRAM circuits. Details regarding each of these different types of NAND and AND NVM circuits have been previously discussed above and thus will not be repeated.

Figure 21A:
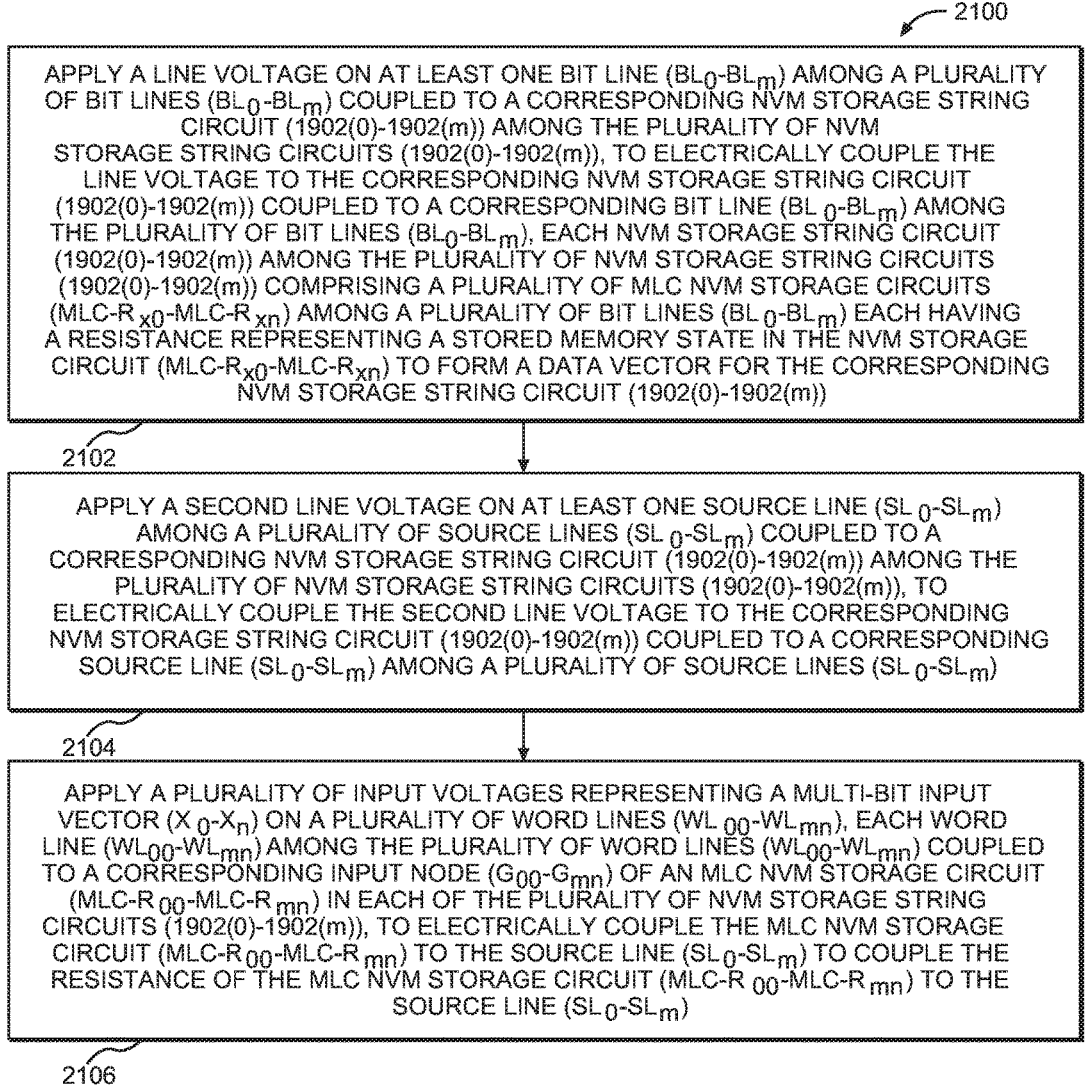
FIG. 21A is a flowchart illustrating an exemplary process of performing a read operation in the MLC NVM matrix circuit in FIG. 19.

FIG. 21A is a flowchart illustrating an exemplary process 2100 of performing a read operation in the MLC NVM matrix circuit 1900 in FIG. 19. Examples of read operations to the NVM matrix circuit 300 in FIG. 3A were discussed above. In this regard, with reference to FIGS. 19 and 21A, the process 2100 includes applying a line voltage on at least one bit line BL$_0$-BL$_m$ among a plurality of bit lines BL$_0$-BL$_m$ coupled to a corresponding NVM storage string circuit 1902(0)-1902(m) among the plurality of NVM storage string circuits 1902(0)-1902(m), to electrically couple the line voltage to the corresponding NVM storage string circuit 1902(0)-1902(m) coupled to a corresponding bit line BL$_0$-BL$_m$ among the plurality of bit lines BL$_0$-BL$_m$ (block 2102 in FIG. 21A). Each of the plurality of NVM storage string circuits 1902(0)-1902(m) comprise a plurality of MLC NVM storage circuits MLC-R$_{x0}$-MLC-R$_{xn}$ among a plurality of bit lines BL$_0$-BL$_m$ each having a resistance representing a stored memory state in the MLC NVM storage circuit MLC-R$_{x0}$-MLC-R$_{xn}$ to form a data vector for the corresponding NVM storage string circuit 1902(0)-1902(m). The process 2100 also involves applying a second line voltage on at least one source line SL$_0$-SL$_m$ among a plurality of source lines SL$_0$-SL$_m$ coupled to a corresponding NVM storage string circuit 1902(0)-1902(m) among the plurality of NVM storage string circuits 1902(0)-1902(m), to electrically couple the second line voltage to the corresponding NVM storage string circuit 1902(0)-1902(m) coupled to a corresponding source line SL$_0$-SL$_m$ among a plurality of source lines SL$_0$-SL$_m$ (block 2104 in FIG. 21A). The process 2100 also involves applying a plurality of input voltages representing a multi-bit input vector X$_0$-X$_n$ on a plurality of word lines WL$_{00}$-WL$_{mn}$, each word line WL$_{00}$-WL$_{mn}$ among the plurality of word lines WL$_{00}$-WL$_{mn}$ coupled to a corresponding input G$_{00}$-G$_{mn}$ of an MLC NVM storage circuit MLC-R$_{00}$-MLC-R$_{mn}$ in each of the plurality of NVM storage string circuits 1902(0)-1902(m), to electrically couple the NVM bit cell circuit R$_{00}$-R$_{mn}$ to the source line SL$_0$-SL$_m$ to couple the resistance of the MLC NVM storage circuit MLC-R$_{00}$-MLC-R$_{mn}$ to the source line SL$_0$-SL$_m$ (block 2106 in FIG. 21A).

Figure 21B:
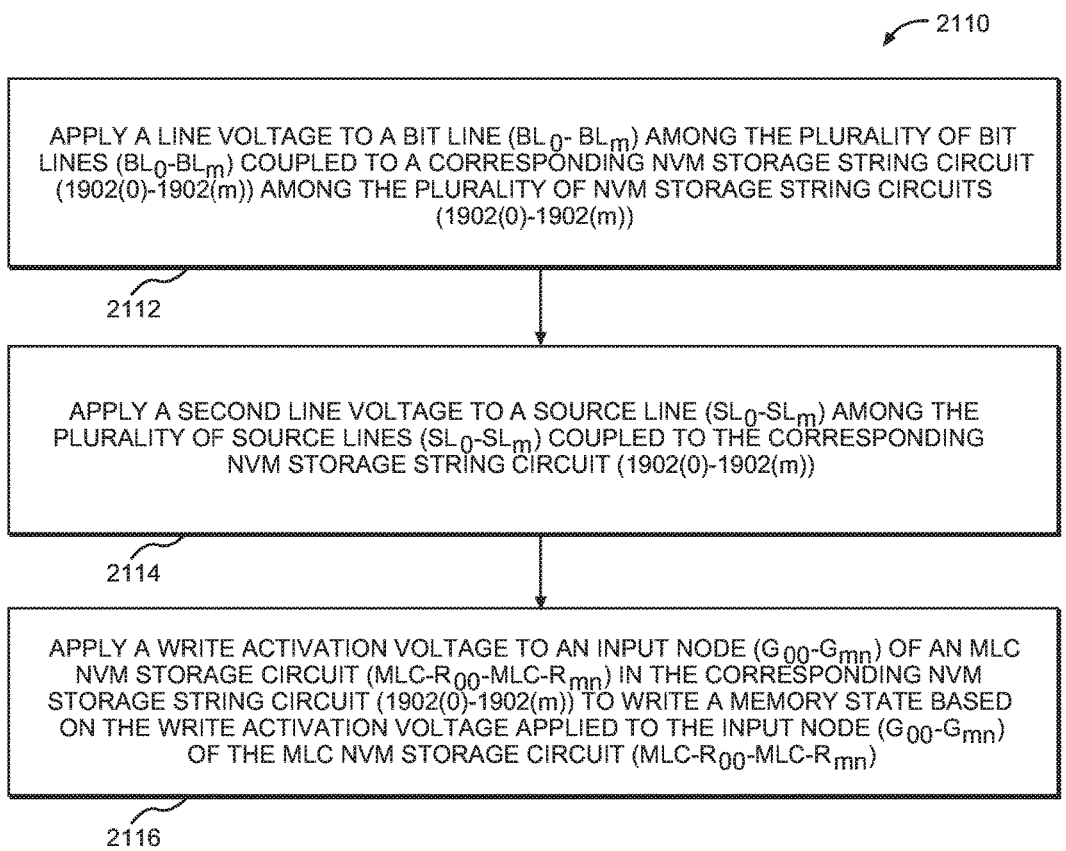
FIG. 21B is a flowchart illustrating an exemplary process of performing a write operation in the MLC NVM matrix circuit in FIG. 19.

FIG. 21B is a flowchart illustrating an exemplary process 2110 of performing a write operation in the MLC NVM matrix circuit 1900 in FIG. 19. In this regard, with reference to FIGS. 19 and 21B, the process 2110 includes applying a line voltage to a bit line BL$_0$-BL$_m$ among the plurality of bit lines BL$_0$-BL$_m$ coupled to a corresponding NVM storage string circuit 1902(0)-1902(m) among the plurality of NVM storage string circuits 1902(0)-1902(m) (block 2112 in FIG. 21B). The process 2110 also involves applying a second line voltage to a source line SL$_0$-SL$_m$ among the plurality of source lines SL$_0$-SL$_m$ coupled to the corresponding NVM storage string circuit 1902(0)-1902(m) (block 2114 in FIG. 21B). The process 2110 also involves applying a write activation voltage to an input G$_{00}$-G$_{mn}$ of an MLC NVM storage circuit MLC-R$_{00}$-MLC-R$_{mn}$ in the corresponding NVM storage string circuit 1902(0)-1902(m) to write a memory state based on the write activation voltage applied to the input G$_{00}$-G$_{mn}$ of the MLC NVM storage circuit MLC-R$_{00}$-MLC-R$_{mn}$ (block 2116 in FIG. 21B).

Figure 22:
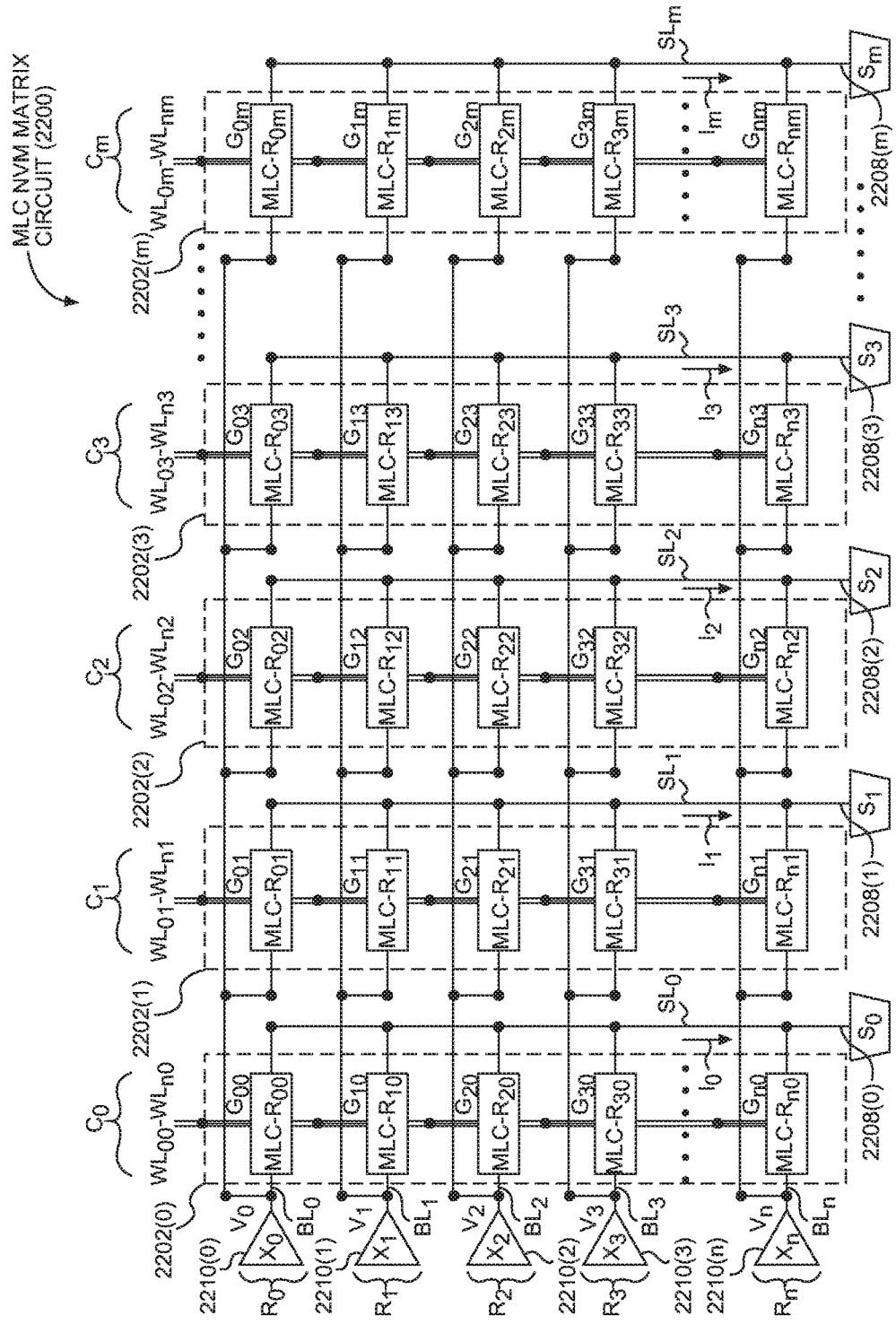
FIG. 22 is a schematic diagram of an exemplary MLC NVM matrix circuit without need for cross-bar connections employing NVM storage string circuits each comprising a plurality of MLC NVM storage circuits that each comprise a plurality of AND NVM bit cell circuits to provide for each MLC NVM storage circuit to represent a multi-bit memory state for performing matrix computations.

FIG. 22 illustrates another example of an MLC NVM matrix circuit shown as MLC NVM matrix circuit 2200. The MLC NVM matrix circuit 2200 includes NVM storage string circuits 2202(0)-2202(m) in the form of AND NVM circuits in this example, which are provided in respective memory columns C$_0$-C$_m$ to provide MLC NVM bit cell circuits MLC-R$_{00}$-MLC-R$_{nm}$. Common components between the MLC NVM matrix circuit 1900 in FIG. 19 and the MLC NVM matrix circuit 2200 in FIG. 22 are shown with common element numbers and thus will not be re-described. Read and write operations similar to that described above with regard to the MLC NVM matrix circuit 1900 in FIG. 19 can be performed in the MLC NVM matrix circuit 2200 in FIG. 22.

Each NVM bit cell circuit in the MLC NVM storage circuits MLC-R$_{00}$-MLC-R$_{nm}$ has a resistance representing its stored memory state. The total resistances of the MLC NVM storage circuits MLC-R$_{00}$-MLC-R$_{nm}$ represent a weight matrix. As shown using the example in FIG. 22, each MLC NVM storage circuit R$_{00}$-R$_{nm}$ has an input G$_{00}$-G$_{nm}$ that is coupled to a respective word line WL$_{00}$-WL$_{nm}$ based on in which memory row R$_0$-R$_n$ the MLC NVM storage circuit MLC-R$_{00}$-MLC-R$_{nm}$ is located. Each MLC NVM storage circuit MLC-R$_{00}$-MLC-R$_{nm}$ is configured to activate its semiconductor channel to couple its resistance (i.e., conductance) between the respective bit lines BL$_0$-BL$_n$ the respective source line SL$_0$-SL$_m$ in parallel with other activated NVM bit cell circuits R$_{00}$-R$_{nm}$ in the same memory column C$_0$-C$_m$. Current I$_0$-I$_m$ flows from a respective source line SL$_0$-SL$_m$ to output nodes 2208(0)-2208(m) as a function of the respective line voltage V$_0$-V$_m$ driven to the MLC NVM storage circuits MLC-R$_{00}$-MLC-R$_{nm}$ in their respective memory column C$_0$-C$_m$ divided by the parallel resistance of the MLC NVM storage circuits MLC-R$_{00}$-MLC-R$_{nm}$ in a respective memory column C$_0$-C$_m$. Current I$_0$ flowing on a respective source line SL$_0$ to the output node 2208(0) for example is a function of the sum of the dot products, meaning a respective multi-bit input vector X$_0$-X$_n$ multiplied by the corresponding memory states in the MLC NVM storage circuits MLC-R$_{00}$-MLC-R$_{0n}$ in their respective, corresponding memory column C$_0$-C$_m$. The currents I$_0$-I$_m$ may be analog representations of a summation of the dot product multiplications which can be converted to binary values. In other words, the MLC NVM matrix circuit 2200 is configured to produce currents I$_0$-I$_m$ on an input layer according to the following formula:

$$I_i = \sum_j V_{BL}/R_{ij}$$

where:
  i=memory column 0 to m;
  j=memory row 0 to n;
  $V_{BL}$=voltage $V_i$; and
  $R_{ij}$=resistance of an MLC NVM storage circuit.

If the word lines $WL_{00}$-$WL_{nm}$ are coupled to a pre-neuron layer and the output nodes 2208(0)-2208(m) are coupled to a post-neuron layer, the MLC NVM matrix circuit 2200 is also configured to train the resistance of the MLC NVM storage circuits MLC-$R_{00}$-MLC-$R_{nm}$ by supporting backwards propagation of a weight update according to the following formula:

$$\Delta R_{ij} = \eta \cdot S_{post,i} \cdot S_{post+1,j}$$

where:
  $R_{ij}$=resistance of an MLC NVM storage circuit; and
  S=value at source lines of NVM storage string circuits.

Figure 23:
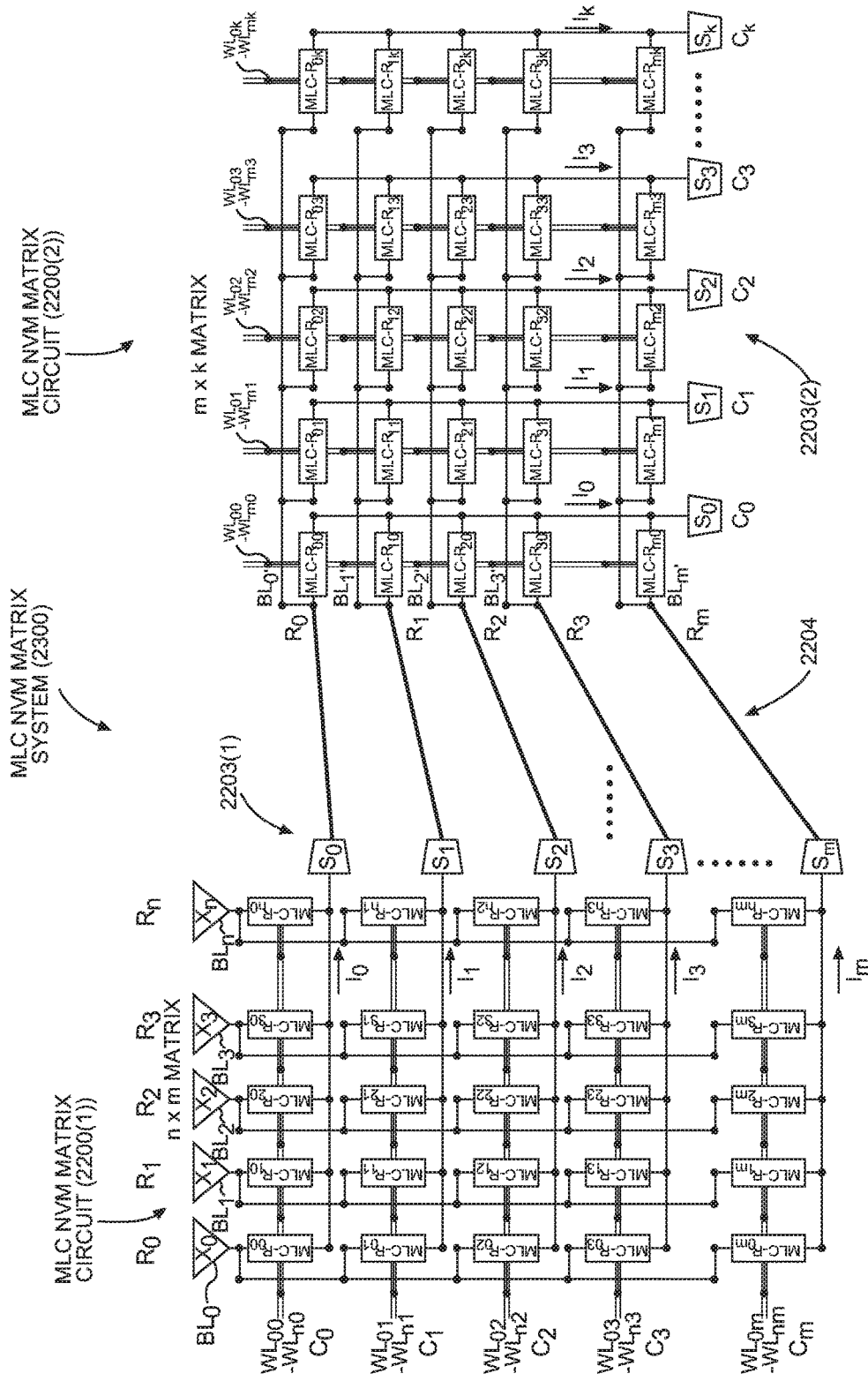
FIG. 23 is an example of an MLC NVM matrix system that includes the MLC NVM matrix circuit in FIG. 19 and another MLC NVM matrix circuit like the MLC NVM matrix circuit in FIG. 19 being configured and/or reconfigured and coupled to the first MLC NVM matrix circuit to provide neuron layers for a synapse MLC NVM matrix circuit.

MLC NVM matrix circuits, including the MLC NVM matrix circuit 1900 in FIG. 19 and the MLC NVM matrix circuit 2200 in FIG. 22, can be employed and reconfigured to provide reconfigured neuron paths to support universal deep learning or artificial intelligence (AI) tasks for different neuron layers and neurons. In this regard, FIG. 23 is an example of an MLC NVM matrix system 2300 that includes the MLC NVM matrix circuit 2200 in FIG. 22 being configured as an n×m MLC NVM matrix circuit 2200(1) like shown in FIG. 22. Another MLC NVM matrix circuit 2200(2) is provided that is similar to the MLC NVM matrix circuit 2200(1), but is configured as an m×k MLC NVM matrix circuit. The MLC NVM matrix circuits 2200(1), 2200(2) can be coupled together to form first and second respective neuron layers 2203(1), 2203(2) with output vectors $S_0$-$S_m$ providing intermediate neurons 2204. This allows a dot product output vector $S_0$-$S_m$ as a result of the matrix calculation of n×m MLC NVM matrix circuit 2200(1) to be used as an input vector $X_0$-$X_n$ to the MLC NVM matrix circuit 2200(2) to produce dot product output vectors $S_0$-$S_k$. Thus, the MLC NVM matrix circuit 2200(1) being coupled to the other MLC NVM matrix circuit 2200(2) is configured to produce currents $I_0$-$I_k$ on a hidden layer according to the following formula:

$$I_l = V_{BL} \bigg/ \sum_h R_{hl}$$

where:
  h=memory row 0 to m;
  l=memory column 0 to k;
  $V_{BL}$=voltage of bit lines $BL_0'$-$BL_m'$; and
  $R_{hl}$=resistance of an MLC NVM storage circuits in the MLC NVM matrix circuit 2200(1).

The operation of the matrix calculations and write operations that can be performed in the MLC NVM matrix circuits 2200(1), 2200(2) in FIG. 23 can be as previously described for the MLC NVM matrix circuit 2200 in FIG. 22.

Figure 24:
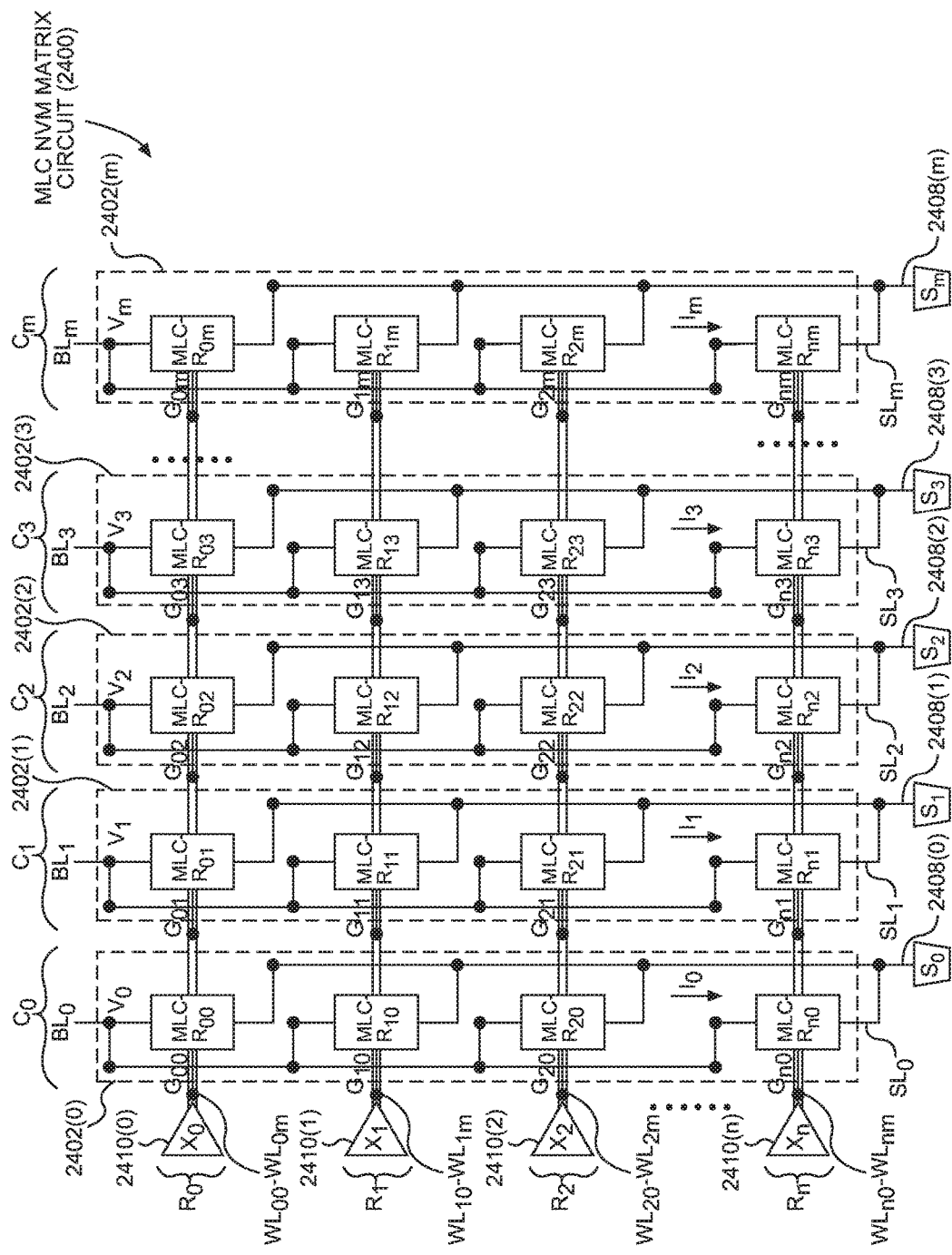
FIG. 24 is a schematic diagram of an exemplary MLC NVM matrix circuit employing NVM storage string circuits each comprising a plurality of MLC NVM storage circuits that each comprise a plurality of NOR NVM bit cell circuits to provide for each MLC NVM storage circuit to represent a multi-bit memory state for performing matrix computations.

FIG. 24 is a schematic diagram of another exemplary MLC NVM matrix circuit 2400 that can perform matrix multiplication without the need to use cross-bar connections employing NOR NVM storage string circuits 2402(0)-2402(m). In this manner, as discussed below, the summed conductances affect the currents $I_0$-$I_m$ to flow to output nodes 2408(0)-2408(m) representing dot product matrix multiplication calculations. In this regard, the MLC NVM matrix circuit 2400 employs NVM storage string circuits 2402(0)-2402(m) in 'n+1' memory rows $R_0$-$R_n$ that each include a plurality of MLC NVM bit cell circuits $R_{00}$-$R_{nm}$. Thus, the MLC NVM bit cell circuits $R_{00}$-$R_{nm}$ are arranged in memory rows $R_0$-$R_n$ and memory columns $C_0$-$C_m$. The MLC NVM matrix circuit 2400 includes a respective word line $WL_{00}$-$WL_{nm}$ for each memory row $R_0$-$R_n$. Source lines $SL_0$-$SL_m$ for each NVM storage string circuit 2402(0)-2402(m) include respective output nodes 2408(0)-2408(m). The source lines $SL_0$-$SL_m$ are configured to provide a respective current $I_0$-$I_m$ to the respective output nodes 2408(0)-2408(m) to be provided as an output vector $S_0$-$S_m$. For example, the output vector $S_0$-$S_m$ may be a binary post-synapse vector. The MLC NVM matrix circuit 2400 also includes a respective bit line $BL_0$-$BL_m$ for each memory column $C_0$-$C_m$ in this example. Bit line driver circuits 2410(0)-2410(n) are provided that are each configured to drive a respective input vector $X_0$-$X_n$ in the form of input voltages on the respective bit lines $BL_0$-$BL_m$ in this example. For example, the input vector $X_0$-$X_n$ may be a binary pre-synapse vector. Note however that alternatively, the word lines $WL_{00}$-$WL_{nm}$ provided in the respective memory rows $R_0$-$R_n$ could be configured to receive the input vector X, and respective fixed voltages be applied to the bit lines $BL_0$-$BL_m$ in the respective memory columns $C_0$-$C_m$ with the respective voltages $V_0$-$V_m$ applied.

With continuing reference to FIG. 24, each MLC NVM storage circuit MLC-$R_{00}$-MLC-$R_{nm}$ has a conductance representing a stored memory state. The series conductances of the MLC NVM storage circuits $R_{00}$-$R_{nm}$ in FIG. 24 represent a weight matrix. Each MLC NVM storage circuit $R_{00}$-$R_{nm}$ in this example has an input $G_{00}$-$G_{mn}$ that is coupled to a respective word line $WL_{00}$-$WL_{nm}$ based on in which memory column $C_0$-$C_m$ the MLC NVM storage circuit MLC-$R_{00}$-MLC-$R_{nm}$ is located. Each MLC NVM storage circuit MLC-$R_{00}$-MLC-$R_{nm}$ is configured to activate its respective semiconductor channel on a respective source line $SL_0$-$SL_m$ to couple its conductance on the respective source line $SL_0$-$SL_m$. The current $I_0$-$I_m$ flowing from the respective NVM storage string circuits 2402(0)-2402(m) on the respective source lines $SL_0$-$SL_m$ to output nodes 2408(0)-2408(m) is a function of the respective voltages $V_0$-$V_m$ driven on respective word lines $WL_{00}$-$WL_{nm}$ divided by the summed conductances of the MLC NVM storage circuits MLC-$R_{00}$-MLC-$R_{nm}$. Thus for example, current $I_0$ flowing on a respective source line $SL_0$ to the output node 2408(0) is a function of the sum of the dot product multiplications, meaning an input vector $X_0$-$X_n$ is multiplied by the corresponding memory states in the MLC NVM storage circuits MLC-$R_{00}$-MLC-$R_{0n}$. The currents $I_0$-$I_m$ may be analog representations of a summation of the dot product multiplications which can be converted to binary values. In other words, the MLC NVM matrix circuit 2400 is configured to produce currents $I_0$-$I_m$ according to the following formula:

$$I_j = \sum_i V_{BL,i} \cdot G_{ij}$$

where:
  i=memory row 0 to n;
  j=memory column 0 to m;
  $V_{BL}$=voltage $V_j$; and
  $G_{ij}$=conductance of an MLC NVM storage circuit.

The conductances $G_{ij}$ of the respective MLC NVM storage circuits $R_{00}$-$R_{nm}$ correlate to the voltages $V_0$-$V_m$ applied to the word lines $WL_{00}$-$WL_{nm}$. If the bit lines $BL_0$-$BL_m$ are coupled to a pre-neuron layer and the output nodes 2408

(0)-2408(m) are coupled to a post-neuron layer, the MLC NVM matrix circuit 2400 is also configured to train the resistance of the MLC NVM storage circuits MLC-$R_{00}$-MLC-$R_{nm}$ by supporting backwards propagation of a weight update according to the following formula:

$$\Delta G_{ij} = \eta \cdot S_{post,i} \cdot S_{post+1,j}$$

where:
$G_{ij}$=conductance of an MLC NVM storage circuit; and
S=source lines of NVM storage string circuits.

Figure 25:
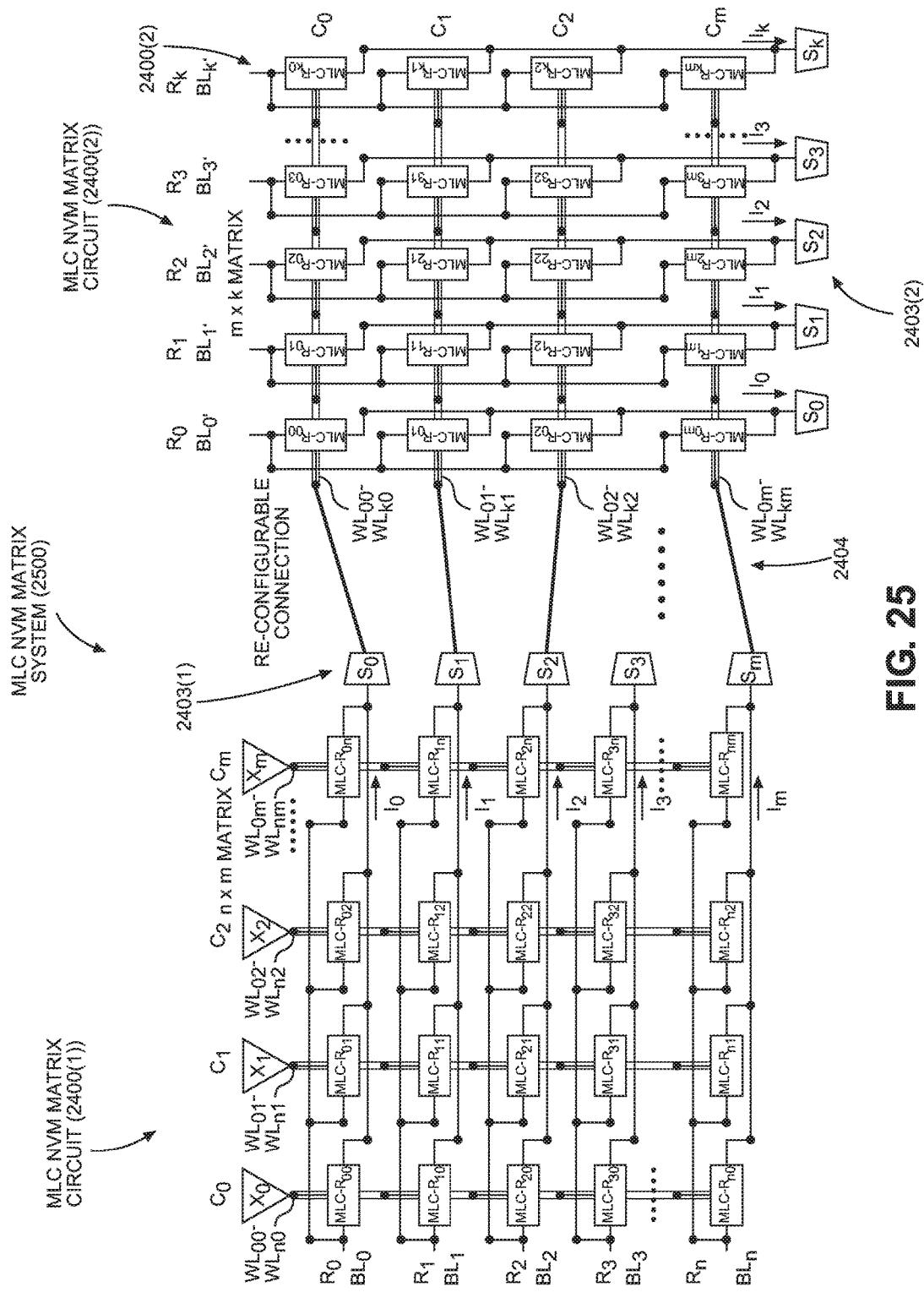
FIG. 25 is an example of the MLC NVM matrix system that includes the MLC NVM matrix circuit in FIG. 24 and another MLC NVM matrix circuit like the MLC NVM matrix circuit in FIG. 24 being configured and/or reconfigured and coupled to the first MLC NVM matrix circuit to provide neuron layers for a synapse MLC NVM matrix circuit.

FIG. 25 is an example of an MLC NVM matrix system 2500 that includes the MLC NVM matrix circuit 2400 in FIG. 24 being configured as an n×m MLC NVM matrix circuit 2400(1) like shown in FIG. 24. Another MLC NVM matrix circuit 2400(2) is provided that is similar to the MLC NVM matrix circuit 2400(1), but is configured as an m×k MLC NVM matrix circuit. The MLC NVM matrix circuits 2400(1), 2400(2) can be coupled together to form first and second respective neuron layers 2403(1), 2403(2) with output vectors $S_0$-$S_m$ providing intermediate neurons 2404. This allows a dot product output vector $S_0$-$S_m$ as a result of the matrix calculation of n×m MLC NVM matrix circuit 2400(1) to be used as an input vector $X_0$-$X_m$ to the MLC NVM matrix circuit 2400(2) to produce dot product output vectors $S_0$-$S_k$. Thus, the MLC NVM matrix circuit 2400(1) being coupled to the other MLC NVM matrix circuit 2400(2) is configured to produce currents $I_0$-$I_k$ on a hidden layer according to the following formula:

$$I_l = V_{BL} \bigg/ \sum_h R_{hl}$$

where:
h=memory row 0 to m;
l=memory column 0 to k;
$V_{BL}$=voltage of word lines $WL_{00}$-$WL_{km}$; and
$R_{hl}$=resistance of an MLC NVM storage circuit in the MLC NVM matrix circuit 2400(1).

The operation of the matrix calculations and write operations that can be performed in the MLC NVM matrix circuits 2400(1), 2400(2) in FIG. 25 can be as previously described for the MLC NVM matrix circuit 2400 in FIG. 24.

In another aspect, an MLC NVM matrix circuit is provided. The MLC NVM matrix circuit includes a plurality of means for applying a plurality of input voltages representing a multi-bit input vector. The MLC NVM matrix circuit also includes a plurality of means for applying a plurality of line voltages. The MLC NVM matrix circuit also includes a plurality of means for providing a plurality of output currents representing an output vector. The MLC NVM matrix circuit also includes a plurality of NVM storage string means each electrically coupled to a corresponding means for applying an input voltage among the plurality of means for applying the plurality of input voltages and a corresponding means for providing an output current among the plurality of means for providing the plurality of output currents. Non-limiting examples of the NVM storage string means include the NVM storage string circuits 1902(0)-1902(m) in the MLC NVM matrix circuit 1900 in FIG. 19, the NVM storage string circuits 2202(0)-2202(m) in the MLC NVM matrix circuit 2200 in FIG. 22, and the NVM storage string circuits 2402(0)-2402(m) in the MLC NVM matrix circuit 2400 in FIG. 24. Each of the plurality of NVM storage string means comprises a plurality of MLC NV means for storing a multi-bit memory state and each having a resistance representing the stored multi-bit memory state to form a data vector for a corresponding NVM storage string means among the plurality of NVM storage string means. Each plurality of MLC NV means for storing the multi-bit memory state comprises a means for electrically coupling a resistance of a plurality of NV bit means for storing a 1-bit memory state to the means for providing the output current among the plurality of means for providing the plurality of output currents, and a means for controlling coupling of the resistance of the plurality of NV bit means for storing the 1-bit memory state to the means for providing the output current among the plurality of means for providing the plurality of output currents. Non-limiting examples of the MLC NV means include the MLC NVM storage circuits MLC-$R_{00}$-MLC-$R_{mn}$ in the MLC NVM matrix circuit 1900 in FIG. 19, the MLC NVM storage circuits MLC-R(1)-MLC-R(10) in FIGS. 20A and 20B, the MLC NVM storage circuits MLC-$R_{00}$-MLC-$R_{nm}$ in the MLC NVM matrix circuit 2200 in FIG. 22, and the MLC NVM storage circuits MLC-$R_{00}$-MLC-$R_{nm}$ in the MLC NVM matrix circuit 2400 in FIG. 24.

Figure 26:
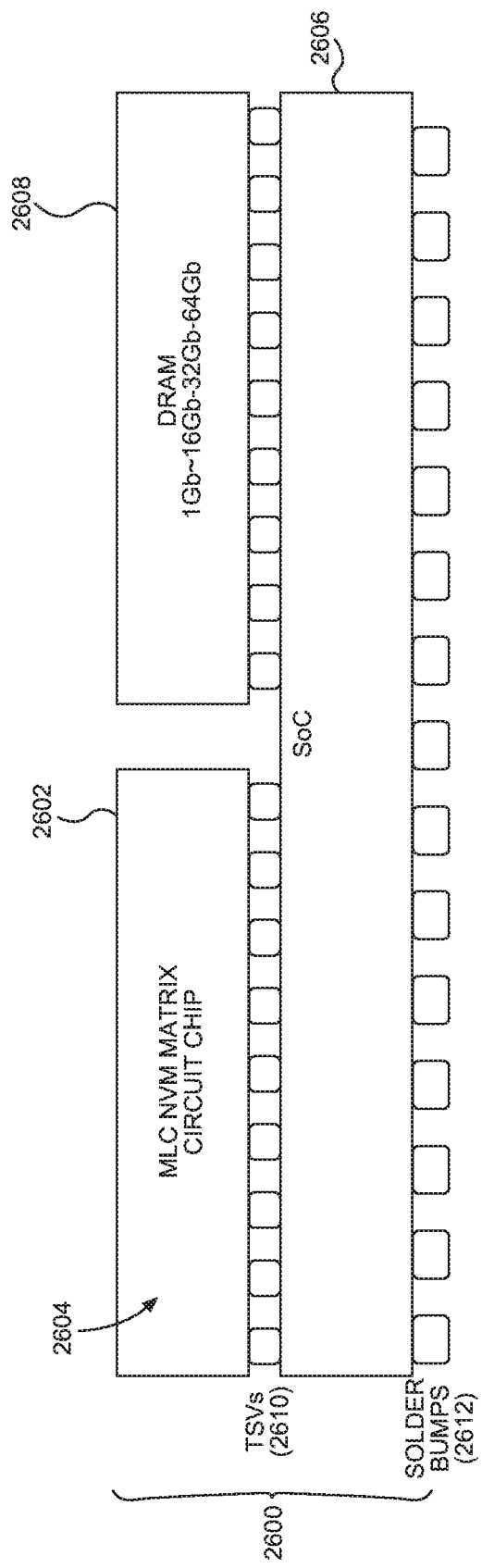
FIG. 26 is a block diagram of an exemplary chip package that includes a system-on-a-chip (SoC), a dedicated memory chip, and a dedicated MLC NVM matrix circuit chip that can include MLC NVM matrix circuits disclosed herein, including without limitation the MLC NVM matrix circuits in FIGS. 19-25.

FIG. 26 is a block diagram of an exemplary chip package 2600 that can include a dedicated MLC NVM matrix circuit chip 2602 that has an MLC NVM matrix circuit 2604 for performing matrix computations without the need cross-bar connections and according to aspects disclosed herein including without limitation the matrix circuits in FIGS. 19-25. In this regard, a system-on-a-chip (SoC) 2606 may be included that can contain a microprocessor and other supporting circuitry to provide a computer system. An external system memory chip 2608, such as a dynamic RAM (DRAM) memory chip may be provided in the chip package 2600 and coupled to the SoC 2606 through through-silicon vias (TSVs) 2610. The dedicated MLC NVM matrix circuit chip 2602 may also be coupled to the SoC 2606 through the TSVs 2610. Solder bumps 2612 may be provided on the SoC 2606 to be able to solder bond the chip package 2600 to a circuit board. The system memory chip 2608 could be connected to the dedicated MLC NVM matrix circuit chip 2602 through a dedicated local bus to improve performance. The dedicated MLC NVM matrix circuit chip 2602 could also be embedded into the SoC 2606 to save power and improve performance.

MLC NVM matrix circuits employing MLC NVM storage circuits for performing multi-bit matrix computations without the need for cross-bar connections and according to aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 27:
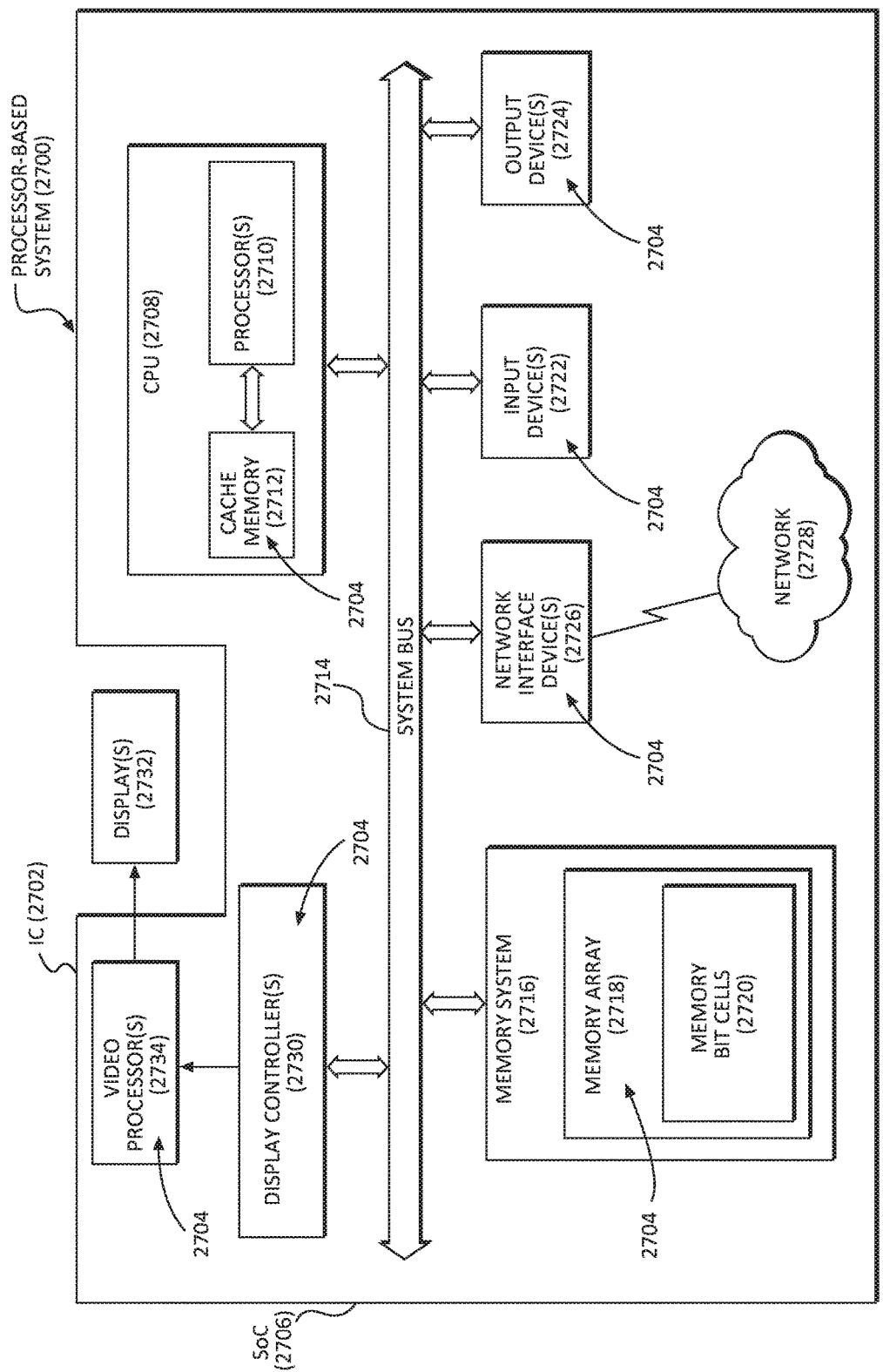
FIG. 27 is a block diagram of an exemplary processor-based system that includes memory systems that can include MLC NVM matrix circuits disclosed herein, including without limitation the MLC NVM matrix circuits in FIGS. 19-25.

In this regard, FIG. 27 illustrates an example of a processor-based system 2700 that can be included in an IC 2702. The processor-based system 2700 can include MLC NVM matrix circuits 2704 employing MLC NVM storage circuits for performing multi-bit matrix computations without the need for cross-bar connections and according to any aspects disclosed herein. The IC 2702 may be included in or provided as a SoC 2706. The processor-based system 2700 includes a CPU 2708 that includes one or more processors 2710. The CPU 2708 may have a cache memory 2712 coupled to the processor(s) 2710 for rapid access to temporarily stored data. The cache memory 2712 can include the MLC NVM matrix circuits 2704 according to any of the examples disclosed herein. The CPU 2708 is coupled to a system bus 2714 and can intercouple master and slave devices included in the processor-based system 2700. As is well known, the CPU 2708 communicates with these other devices by exchanging address, control, and data information over the system bus 2714. Although not illustrated in FIG. 27, multiple system buses 2714 could be provided, wherein each system bus 2714 constitutes a different fabric. For example, the CPU 2708 can communicate bus transaction requests to a memory system 2716 as an example of a slave device. The memory system 2716 may include a memory array 2718 that includes memory bit cells 2720. The memory bit cells 2720 may be MRAM bit cells for example. The memory array 2718 can include MLC NVM matrix circuits 2704.

Other master and slave devices can be connected to the system bus 2714. As illustrated in FIG. 27, these devices can include the memory system 2716, and one or more input devices 2722. The input device(s) 2722 can include any type of input device, including but not limited to input keys, switches, voice processors, etc. The other devices can also include one or more output devices 2724, and one or more network interface devices 2727. The output device(s) 2724 can include any type of output device, including but not limited to audio, video, other visual indicators, etc. The other devices can also include one or more display controllers 2730 as examples. The network interface device(s) 2727 can be any devices configured to allow exchange of data to and from a network 2728. The network 2728 can be any type of network, including but not limited to a wired or wireless network, a private or public network, a local area network (LAN), a wireless local area network (WLAN), a wide area network (WAN), a BLUETOOTH™ network, and the Internet. The network interface device(s) 2727 can be configured to support any type of communications protocol desired.

The CPU 2708 may also be configured to access the display controller(s) 2730 over the system bus 2714 to control information sent to one or more displays 2732. The display controller 2730 can include the MLC NVM matrix circuits 2704. The display controller(s) 2730 sends information to the display(s) 2732 to be displayed via one or more video processors 2734, which process the information to be displayed into a format suitable for the display(s) 2732. The display(s) 2732 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A multiple (multi-) level cell (MLC) non-volatile (NV) memory (NVM) matrix circuit, comprising:
a plurality of word lines configured to receive a multi-bit input vector represented by an input voltage on each word line among the plurality of word lines;
a plurality of bit lines, each bit line among the plurality of bit lines configured to receive a corresponding line voltage;
a plurality of source lines; and
a plurality of NVM storage string circuits, each NVM storage string circuit among the plurality of NVM storage string circuits configured to be electrically coupled between a corresponding bit line among the plurality of bit lines and a corresponding source line among the plurality of source lines each comprising a plurality of MLC NVM storage circuits; and
each MLC NVM storage circuit among the plurality of MLC NVM storage circuits comprising a plurality of NVM bit cell circuits each configured to store a respective memory state for the corresponding MLC NVM storage circuit;
each NVM bit cell circuit among the plurality of NVM bit cell circuits in a respective MLC NVM storage circuit having a resistance representing a stored memory state, and comprising:
a gate node coupled to a corresponding word line among the plurality of word lines; and
each NVM bit cell circuit configured to couple its resistance to a source line among the plurality of source lines coupled to its respective MLC NVM storage circuit in response to the input voltage applied to the corresponding word line coupled to the gate node.

2. The MLC NVM matrix circuit of claim 1, wherein none of the plurality of word lines are cross-connected to any of the plurality of bit lines.

3. The MLC NVM matrix circuit of claim 1, wherein the resistance of each MLC NVM storage circuit of a respective NVM storage string circuit is coupled to the respective source line forming a multi-bit data vector.

4. The MLC NVM matrix circuit of claim 1, further comprising a plurality of access transistors, each access transistor among the plurality of access transistors coupled to a corresponding bit line among the plurality of bit lines and a corresponding NVM storage string circuit among the plurality of NVM storage string circuits coupled to the source line corresponding to the bit line;
each access transistor among the plurality of access transistors comprising an access gate node coupled to an access line; and
each access transistor among the plurality of access transistors configured to electrically couple the corresponding bit line to the corresponding NVM storage string circuit in response to an access voltage applied to the access gate node.

5. The MLC NVM matrix circuit of claim 4, further comprising a plurality of second access transistors, each second access transistor among the plurality of second access transistors coupled to a corresponding source line among the plurality of source lines and a corresponding NVM storage string circuit among the plurality of NVM storage string circuits;
each second access transistor among the plurality of second access transistors comprising a second access gate node coupled to a second access line; and
each second access transistor among the plurality of second access transistors configured to electrically couple the corresponding source line to the corresponding NVM storage string circuit in response to an input voltage applied to the second access gate node.

6. The MLC NVM matrix circuit of claim 1, wherein each NVM bit cell circuit among the plurality of NVM bit cell circuits in each MLC NVM storage circuit among the plurality of MLC NVM storage circuits further comprises a semiconductor channel configured to be electrically coupled to the source line to couple the resistance of each NVM bit cell circuit to the source line in response to the input voltage applied to the corresponding word line coupled to the gate node.

7. The MLC NVM matrix circuit of claim 1, wherein a NVM storage string circuit among the plurality of NVM storage string circuits is configured to generate a respective current flowing through a source line among the plurality of source lines coupled to the NVM storage string circuit to a respective output node based on the line voltage applied to the bit line coupled to the NVM storage string circuit and a resistance applied by each of the plurality of MLC NVM storage circuits of the NVM storage string circuit in response to a read activation voltage being applied to the gate node of each of the plurality of NVM bit cell circuits in the respective plurality of MLC NVM storage circuits.

8. The MLC NVM matrix circuit of claim 7, wherein an amplitude of the current flowing through the source line represents a dot product multiplication of a data vector of the MLC NVM storage circuit coupled to the source line, by the multi-bit input vector.

9. The MLC NVM matrix circuit of claim 1, wherein each NVM storage string circuit among the plurality of NVM storage string circuits is configured to generate a respective current flowing through a source line among the plurality of source lines coupled to the NVM storage string circuit to a respective output node based on the line voltage applied to the bit line coupled to the NVM storage string circuit and the resistance applied by each of the plurality of MLC NVM storage circuits of the NVM storage string circuit in response to a read activation voltage being applied to the gate node of each of the plurality of NVM bit cell circuits in the respective plurality of MLC NVM storage circuits.

10. The MLC NVM matrix circuit of claim 7, wherein amplitudes of each respective current among a plurality of currents flowing through the plurality of source lines represents a dot product multiplication of data vectors of the respective MLC NVM storage circuit coupled to the respective source line, by the multi-bit input vector.

11. The MLC NVM matrix circuit of claim 1, wherein one or more MLC NVM storage circuits in a NVM storage string circuit among the plurality of NVM storage string circuits is configured to write a multi-bit memory state based on a write activation voltage applied to the gate node of each of the plurality of NVM bit cell circuits of the respective MLC NVM storage circuits.

12. The MLC NVM matrix circuit of claim 11, wherein the one or more MLC NVM storage circuits in the NVM storage string circuit among the plurality of NVM storage string circuits is further configured to write the multi-bit memory state in response to a read activation voltage different from the write activation voltage applied to the gate node of each of the plurality of NVM bit cell circuits of a number of MLC NVM storage circuits among the plurality of MLC NVM storage circuits not being written.

13. The MLC NVM matrix circuit of claim 1, wherein the plurality of NVM storage string circuits each comprise a plurality of NAND MLC NVM storage circuits each comprising a plurality of NAND NVM bit cell circuits, each NAND MLC NVM storage circuit among the plurality of NAND MLC NVM storage circuits configured to couple its resistance in series on a source line among the plurality of source lines in response to the input voltage applied to the gate node of its respective NAND NVM bit cell circuit among the plurality of NAND NVM bit cell circuits.

14. The MLC NVM matrix circuit of claim 13, wherein each MLC NVM storage circuit in a respective NVM storage string circuit among the plurality of NVM storage string circuits comprises a source node coupled to a drain node of an adjacent MLC NVM storage circuit.

15. The MLC NVM matrix circuit of claim 13, wherein each NAND MLC NVM storage circuit is comprised from a group consisting of: a NAND MLC NVM flash storage circuit; and a NAND MLC NVM Ferroelectric (Fe) Field-Effect Transistor (FET) (FeFET) storage circuit.

16. The MLC NVM matrix circuit of claim 1, wherein the plurality of NVM storage string circuits each comprise a plurality of AND MLC NVM storage circuits each comprising a plurality of AND NVM bit cell circuits, each AND MLC NVM storage circuit among the plurality of AND MLC NVM storage circuits configured to couple its resistance in parallel between its corresponding bit line and its corresponding source line in response to the input voltage applied to the gate node of its respective AND NVM bit cell circuit among the plurality of AND NVM bit cell circuits.

17. The MLC NVM matrix circuit of claim 15, wherein each MLC NVM storage circuit in a respective NVM storage string circuit among the plurality of NVM storage string circuits comprises a source node coupled to a drain node of an adjacent MLC NVM storage circuit coupled to a bit line among the plurality of bit lines, and the drain node coupled to the source line coupled to the NVM storage string circuit.

18. The MLC NVM matrix circuit of claim 16, wherein each AND MLC NVM storage circuit is comprised from a group consisting of: an AND MLC NVM flash storage circuit; an AND MLC NVM FeFET storage circuit; an AND MLC NVM magneto-resistive random access memory (MRAM) NVM storage circuit; and an AND MLC NVM resistive random access memory (RRAM) storage circuit.

19. The MLC NVM matrix circuit of claim 1, wherein the plurality of NVM storage string circuits each comprise a plurality of NOR MLC NVM storage circuits each comprising a plurality of NOR NVM bit cell circuits, each NOR MLC NVM storage circuit among the plurality of NOR MLC NVM storage circuits configured to couple its resistance to a respective source line among the plurality of source lines in response to the input voltage applied to the gate node of its respective NOR NVM bit cell circuit among the plurality of NOR NVM bit cell circuits.

20. The MLC NVM matrix circuit of claim 19, wherein each NOR MLC NVM storage circuit is comprised from a group consisting of: a NOR MLC NVM flash storage circuit; a NOR MLC NVM FeFET storage circuit; a NOR MLC NVM MRAM storage circuit; and a NOR MLC NVM RRAM storage circuit.

21. The MLC NVM matrix circuit of claim 1 integrated into an integrated circuit (IC).

22. The MLC NVM matrix circuit of claim 1 integrated into a system-on-a-chip (SoC).

23. The MLC NVM matrix circuit of claim 1 integrated into a device selected from a group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

24. A multiple (multi-) level cell (MLC) non-volatile (NV) memory (NVM) matrix circuit, comprising:
   a plurality of means for applying a plurality of input voltages representing a multi-bit input vector;
   a plurality of means for applying a plurality of line voltages;
   a plurality of means for providing a plurality of output currents representing an output vector; and
   a plurality of NVM storage string means each electrically coupled to a corresponding means for applying an input voltage among the plurality of means for applying the plurality of input voltages and a corresponding means for providing an output current among the plurality of means for providing the plurality of output currents, each of the plurality of NVM storage string means, comprising:
      a plurality of MLC NV means for storing a multi-bit memory state and each having a resistance representing the stored multi-bit memory state to form a data vector for a corresponding NVM storage string means among the plurality of NVM storage string means; and
      each of the plurality of MLC NV means for storing the multi-bit memory state, comprising:
         a means for electrically coupling a resistance of a plurality of NV bit means for storing a 1-bit memory state to the means for providing the output current among the plurality of means for providing the plurality of output currents; and
         a means for controlling coupling of the resistance of the plurality of NV bit means for storing the 1-bit memory state to the means for providing the output current among the plurality of means for providing the plurality of output currents.

25. A method of performing matrix multiplication in a multiple (multi-) level cell (MLC) non-volatile (NV) memory (NVM) matrix circuit, comprising:
   applying a line voltage on at least one bit line among a plurality of bit lines coupled to a corresponding NVM storage string circuit among a plurality of NVM storage string circuits, to electrically couple the line voltage to the corresponding NVM storage string circuit coupled to a corresponding bit line among the plurality of bit lines, each NVM storage string circuit among the plurality of NVM storage string circuits comprising a plurality of MLC NVM storage circuits each having a resistance representing a stored multi-bit memory state in the MLC NVM storage circuit to form a data vector for the corresponding NVM storage string circuit;

applying a second line voltage on at least one source line among a plurality of source lines coupled to a corresponding NVM storage string circuit among the plurality of NVM storage string circuits, to electrically couple the second line voltage to the corresponding NVM storage string circuit coupled to a corresponding source line among the plurality of source lines; and applying a plurality of input voltages representing a multi-bit input vector on a plurality of word lines, each word line among the plurality of word lines coupled to a corresponding gate node of a NVM bit cell circuit among a plurality of NVM bit cell circuits in each MLC NVM storage circuit among the plurality of MLC NVM storage circuits in each NVM storage string circuit, to electrically couple the MLC NVM storage circuit to the source line to couple the resistance of the MLC NVM storage circuit to the source line.

26. The method of claim 25, further comprising applying an access voltage to a plurality of access transistors, each access transistor among the plurality of access transistors coupled to a corresponding bit line among the plurality of bit lines and a corresponding NVM storage string circuit among the plurality of NVM storage string circuits coupled to the source line corresponding to the bit line, to electrically couple the corresponding bit line to the corresponding NVM storage string circuit.

27. The method of claim 25, further comprising generating a current flowing through a respective source line among the plurality of sources lines to a respective output node coupled to a respective NVM storage string circuit among the plurality of NVM storage string circuits based on a voltage applied to the bit line coupled to the respective NVM storage string circuit and the resistance applied by each of the plurality of MLC NVM storage circuits of the respective NVM storage string circuit in response to a read activation voltage being applied to the gate node of each of the plurality of NVM bit cell circuits in the respective plurality of MLC NVM storage circuits in the respective NVM storage string circuit.

28. The method of claim 27, wherein an amplitude of the current flowing through the source line represents a dot product multiplication of the data vector of the NVM storage string circuit coupled to the source line, by the multi-bit input vector.

29. The method of claim 25, further comprising:
applying the line voltage to a bit line among the plurality of bit lines coupled to a corresponding NVM storage string circuit among the plurality of NVM storage string circuits;
applying a second line voltage to a source line among the plurality of source lines coupled to the corresponding NVM storage string circuit; and
applying a write activation voltage to the gate node of each of the plurality of NVM bit cell circuits in each of the plurality of MLC NVM storage circuits in the corresponding NVM storage string circuit to write a memory state based on the write activation voltage applied to the gate node of each of the plurality of NVM bit cell circuits in each of the plurality of MLC NVM storage circuits.

30. A multiple (multi-) level cell (MLC) non-volatile (NV) memory (NVM) matrix system, comprising:
a first MLC NVM matrix circuit, comprising:
a plurality of first word lines configured to receive a first multi-bit input vector represented by a first input voltage on each first word line among the plurality of first word lines;
a plurality of first bit lines, each first bit line among the plurality of first bit lines configured to receive a corresponding first line voltage;
a plurality of first source lines each coupled to a first output node among a plurality of first output nodes;
a plurality of first NVM storage string circuits, each first NVM storage string circuit among the plurality of first NVM storage string circuits configured to be electrically coupled between a corresponding first bit line among the plurality of first bit lines and a corresponding first source line among the plurality of first source lines each comprising a plurality of first MLC NVM storage circuits;
each first MLC NVM storage circuit among the plurality of first MLC NVM storage circuits comprising a plurality of first NVM bit cell circuits each configured to store a respective memory state for the corresponding first MLC NVM storage circuit;
each first NVM bit cell circuit among the plurality of first NVM bit cell circuits in a respective first MLC NVM storage circuit having a resistance representing a stored memory state, and comprising:
a first gate node coupled to a corresponding first word line among the plurality of first word lines; and
each first NVM bit cell circuit configured to couple its resistance to the first source line coupled to its respective first MLC NVM storage circuit in response to an input voltage applied to the corresponding first word line coupled to the first gate node; and
a second MLC NVM matrix circuit, comprising:
a plurality of second word lines each coupled to an output node among the plurality of first output nodes;
a plurality of second bit lines, each second bit line among the plurality of second bit lines configured to receive a corresponding second line voltage;
a plurality of second source lines each coupled to a second output node among a plurality of second output nodes; and
a plurality of second NVM storage string circuits, each second NVM storage string circuit among the plurality of second NVM storage string circuits configured to be electrically coupled between a corresponding second bit line among the plurality of second bit lines and a corresponding second source line among the plurality of second source lines each comprising a plurality of second MLC NVM storage circuits;
each second MLC NVM storage circuit among the plurality of second MLC NVM storage circuits comprising a plurality of second NVM bit cell circuits each configured to store a respective memory state for the corresponding second MLC NVM storage circuit;
each second NVM bit cell circuit among the plurality of second NVM bit cell circuits in a respective second MLC NVM storage circuit having a resistance representing a stored memory state, and comprising:
a second gate node coupled to a corresponding second word line among the plurality of second word lines; and
each second NVM bit cell circuit configured to couple its resistance to the second source line coupled to its respective second MLC NVM storage circuit in response to the input voltage applied to the corresponding second word line coupled to the second gate node.

* * * * *